United States Patent
Miyake et al.

(10) Patent No.: US 9,230,996 B2
(45) Date of Patent: Jan. 5, 2016

(54) LIGHT-EMITTING DEVICE

(71) Applicant: Semiconductor Energy Laboratory Co., Ltd., Atsugi-shi, Kanagawa-ken (JP)

(72) Inventors: Hiroyuki Miyake, Kanagawa (JP); Junichi Koezuka, Tochigi (JP); Masami Jintyou, Tochigi (JP); Yukinori Shima, Gunma (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/580,949

(22) Filed: Dec. 23, 2014

(65) Prior Publication Data

US 2015/0187818 A1    Jul. 2, 2015

(30) Foreign Application Priority Data

Dec. 27, 2013  (JP) .................................. 2013-272532
Dec. 27, 2013  (JP) .................................. 2013-272539
Mar. 11, 2014  (JP) .................................. 2014-047197
Mar. 11, 2014  (JP) .................................. 2014-047200

(51) Int. Cl.
*H01L 27/15*  (2006.01)
*H01L 27/12*  (2006.01)

(52) U.S. Cl.
CPC ........ *H01L 27/1225* (2013.01); *H01L 27/1251* (2013.01); *H01L 27/1255* (2013.01)

(58) Field of Classification Search
CPC ...................................................... H01L 27/16
USPC ......................................................... 257/43
See application file for complete search history.

(56) References Cited

U.S. PATENT DOCUMENTS 5,684,365 A    11/1997    Tang et al.
5,731,856 A     3/1998    Kim et al.
(Continued)

FOREIGN PATENT DOCUMENTS

EP    1737044 A    12/2006
EP    2226847 A     9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Earl Taylor
(74) *Attorney, Agent, or Firm* — Fish & Richardson P.C.

(57) ABSTRACT

A light-emitting device capable of suppressing variation in luminance among pixels is provided. A light-emitting device includes a pixel and first and second circuits. The first circuit has a function of generating a signal including a value of current extracted from the pixel. The second circuit has a function of correcting an image signal by the signal. The pixel includes at least a light-emitting element and first and second transistors. The first transistor has a function of controlling supply of the current to the light-emitting element by the image signal. The second transistor has a function of controlling extraction of the current from the pixel. A semiconductor film of each of the first and second transistors includes a first semiconductor region overlapping with a gate, a second semiconductor region in contact with a source or a drain, and a third semiconductor region between the first and second semiconductor regions.

16 Claims, 41 Drawing Sheets

(56) References Cited

U.S. PATENT DOCUMENTS

| | | |
|---|---|---|
| 5,744,864 A | 4/1998 | Cillessen et al. |
| 5,956,011 A | 9/1999 | Koyama et al. |
| 6,037,924 A | 3/2000 | Koyama et al. |
| 6,294,274 B1 | 9/2001 | Kawazoe et al. |
| 6,310,598 B1 | 10/2001 | Koyama et al. |
| 6,563,174 B2 | 5/2003 | Kawasaki et al. |
| 6,608,613 B2 | 8/2003 | Koyama et al. |
| 6,693,383 B2 | 2/2004 | Bae et al. |
| 6,727,522 B1 | 4/2004 | Kawasaki et al. |
| 6,737,813 B2 | 5/2004 | Kawasaki et al. |
| 6,839,057 B2 | 1/2005 | Iguchi |
| 6,928,136 B2 | 8/2005 | Nagao et al. |
| 6,958,750 B2 | 10/2005 | Azami et al. |
| 6,975,142 B2 | 12/2005 | Azami et al. |
| 7,042,426 B2 | 5/2006 | Shin |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,068,076 B2 | 6/2006 | Azami |
| 7,105,868 B2 | 9/2006 | Nause et al. |
| 7,129,917 B2 | 10/2006 | Yamazaki et al. |
| 7,133,012 B2 | 11/2006 | Abe |
| 7,151,278 B2 | 12/2006 | Nagao et al. |
| 7,173,590 B2 | 2/2007 | Uchino et al. |
| 7,199,768 B2 | 4/2007 | Ono et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,317,429 B2 | 1/2008 | Shirasaki et al. |
| 7,323,356 B2 | 1/2008 | Hosono et al. |
| 7,327,357 B2 | 2/2008 | Jeong |
| 7,365,742 B2 | 4/2008 | Kim et al. |
| 7,382,342 B2 | 6/2008 | Uchino et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,443,367 B2 | 10/2008 | Numao |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,502,001 B2 | 3/2009 | Fish et al. |
| 7,532,209 B2 | 5/2009 | Kimura |
| 7,619,597 B2 | 11/2009 | Nathan et al. |
| 7,626,199 B2 | 12/2009 | Kim |
| 7,671,826 B2 | 3/2010 | Kimura |
| 7,674,650 B2 | 3/2010 | Akimoto et al. |
| 7,714,813 B2 | 5/2010 | Uchino et al. |
| 7,714,815 B2 | 5/2010 | Kim et al. |
| 7,732,819 B2 | 6/2010 | Akimoto et al. |
| 7,738,014 B2 | 6/2010 | Kwak et al. |
| 7,817,117 B2 | 10/2010 | Kimura |
| 7,982,696 B2 | 7/2011 | Kimura |
| 7,986,287 B2 | 7/2011 | Umezaki et al. |
| 8,026,876 B2 | 9/2011 | Nathan et al. |
| 8,049,743 B2 | 11/2011 | Kang |
| 8,164,090 B2 | 4/2012 | Iwasaki et al. |
| 8,164,547 B2 | 4/2012 | Kimura |
| 8,243,055 B2 | 8/2012 | Abe |
| 8,264,430 B2 | 9/2012 | Kimura |
| 8,344,374 B2 | 1/2013 | Yamazaki et al. |
| 8,384,076 B2 | 2/2013 | Park et al. |
| 8,624,240 B2 | 1/2014 | Sato et al. |
| 8,796,681 B2 | 8/2014 | Yamade et al. |
| 8,835,918 B2 | 9/2014 | Yamazaki et al. |
| 8,883,556 B2 | 11/2014 | Yamazaki et al. |
| 8,922,182 B2 | 12/2014 | Takahashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0195968 A1 | 12/2002 | Sanford et al. |
| 2003/0090481 A1 | 5/2003 | Kimura |
| 2003/0117352 A1 | 6/2003 | Kimura |
| 2003/0132931 A1 | 7/2003 | Kimura et al. |
| 2003/0137503 A1 | 7/2003 | Kimura et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0080474 A1 | 4/2004 | Kimura |
| 2004/0095305 A1 | 5/2004 | Kimura et al. |
| 2004/0127038 A1 | 7/2004 | Carcia et al. |
| 2004/0174349 A1 | 9/2004 | Libsch et al. |
| 2004/0174354 A1 | 9/2004 | Ono et al. |
| 2005/0017302 A1 | 1/2005 | Hoffman |
| 2005/0199959 A1 | 9/2005 | Chiang et al. |
| 2005/0243079 A1 | 11/2005 | Ozaki |
| 2006/0028407 A1 | 2/2006 | Chou |
| 2006/0035452 A1 | 2/2006 | Carcia et al. |
| 2006/0043377 A1 | 3/2006 | Hoffman et al. |
| 2006/0077194 A1 | 4/2006 | Jeong |
| 2006/0082528 A1 | 4/2006 | Guo et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0109225 A1 | 5/2006 | Haga et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0170628 A1 | 8/2006 | Yamashita et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0290613 A1 | 12/2006 | Hong et al. |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0103419 A1 | 5/2007 | Uchino et al. |
| 2007/0108446 A1 | 5/2007 | Akimoto |
| 2007/0120810 A1 | 5/2007 | You et al. |
| 2007/0126664 A1 | 6/2007 | Kimura |
| 2007/0126665 A1 | 6/2007 | Kimura |
| 2007/0132694 A1 | 6/2007 | Uchino et al. |
| 2007/0139311 A1 | 6/2007 | Cho et al. |
| 2007/0152217 A1 | 7/2007 | Lai et al. |
| 2007/0164962 A1 | 7/2007 | Uchino et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0236424 A1 | 10/2007 | Kimura |
| 2007/0252928 A1 | 11/2007 | Ito et al. |
| 2007/0272922 A1 | 11/2007 | Kim et al. |
| 2007/0279403 A1 | 12/2007 | Uchino et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0225061 A1 | 9/2008 | Kimura et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |

(56) References Cited

U.S. PATENT DOCUMENTS

| | | |
|---|---|---|
| 2008/0258143 A1 | 10/2008 | Kim et al. |
| 2008/0278425 A1 | 11/2008 | Koyama |
| 2008/0296568 A1 | 12/2008 | Ryu et al. |
| 2009/0051674 A1 | 2/2009 | Kimura et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140981 A1 | 6/2009 | Kwak et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0001983 A1 | 1/2010 | Abe |
| 2010/0039458 A1 | 2/2010 | Nathan et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0149160 A1 | 6/2010 | Kimura |
| 2010/0163874 A1 | 7/2010 | Koyama et al. |
| 2011/0024760 A1 | 2/2011 | Kimura |
| 2011/0050659 A1 | 3/2011 | Tsai et al. |
| 2011/0079778 A1 | 4/2011 | Yamazaki et al. |
| 2011/0084267 A1 | 4/2011 | Yamazaki et al. |
| 2011/0130981 A1 | 6/2011 | Chaji et al. |
| 2011/0133706 A1 | 6/2011 | Takahashi et al. |
| 2011/0240998 A1 | 10/2011 | Morosawa et al. |
| 2011/0260170 A1 | 10/2011 | Kimura |
| 2012/0248435 A1 | 10/2012 | Koyama |
| 2012/0315730 A1 | 12/2012 | Koezuka et al. |
| 2012/0315735 A1 | 12/2012 | Koezuka et al. |
| 2013/0021228 A1 | 1/2013 | Miwa et al. |
| 2013/0021316 A1 | 1/2013 | Inoue et al. |
| 2013/0069054 A1 | 3/2013 | Isobe et al. |
| 2013/0069055 A1 | 3/2013 | Yamazaki et al. |
| 2013/0092930 A1 | 4/2013 | Kimura |
| 2013/0241431 A1 | 9/2013 | Toyotaka et al. |
| 2014/0001468 A1 | 1/2014 | Yamazaki et al. |
| 2015/0108959 A1 | 4/2015 | Takahashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-260671 A | 10/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-007718 A | 1/2003 |
| JP | 2003-086000 A | 3/2003 |
| JP | 2003-086808 A | 3/2003 |
| JP | 2003-195810 | 7/2003 |
| JP | 2004-103957 A | 4/2004 |
| JP | 2004-273614 A | 9/2004 |
| JP | 2004-273732 A | 9/2004 |
| JP | 2005-189643 | 7/2005 |
| JP | 2005-195756 | 7/2005 |
| JP | 2006-215275 | 8/2006 |
| JP | 2007-220817 A | 8/2007 |
| JP | 2009-265459 | 11/2009 |
| JP | 2009-271333 | 11/2009 |
| JP | 2011-139627 A | 7/2011 |
| JP | 2012-256025 A | 12/2012 |
| KR | 2012-0112161 A | 10/2012 |
| TW | 201203821 | 1/2012 |
| TW | 201327839 | 7/2013 |
| WO | WO-2004/114391 | 12/2004 |
| WO | WO-2011/068025 | 6/2011 |
| WO | WO-2013/065600 | 5/2013 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for Amoled Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "Rfcpus on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility Zno Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs

(56) References Cited

OTHER PUBLICATIONS

Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, andYb2Fe3O7 Types of Structures for Compounds in the In2O3 and Sc2O3—A2O3—BO Systems [A; Fe, Ga, Or Al; B: Mg, Mn, Fe, Ni, Cu,Or Zn] at Temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m= 7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.

(56) References Cited

OTHER PUBLICATIONS

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/IB2014/066992) Dated Apr. 21, 2015.

Written Opinion (Application No. PCT/IB2014/066992) Dated Apr. 21, 2015.

Yang.J et al., "A New Process and Structure for Oxide Semiconductor LCDs", SID Digest '14 : SID International Symposium Digest of Technical Papers, Jun. 3, 2014, pp. 469-472.

392

392

392

FIG. 36A
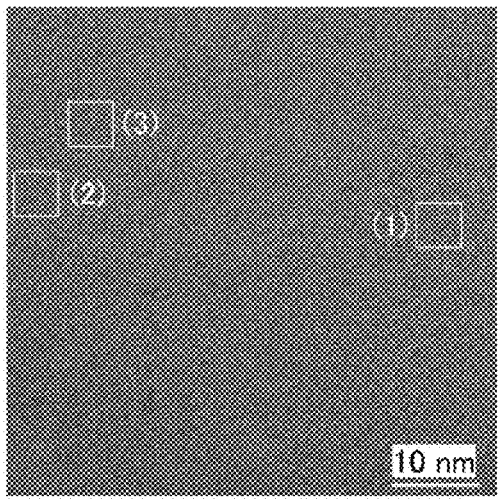
FIG. 36B  FIG. 36C  FIG. 36D
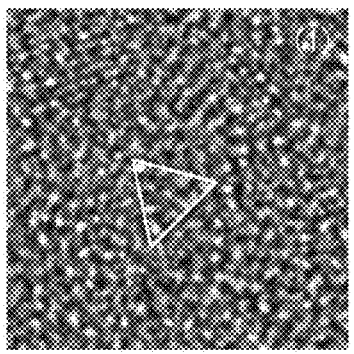 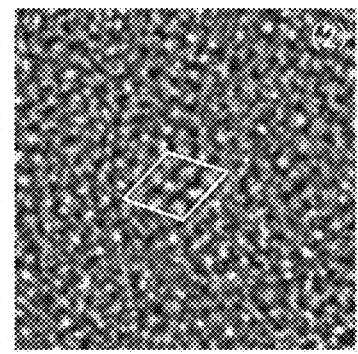 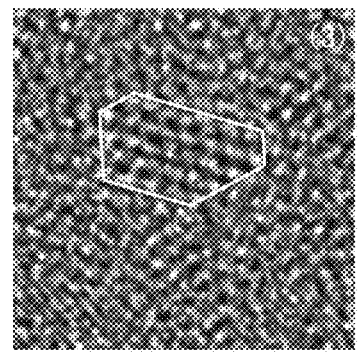

FIG. 38A
FIG. 38B
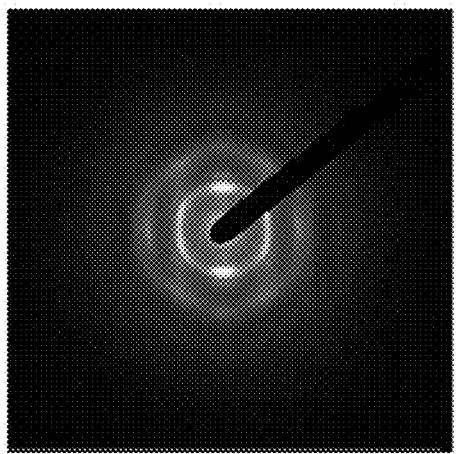
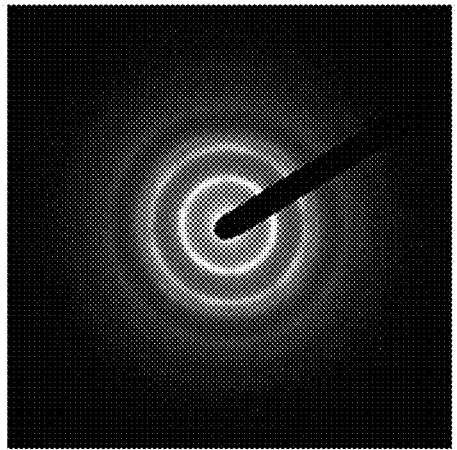

● In
○ Ga or Zn
● O

LIGHT-EMITTING DEVICE

TECHNICAL FIELD

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a memory device, a driving method thereof, or a manufacturing method thereof. In particular, one embodiment of the present invention relates to a semiconductor device, a display device, a light-emitting device, a power storage device, a storage device, a driving method thereof, or a manufacturing method thereof. The present invention relates to, for example, a semiconductor device, in particular, a light-emitting device in which transistors are provided in each pixel.

In this specification and the like, a semiconductor device generally means a device that can function by utilizing semiconductor characteristics. A display device, a light-emitting device, an electro-optical device, a semiconductor circuit, and an electronic device include a semiconductor device in some cases.

BACKGROUND ART

Specifically proposed structures of active matrix light-emitting devices including light-emitting elements differ depending on manufacturers. In general, at least a light-emitting element, a transistor (a switching transistor) that controls input of video signals to pixels, and a transistor (a driving transistor) that controls the value of current supplied to the light-emitting element are provided in each pixel.

When all the transistors in pixels have the same polarity, it is possible to omit some of steps for fabricating the transistors, for example, a step of adding an impurity element imparting one conductivity type to a semiconductor film. Patent Document 1 discloses a light-emitting element type display in which transistors included in pixels are all n-channel transistors.

In an active matrix light-emitting device including light-emitting elements, variation in the threshold voltages of transistors that controls the value of current supplied to the light-emitting elements in accordance with image signals (such transistors are also referred to as driving transistors) is likely to influence the luminance of the light-emitting elements. In order to prevent variation in the threshold voltage from influencing luminance of the light-emitting elements, Patent Document 2 discloses a display device which determines threshold voltage and mobility from a source voltage of a driving transistor and sets a program data signal based on the determined threshold voltage and mobility depending on a display image.

REFERENCE

Patent Document

[Patent Document 1] Japanese Published Patent Application No. 2003-195810
[Patent Document 2] Japanese Published Patent Application No. 2009-265459

DISCLOSURE OF INVENTION

The value of current output from the pixel which is used to determine electrical characteristics of the driving transistor is in the range of several tens of nanoamperes to several hundreds of nanoamperes, which is extremely small. Therefore, when an off-state current flows through power supply lines in a circuit electrically connected to a wiring serving as a path of the current, it becomes difficult to determine the electrical characteristics of the driving transistor with accuracy. In such a case, even when an image signal input to the pixel is corrected using the current output from the pixel, it is difficult to correct the value of current supplied to the light-emitting element so that the influence of the electrical characteristics of the driving transistor is reduced.

In view of the foregoing technical background, an object of one embodiment of the present invention is to provide a light-emitting device capable of suppressing variation in luminance among pixels. It is another object of one embodiment of the present invention to provide a novel light-emitting device. Another object of one embodiment of the present invention is to provide a novel semiconductor device.

Note that the description of these objects do not disturb the existence of other objects. One embodiment of the present invention does not necessarily achieve all the objects listed above. Other objects will be apparent from and can be derived from the description of the specification, the drawings, the claims, and the like.

According to one embodiment of the present invention, a light-emitting device includes a pixel, a first circuit, and a second circuit. The first circuit has a function of generating a signal including a value of current extracted from the pixel. The second circuit has a function of correcting an image signal by the signal. The pixel includes at least a light-emitting element, a first transistor, and a second transistor. The first transistor has a function of controlling supply of the current to the light-emitting element by the image signal. The second transistor has a function of controlling extraction of the current from the pixel. A semiconductor film of each of the first transistor and the second transistor includes a first semiconductor region overlapping with a gate electrode, a second semiconductor region in contact with a source electrode or a drain electrode, and a third semiconductor region between the first semiconductor region and the second semiconductor region. The third semiconductor region preferably contains higher concentration of hydrogen than the first semiconductor region and the second semiconductor region.

In the above embodiment, the semiconductor film is preferably an oxide semiconductor.

According to another embodiment of the present invention, a light-emitting device includes at least a wiring, a first transistor, a second transistor, a first capacitor, a second capacitor, and a light-emitting element. The first transistor includes a first semiconductor film, and a first gate electrode and a second gate electrode overlapping with each other with the first semiconductor film therebetween. The second transistor includes a second semiconductor film. The first capacitor has a function of holding a potential difference between one of a source electrode and a drain electrode of the first transistor and the first gate electrode. The second capacitor has a function of holding a potential difference between the one of the source electrode and the drain electrode of the first transistor and the second gate electrode. The second transistor has a function of controlling conduction between the second gate electrode and the wiring. Drain current of the first transistor is supplied to the light-emitting element. The first semiconductor film includes a first semiconductor region overlapping with the first gate electrode, a second semiconductor region in contact with the source electrode or the drain electrode of the first transistor, and a third semiconductor region between the first semiconductor region and the second semiconductor region. The second semiconductor film includes a fourth semiconductor region overlapping with a gate electrode of the second transistor, a fifth semiconductor region in contact with a source electrode or a drain electrode of the second transistor, and a sixth semiconductor region between the fourth semiconductor region and the fifth semiconductor region. The third semiconductor region preferably contains higher concentration of hydrogen than the first semiconductor region and the second semiconductor region, and the sixth semiconductor region preferably contains higher concentration of hydrogen than the fourth semiconductor region and the fifth semiconductor region.

In the above embodiment, the first semiconductor film and the second semiconductor film are preferably each an oxide semiconductor.

According to another embodiment of the present invention, a light-emitting device includes at least a first wiring, a second wiring, a first transistor, a second transistor, a third transistor, a fourth transistor, a fifth transistor, a capacitor, and a light-emitting element. The first transistor has a function of controlling conduction between the first wiring and a first electrode of the capacitor. A second electrode of the capacitor is electrically connected to one of a source electrode and a drain electrode of the fifth transistor. The second transistor has a function of controlling conduction between the second wiring and a gate electrode of the fifth transistor. The third transistor has a function of controlling conduction between the first electrode of the capacitor and the gate electrode of the fifth transistor. The fourth transistor has a function of controlling conduction between the one of the source electrode and the drain electrode of the fifth transistor and an anode of the light-emitting element. A semiconductor film of each of the first transistor, the second transistor, the third transistor, the fourth transistor, and the fifth transistor includes a first semiconductor region overlapping with a gate electrode, a second semiconductor region in contact with a source electrode or a drain electrode, and a third semiconductor region between the first semiconductor region and the second semiconductor region. The third semiconductor region preferably contains higher concentration of hydrogen than the first semiconductor region and the second semiconductor region.

A light-emitting device includes at least a first wiring, a second wiring, a third wiring, a first transistor, a second transistor, a third transistor, a fourth transistor, a fifth transistor, a capacitor, and a light-emitting element. The first transistor has a function of controlling conduction between the first wiring and a first electrode of the capacitor. A second electrode of the capacitor is electrically connected to one of a source electrode and a drain electrode of the fifth transistor and an anode of the light-emitting element. The second transistor has a function of controlling conduction between the second wiring and a gate electrode of the fifth transistor. The third transistor has a function of controlling conduction between the first electrode of the capacitor and the gate electrode of the fifth transistor. The fourth transistor has a function of controlling conduction between the one of the source electrode and the drain electrode of the fifth transistor and the third wiring. A semiconductor film of each of the first transistor, the second transistor, the third transistor, the fourth transistor, and the fifth transistor includes a first semiconductor region overlapping with a gate electrode, a second semiconductor region in contact with a source electrode or a drain electrode, and a third semiconductor region between the first semiconductor region and the second semiconductor region. The third semiconductor region preferably contains higher concentration of hydrogen than the first semiconductor region and the second semiconductor region.

In the above embodiment, the semiconductor film is preferably an oxide semiconductor.

In the above embodiment, the oxide semiconductor preferably contains indium, zinc, and M (M is Mg, Al, Ti, Ga, Y, Zr, La, Ce, Nd, or Hf).

Another embodiment of the present invention is an electronic device including the light-emitting device according to the above embodiment, a microphone, and an operation key.

One embodiment of the present invention can provide a light-emitting device capable of suppressing variation in luminance among pixels. Another embodiment of the present invention can provide a novel light-emitting device. Another embodiment of the present invention can provide a novel semiconductor device.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 36A to 36D are Cs-corrected high-resolution TEM images of a plane of a CAAC-OS.

FIGS. 38A and 38B show electron diffraction patterns of a CAAC-OS.

BEST MODE FOR CARRYING OUT THE INVENTION

Figure 1:
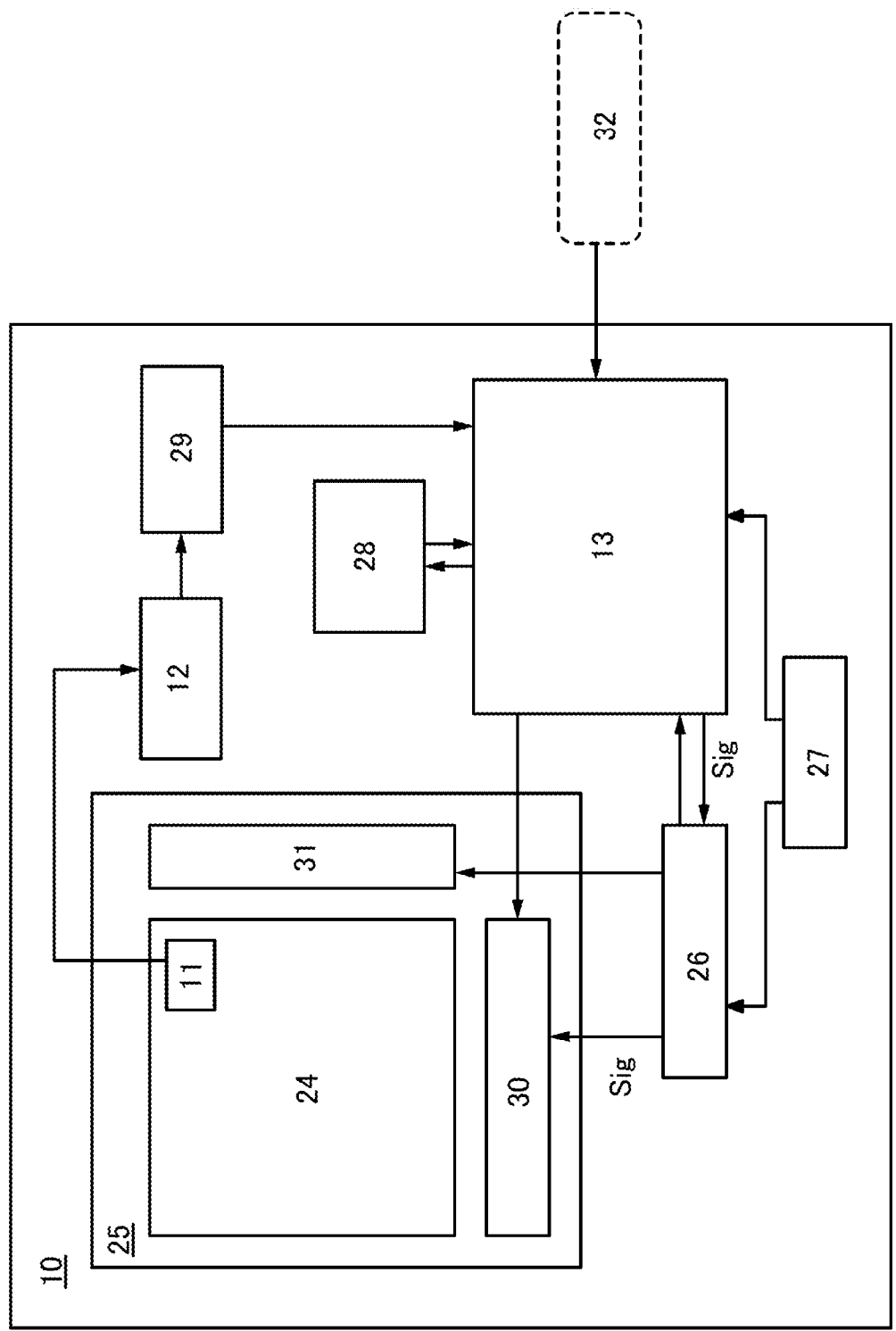
FIG. 1 illustrates a structure of a light-emitting device.

Embodiments of the present invention will be described below in detail with reference to the drawings. Note that the present invention is not limited to the description below, and it is easily understood by those skilled in the art that modes and details of the present invention can be modified in various ways without departing from the spirit and scope of the present invention. Therefore, the present invention should not be limited to the description of the embodiments below. Note that in the following embodiments, the same portions or portions having similar functions are denoted by the same reference numerals in different drawings, and explanation thereof will not be repeated.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source. Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

In addition, in this specification, "node" refers to any point on a wiring provided to connect elements electrically.

Note that in this specification, ordinal numbers such as "first", "second", and "third" are used in order to avoid confusion among components, and thus do not limit the number of the components.

Note that in this specification, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that the layout of circuit blocks in a drawing specifies the positional relationship for description. Thus, even when a drawing shows that different functions are achieved in different circuit blocks, an actual circuit or region may be configured so that the different functions are achieved in the same circuit block. Furthermore, the function of each circuit block in a drawing is specified for description. Thus, even when one circuit block is illustrated, an actual circuit or region may be configured so that processing which is illustrated as being performed in the one circuit block is performed in a plurality of circuit blocks.

Embodiment 1

In this embodiment, a circuit configuration of a light-emitting device of one embodiment of the present invention will be described.

Specific Structure Example 1 of Light-Emitting Device

A structure example of a light-emitting device of one embodiment of the present invention will be described. FIG. 1 is a block diagram illustrating, as an example, a structure of a light-emitting device 10 of one embodiment of the present invention. Although the block diagram shows elements classified according to their functions in independent blocks, it may be practically difficult to completely separate the elements according to their functions and, in some cases, one element may be involved in a plurality of functions.

The light-emitting device 10 illustrated in FIG. 1 includes a panel 25 including a plurality of pixels 11 in a pixel portion 24, a controller 26, a CPU 27, an image processing circuit 13, an image memory 28, a memory 29, and a monitor circuit 12. In addition, the light-emitting device 10 illustrated in FIG. 1 includes a driver circuit 30 and a driver circuit 31 in the panel 25.

The CPU 27 has a function of decoding an instruction input from the outside or an instruction stored in a memory provided in the CPU 27 and executing the instruction by controlling the overall operations of various circuits included in the light-emitting device 10.

The monitor circuit 12 generates a signal including data on the value of a drain current from the drain current which is output from the pixel 11. The memory 29 has a function of storing the data included in the signal.

The image memory 28 has a function of storing image data 32 which is input to the light-emitting device 10. Note that although only one image memory 28 is provided in the light-emitting device 10 in FIG. 1, a plurality of image memories 28 may be provided in the light-emitting device 10. For example, in the case where the pixel portion 24 displays a full-color image with the use of three pieces of image data 32 corresponding to hues such as red, blue, and green, respective image memories 28 corresponding to the pieces of image data 32 may be provided.

As the image memory 28, for example, a memory circuit such as a dynamic random access memory (DRAM) or a static random access memory (SRAM) can be used. Alternatively, a video RAM (VRAM) may be used as the image memory 28.

The image processing circuit 13 has functions of writing and reading the image data 32 to and from the image memory 28 in response to an instruction from the CPU 27 and generating an image signal Sig from the image data 32. In addition, the image processing circuit 13 has a function of reading the data stored in the memory 29 in response to an instruction from the CPU 27 and correcting the image signal Sig using the data.

The controller 26 has a function of processing the image signal Sig which includes image data 32 and is input to the controller 26, in accordance with the specification of the panel 25 and then supplying the processed image signal Sig to the panel 25.

The driver circuit 31 has a function of selecting a plurality of pixels 11 included in the pixel portion 24 row by row. The driver circuit 30 has a function of supplying the image signal Sig supplied from the controller 26 to the pixels 11 in a row selected by the driver circuit 31.

Note that the controller 26 has a function of supplying various driving signals used for driving the driver circuit 30, the driver circuit 31, and the like to the panel 25. The driving signals include a start pulse signal SSP and a clock signal SCK which control the operation of the driver circuit 30, a latch signal LP, a start pulse signal GSP and a clock signal GCK which control the operation of the driver circuit 31, and the like.

Note that the light-emitting device 10 may include an input device having a function of supplying data or an instruction to the CPU 27 included in the light-emitting device 10. As the input device, a keyboard, a pointing device, a touch panel, a sensor, or the like can be used.

Note that the pixel portion 24, the driver circuit 30, and the driver circuit 31 may each include an oxide semiconductor transistor including an oxide semiconductor in a channel region. The oxide semiconductor transistor has an extremely low off-state current; therefore, the power consumption of the light-emitting device 10 can be reduced with the use of the oxide semiconductor transistor. Note that the details of the oxide semiconductor transistor are described in Embodiment 2.

Note that the threshold voltage of the oxide semiconductor transistor is likely to change due to impurities such as hydrogen or moisture; therefore, it is preferable that the light-emitting device 10 have a function of correcting the threshold voltage of the driving transistor of the pixel 11 in the case where the driving transistor include an oxide semiconductor. An example of a specific structure of the light-emitting device 10 having the above correction function is described below.

Configuration Example 1 of Pixel

Figure 2:
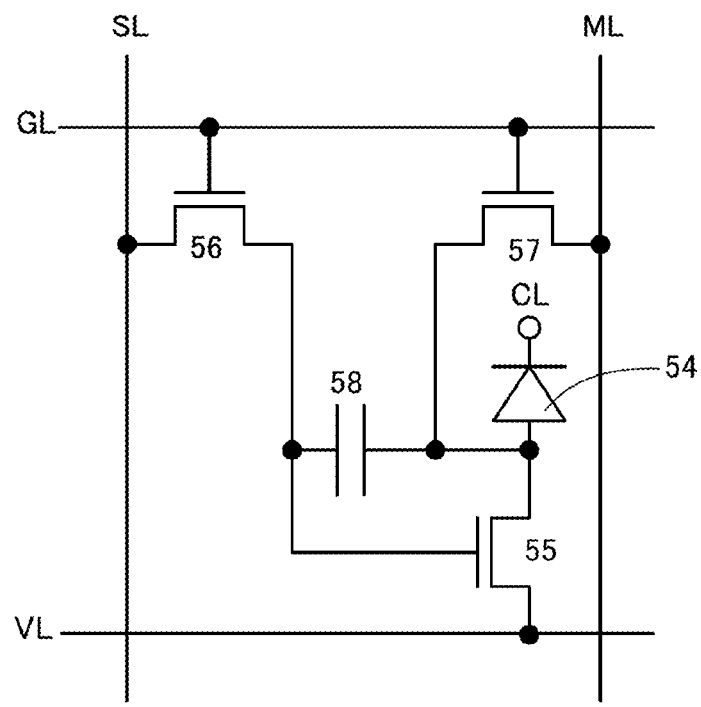
FIG. 2 illustrates a configuration of a pixel.

FIG. 2 illustrates an example of a circuit diagram of the pixel 11. The pixel 11 includes transistors 55 to 57, a capacitor 58, and a light-emitting element 54.

The potential of a pixel electrode of the light-emitting element 54 is controlled by the image signal Sig which is input to the pixel 11. The luminance of the light-emitting element 54 is determined by a potential difference between the pixel electrode and a common electrode. For example, in the case where an OLED is used as the light-emitting element 54, one of the anode and the cathode serves as the pixel electrode and the other thereof serves as the common electrode. FIG. 2 illustrates a configuration of the pixel 11 in which the anode of the light-emitting element 54 is used as the pixel electrode and the cathode of the light-emitting element 54 is used as the common electrode.

The transistor 56 has a function of controlling conduction between a wiring SL and a gate of the transistor 55. One of a source and a drain of the transistor 55 is electrically connected to the anode of the light-emitting element 54, and the other of the source and the drain of the transistor 55 is electrically connected to a wiring VL. The transistor 57 has a function of controlling conduction between a wiring ML and the one of the source and the drain of the transistor 55. One of a pair of electrodes of the capacitor 58 is electrically connected to the gate of the transistor 55, and the other thereof is electrically connected to the anode of the light-emitting element 54.

The switching of the transistor 56 is performed in accordance with the potential of a wiring GL electrically connected to a gate of the transistor 56. The switching of the transistor 57 is performed in accordance with the potential of the wiring GL electrically connected to a gate of the transistor 57.

In the transistors included in the pixel 11, an oxide semiconductor or an amorphous, microcrystalline, polycrystalline, or single crystal semiconductor can be used. As a material of such a semiconductor, silicon, germanium, and the like can be given. When the transistor 56 includes an oxide semiconductor in a channel formation region, the off-state current of the transistor 56 can be extremely low. Furthermore, when the transistor 56 having the above-described structure is used in the pixel 11, leakage of electric charge accumulated in the gate of the transistor 55 can be prevented effectively as compared with the case where a transistor including a normal semiconductor such as silicon or germanium is used as the transistor 56.

Accordingly, for example, in the case where image signals Sig each having the same image data are written to the pixel portion 24 for some consecutive frame periods as in the case of displaying a still image, display of an image can be maintained even when driving frequency is low, in other words, the number of operations of writing image signals Sig to the pixel portion 24 for a certain period is reduced. For example, a purified oxide semiconductor in which impurities serving as electron donors (donors), such as moisture or hydrogen, are reduced and oxygen vacancies are reduced is used for a semiconductor film of the transistor 56, whereby the interval between the operations of writing image signals Sig can be set to 10 seconds or longer, preferably 30 seconds or longer, or further preferably one minute or longer. As the interval between the operations of writing image signals Sig increases, power consumption can be further reduced.

In addition, since the potential of the image signal Sig can be held for a longer period, the quality of an image to be displayed can be prevented from being lowered even when the capacitor 58 for holding the potential of the gate of the transistor 55 is not provided in the pixel 11.

Note that in FIG. 2, the pixel 11 may further include another circuit element such as a transistor, a diode, a resistor, a capacitor, or an inductor as needed.

In FIG. 2, the transistors each have the gate on at least one side of a semiconductor film; alternatively, the transistors may each have a pair of gates with a semiconductor film provided therebetween.

The transistors in FIG. 2 are all n-channel transistors. When the transistors in the pixel 11 have the same channel type, it is possible to omit some of steps for fabricating the transistors, for example, a step of adding an impurity element imparting one conductivity type to the semiconductor film. Note that in the light-emitting device of one embodiment of the present invention, not all the transistors in the pixel 11 are necessarily n-channel transistors. In the case where the cathode of the light-emitting element 54 is electrically connected to the wiring CL, it is preferable that at least the transistor 55 be an n-channel transistor. In the case where the anode of the light-emitting element 54 is electrically connected to the wiring CL, it is preferable that at least the transistor 55 be a p-channel transistor.

FIG. 2 illustrates the case where the transistors in the pixel 11 have a single-gate structure including one gate and one channel formation region; however, one embodiment of the present invention is not limited to this structure. Any or all of the transistors in the pixel 11 may have a multi-gate structure including a plurality of gates electrically connected to each other and a plurality of channel formation regions.

Operation Example 1 of Pixel

Next, an operation example of the pixel 11 illustrated in FIG. 2 is described.

Figure 3:
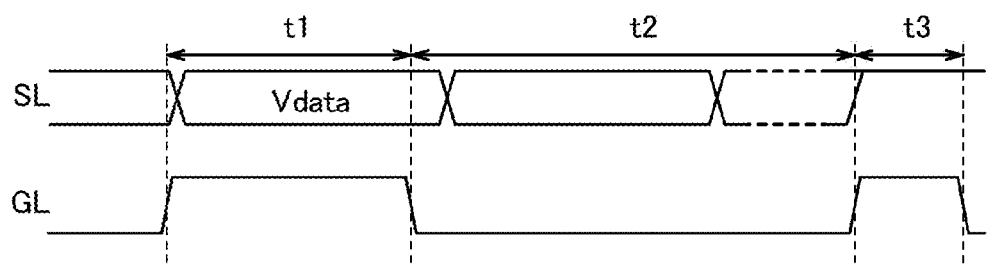
FIG. 3 is a timing chart illustrating the operation of the pixel.

FIG. 3 is a timing chart of a potential of the wiring GL, which is electrically connected to the pixel 11 illustrated in FIG. 2, and a potential of the image signal Sig applied to the wiring SL. Note that the timing chart illustrated in FIG. 3 is an example in which all the transistors included in the pixel 11 illustrated in FIG. 2 are n-channel transistors.

First, in a period t1, a high-level potential is applied to the wiring GL. Accordingly, the transistor 56 and the transistor 57 are turned on. A potential Vdata of the image signal Sig is applied to the wiring SL, and the potential Vdata is applied to the gate of the transistor 55 through the transistor 56.

A potential Vano is applied to the wiring VL, and a potential Vcat is applied to the wiring CL. The potential Vano is preferably higher than the sum of the potential Vcat, the threshold voltage Vthe of the light-emitting element 54, and the threshold voltage Vth of the transistor 55. The above potential difference is provided between the wiring VL and the wiring CL, so that the value of the drain current of the transistor 55 is determined by the potential Vdata. Then, the drain current is supplied to the light-emitting element 54, whereby the luminance of the light-emitting element 54 is determined.

In the case where the transistor 55 is an n-channel type, it is preferable that, in the period t1, the potential of the wiring ML be lower than the sum of the potential of the wiring CL and the threshold voltage Vthe of the light-emitting element 54, and the potential of the wiring VL be higher than the sum of the potential of the wiring ML and the threshold voltage Vth of the transistor 55. With the above configuration, the drain current of the transistor 55 can be made to flow preferentially through the wiring ML instead of the light-emitting element 54 even when the transistor 57 is on.

Next, in a period t2, a low-level potential is applied to the wiring GL. Accordingly, the transistor 56 and the transistor 57 are turned off. Since the transistor 56 is off, the potential Vdata is held at the gate of the transistor 55. A potential Vano is applied to the wiring VL, and a potential Vcat is applied to the wiring CL. Thus, the light-emitting element 54 emits light in accordance with the luminance determined in the period t1.

Next, in a period t3, a high-level potential is applied to the wiring GL. Accordingly, the transistor 56 and the transistor 57 are turned on. In addition, such a potential that the gate voltage of the transistor 55 is higher than the threshold voltage Vth thereof is applied to the wiring SL. The potential Vcat is applied to the wiring CL. Then, the potential of the wiring ML is lower than the sum of the potential of the wiring CL and the threshold voltage Vthe of the light-emitting element 54, and the potential of the wiring VL is higher than the sum of the potential of the wiring ML and the threshold voltage Vth of the transistor 55. With the above configuration, the drain current of the transistor 55 can be made to flow preferentially through the wiring ML instead of the light-emitting element 54.

Then, the drain current of the transistor 55 is also supplied to the monitor circuit through the wiring ML. The monitor circuit generates a signal including data on the value of the drain current by using the drain current flowing through the wiring ML. Thus, using the above signal, the light-emitting device of one embodiment of the present invention can correct the value of the potential Vdata of the image signal Sig applied to the pixel 11.

Note that in the light-emitting device including the pixel 11 illustrated in FIG. 2, the operation in the period t3 is not necessarily performed after the operation in the period t2. For example, in the pixel 11, the operation in the period t3 may be performed after the operations in the periods t1 and t2 are repeated a plurality of times. Alternatively, after the operation in the period t3 is performed on pixels 11 in one row, the light-emitting elements 54 may be brought into a non-light-emitting state by writing an image signal corresponding to the lowest grayscale level 0 to the pixels 11 in the row which have been subjected to the above operation. Then, the operation in the period t3 may be performed on pixels 11 in the next row.

<Connection Relation Between Pixel Portion and Sampling Circuit>

Figure 4:
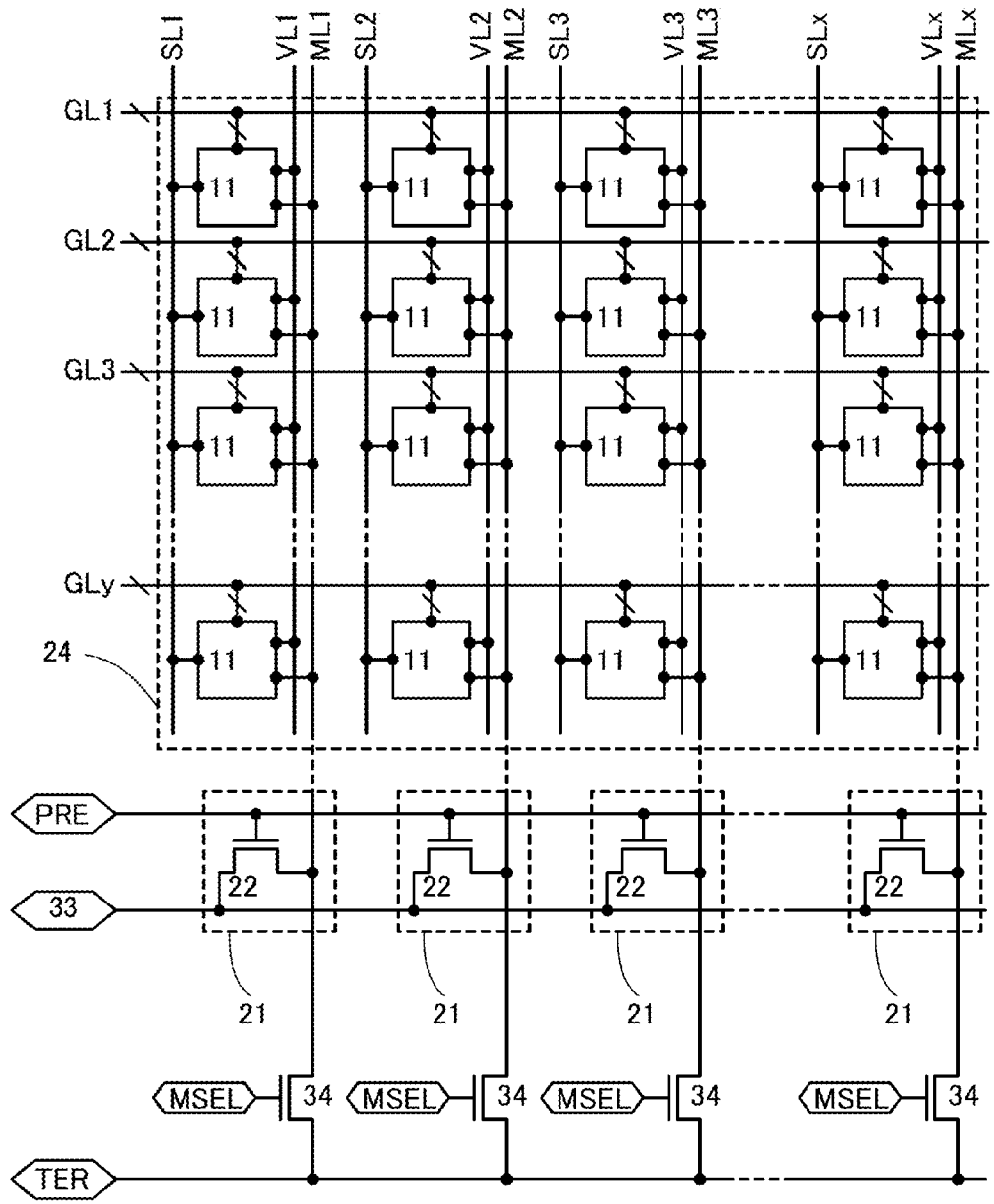
FIG. 4 illustrates the connection relation between a pixel portion and a sampling circuit.

Next, an example of a connection relation between the pixel portion 24 illustrated in FIG. 1 and a sampling circuit corresponding to part of the driver circuit 30 is illustrated in FIG. 4.

The pixel portion 24 illustrated in FIG. 4 is provided with a plurality of pixels 11, a plurality of wirings GL (wirings GL1 to GLy), a plurality of wirings SL (wirings SL1 to SLx), a plurality of wirings ML (wirings ML1 to MLx), and a plurality of wirings VL (wirings VL1 to VLx). Each of the plurality of pixels 11 is electrically connected to at least one of the wirings GL, at least one of the wirings SL, at least one of the wirings ML, and at least one of the wirings VL.

Note that the kind and number of the wirings in the pixel portion 24 can be determined by the configuration, number, and arrangement of the pixels 11. Specifically, in the pixel portion 24 illustrated in FIG. 4, the pixels 11 are arranged in a matrix of x columns and y rows, and the wirings GL1 to GLy, the wirings SL1 to SLx, the wirings ML1 to MLx, and the wirings VL1 to VLx are provided in the pixel portion 24 as an example.

The drain current extracted from the pixel 11 through the wirings ML1 to MLx is supplied to the monitor circuit (not illustrated) through a wiring TER.

A circuit 21 has a function of supplying a predetermined potential to the wiring ML in accordance with a potential input to a wiring PRE. For example, when the pixel 11 illustrated in FIG. 2 is operated in accordance with the timing chart illustrated in FIG. 3, in the period t1, a potential lower than the sum of the potential of the wiring CL and the threshold voltage Vthe of the light-emitting element 54 may be supplied from the circuit 21 to the wiring ML.

In FIG. 4, the circuit 21 includes a transistor 22. A potential input to the wiring PRE is applied to a gate of the transistor 22. Then, the transistor 22 has a function of controlling conduction between a wiring 33 and the wiring ML in accordance with a potential of the wiring PRE input to the gate.

In addition, in FIG. 4, a transistor 34 having a function of controlling conduction between the wiring ML and the wiring TER in accordance with a potential of a wiring MSEL is provided.

Configuration Example 2 of Pixel

Figure 5:
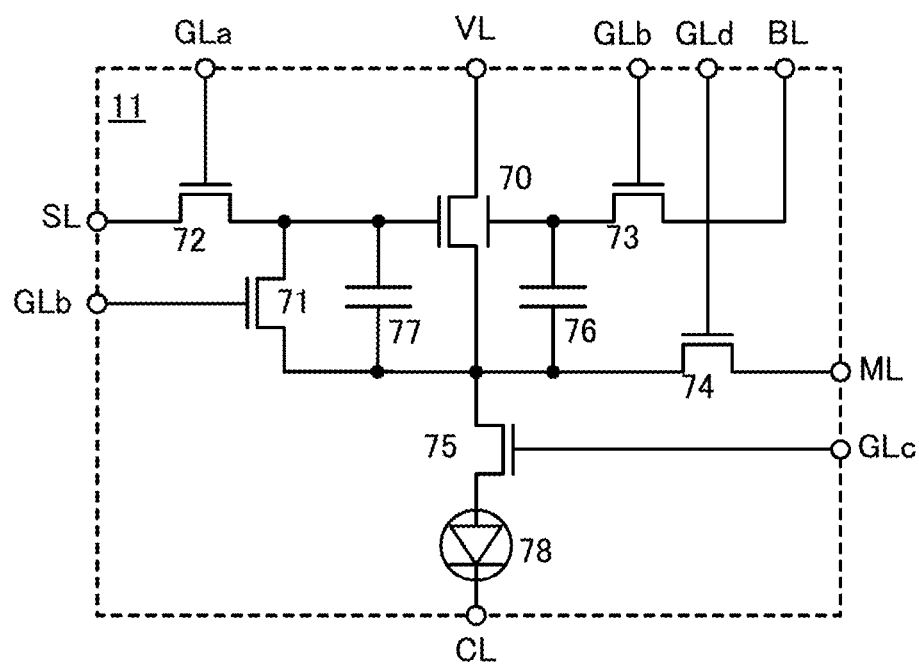
FIG. 5 illustrates a configuration of a pixel.

The pixel 11 illustrated in FIG. 5 includes transistors 70 to 75, capacitors 76 and 77, and a light-emitting element 78. The transistor 70 includes a normal gate (a first gate) and a second gate overlapping with the first gate with a semiconductor film provided therebetween.

Specifically, a gate of the transistor 72 is electrically connected to a wiring GLa, one of a source and a drain of the transistor 72 is electrically connected to a wiring SL, and the other thereof is electrically connected to the first gate of the transistor 70. A gate of the transistor 71 is electrically connected to a wiring GLb, one of a source and a drain of the transistor 71 is electrically connected to one of a source and a drain of the transistor 75, and the other thereof is electrically connected to the first gate of the transistor 70. One of a source and a drain of the transistor 70 is electrically connected the one of the source and the drain of the transistor 75, and the other thereof is electrically connected to a wiring VL. A gate of the transistor 73 is electrically connected to the wiring GLb, one of a source and a drain of the transistor 73 is electrically connected to a wiring BL, and the other thereof is electrically connected to the second gate of the transistor 70. A gate of the transistor 74 is electrically connected to a wiring GLd, one of a source and a drain of the transistor 74 is electrically connected to a wiring ML, and the other thereof is electrically connected to the one of the source and the drain of the transistor 75. A gate of the transistor 75 is electrically connected to a wiring GLc, and the other of the source and the drain is electrically connected to a pixel electrode of the light-emitting element 78.

One of a pair of electrodes of the capacitor 76 is electrically connected to the second gate of the transistor 70, and the other thereof is electrically connected to the one of the source and the drain of the transistor 75. One of a pair of electrodes of the capacitor 77 is electrically connected to the first gate of the transistor 70, and the other thereof is electrically connected to the one of the source and the drain of the transistor 75. A common electrode of the light-emitting element 78 is electrically connected to a wiring CL.

Operation Example 2 of Pixel

Next, the operation of the pixel of the light-emitting device of one embodiment of the present invention is described using the pixel 11 illustrated in FIG. 5 as an example.

Figure 6A:
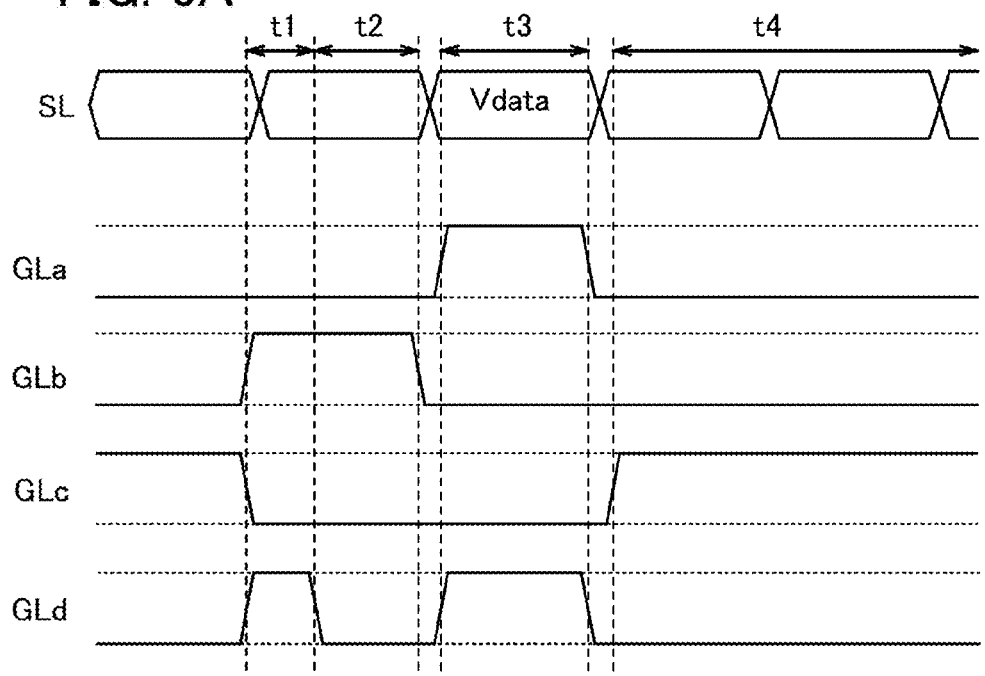
FIGS. 6A and 6B are each a timing chart illustrating the operation of the pixel.

FIG. 6A is a timing chart of potentials input to the wirings GLa to GLd and a potential of an image signal Sig input to the wiring SL. Note that the timing chart illustrated in FIG. 6A is an example in which all the transistors included in the pixel 11 illustrated in FIG. 5 are n-channel transistors.

First, in a period t1, a low-level potential is applied to the wiring GLa, a high-level potential is applied to the wiring GLb, a low-level potential is applied to the wiring GLc, and a high-level potential is applied to the wiring GLd. Accordingly, the transistor 71, the transistor 73, and the transistor 74 are turned on, and the transistor 72 and the transistor 75 are turned off.

A potential Vano is applied to the wiring VL, a potential V0 is applied to the wiring BL, a potential V1 is applied to the wiring ML, and a potential Vcat is applied to the wiring CL electrically connected to the common electrode of the light-emitting element 78. Thus, the potential V1 is applied to the first gate of the transistor 70 (hereinafter referred to as a node A), the potential V0 is applied to the second gate of the transistor 70 (hereinafter referred to as a node B), and the potential V1 is applied to the one of the source and the drain of the transistor 70 (hereinafter referred to as a node C).

The potential Vano is preferably higher than the sum of the potential Vcat, the threshold voltage Vthe of the light-emitting element 78, and the threshold voltage Vth of the transistor 70. The potential V0 is preferably much higher than the node C so that the threshold voltage Vth of the transistor 70 can be shifted in the negative direction. Specifically, it is preferable to satisfy, where Vth0 denotes the threshold voltage Vth of the transistor 70 when a voltage Vbg (a voltage corresponding to a potential difference between the node B and the node C) is 0 V and Vth1 denotes the threshold voltage Vth of the transistor 70 in the period t1. The transistor 70 with the above structure is a normally-on transistor; therefore, the transistor 70 can be turned on even when the potential difference between the node A and the node C, that is, the gate voltage of the transistor 70 is 0 V.

Note that when the transistor 70 is a p-channel transistor, the potential V0 is preferably much lower than the node C so that the threshold voltage Vth of the transistor 70 can be shifted in the positive direction. The transistor 70 with the above structure is a normally-on transistor; therefore, the transistor 70 can be turned on even when the potential difference between the node A and the node C, that is, the gate voltage of the transistor 70 is 0 V.

Next, in a period t2, a low-level potential is applied to the wiring GLa, a high-level potential is applied to the wiring GLb, a low-level potential is applied to the wiring GLc, and a low-level potential is applied to the wiring GLd. Accordingly, the transistor 71 and the transistor 73 are turned on, and the transistor 72, the transistor 74, and the transistor 75 are turned off.

A potential Vano is applied to the wiring VL, and a potential V0 is applied to the wiring BL. The potential V0 thus keeps being applied to the node B, and the threshold voltage Vth of the transistor 70 remains in a state of being shifted in the negative direction, i.e. Vth1, at the start of the period t2; therefore, the transistor 70 is on. In the period t2, the current path between the wiring VL and the wiring ML is cut by the transistor 74, and therefore the potentials of the node A and the node C start to increase due to the drain current of the transistor 70. The potential of the node C is increased, and the potential Vbg corresponding to the potential difference between the node B and the node C is then lowered, so that the threshold voltage Vth of the transistor 70 is shifted in the positive direction. As the threshold voltage Vth of the transistor 70 closely approaches 0 V, the transistor 70 is turned off. The potential difference between the node B and the node C when the threshold voltage Vth of the transistor 70 is 0 V is V0−V2.

That is, when the potential difference between the node B and the node C is V0−V2, the threshold voltage Vth of the transistor 70 is corrected to 0 V so that the drain current converges to 0 A with respect to the gate voltage of 0 V, so that the potential difference V0−V2 between the node B and the node C is applied to the capacitor 76.

Next, in a period t3, a high-level potential is applied to the wiring GLa, a low-level potential is applied to the wiring GLb, a low-level potential is applied to the wiring GLc, and a high-level potential is applied to the wiring GLd. Accordingly, the transistor 72 and the transistor 74 are turned on, and the transistor 71, the transistor 73, and the transistor 75 are turned off.

The potential Vano, the potential Vdata of the image signal Sig, and the potential V1 are applied to the wiring VL, the wiring SL, and the wiring ML, respectively. The node B is in a floating state. Thus, when the potential of the node C is changed from V2 to V1, the potential of the node B is changed from V0 to V0+V1−V2 by the capacitor 76. Because the capacitor 76 holds the potential difference V0−V2, the threshold voltage Vth of the transistor 70 is maintained at 0 V. The potential Vdata is applied to the node A, and the gate voltage of the transistor 70 is thus Vdata−V1.

Next, in a period t4, a low-level potential is applied to the wiring GLa, a low-level potential is applied to the wiring GLb, a high-level potential is applied to the wiring GLc, and a low-level potential is applied to the wiring GLd. Accordingly, the transistor 75 is turned on, and the transistors 71 to 74 are turned off.

A potential Vano is applied to the wiring VL, and a potential Vcat is applied to the wiring CL electrically connected to the common electrode of the light-emitting element 78. In the period t4, the potential of the node C is changed by turning on the transistor 75. When the potential of the node C is changed to V3, the potentials of the node A and the node B become Vdata+V3−V1 and V0−V2+V3, respectively. Even when the potentials of the nodes A, B, and C are changed, the capacitor 76 and the capacitor 77 hold the potential difference V0−V2 and the potential difference Vdata−V1, respectively. The drain current having a value corresponding to the gate voltage of the transistor 70 flows between the wiring VL and the wiring CL. The luminance of the light-emitting element 78 depends on the value of the drain current.

Note that, in the light-emitting device including the pixel 11 illustrated in FIG. 5, the other of the source and the drain of the transistor 70 is electrically isolated from the second gate of the transistor 70, so that their potentials can be individually controlled. Therefore, in the case where the transistor 70 is a normally-on transistor, in other words, in the case where the threshold voltage Vth0 of the transistor 70 in an initial state is negative, charge can be accumulated in the capacitor 76 until the potential of the one of the source and the drain of the transistor 70 becomes higher than the potential V0 of the second gate in the period t2. As a result, in the light-emitting device of one embodiment of the present invention, even when the transistor 70 is normally-on, the threshold voltage Vth can be corrected to 0 V so that the drain current converges to 0 A with respect to a gate voltage 0 V in the period t2.

By using an oxide semiconductor for a semiconductor film of the transistor 70, for example, the light-emitting device including the pixel 11 illustrated in FIG. 5 in which the other of the source and the drain of the transistor 70 is electrically isolated from the second gate of the transistor 70 can reduce display unevenness and can display high-quality images even when the transistor 70 is normally-on.

The above is the operation example of the pixel 11 including threshold voltage correction (hereinafter referred to as internal correction) in the pixel 11. Described below is an operation of the pixel 11 in the case where variation in luminance among the pixels 11 due to variation in threshold voltages is suppressed by correcting an image signal (hereinafter referred to as external correction) in addition to the internal correction.

Figure 6B:
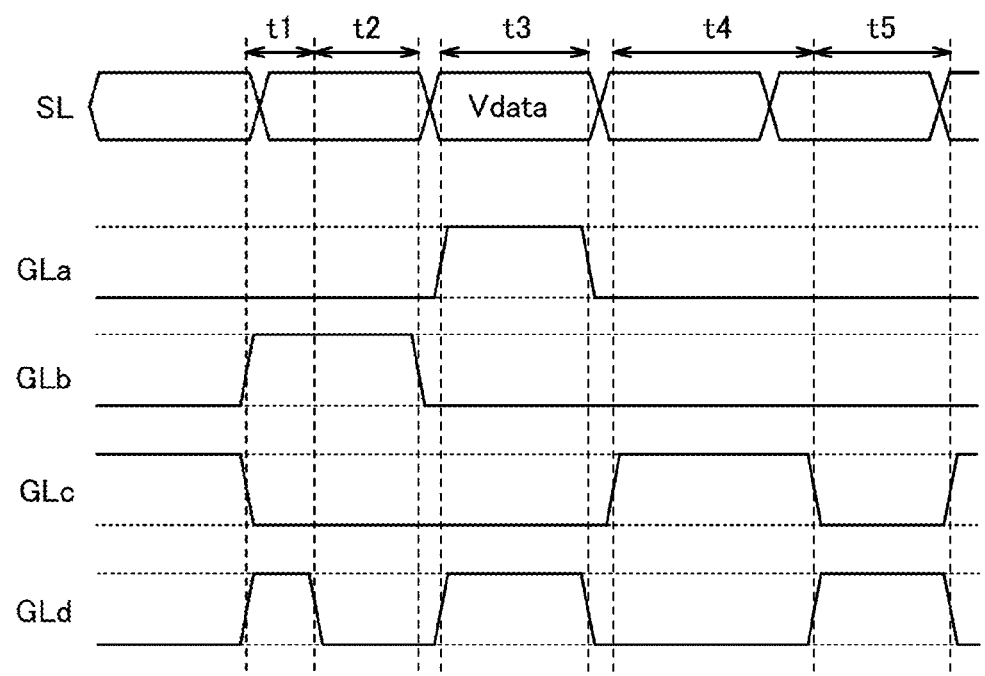

Using the pixel 11 illustrated in FIG. 5 as an example, FIG. 6B is a timing chart of potentials input to the wirings GLa to GLd when both the internal correction and the external correction are performed, and a potential Vdata of the image signal Sig input to the wiring SL. Note that the timing chart illustrated in FIG. 6B is an example in which all the transistors included in the pixel 11 illustrated in FIG. 5 are n-channel transistors.

First, the pixel 11 operates from the period t1 to the period t4 according to the timing chart illustrated in FIG. 6A and the above description.

Next, in a period t5, a low-level potential is applied to the wiring GLa, a low-level potential is applied to the wiring GLb, a low-level potential is applied to the wiring GLc, and a high-level potential is applied to the wiring GLd. Accordingly, the transistor 74 is turned on, and the transistor 71, the transistor 72, the transistor 73, and the transistor 75 are turned off.

A potential Vano is applied to the wiring VL, and a potential V1 is applied to the wiring ML. The wiring ML is electrically connected to a monitor circuit.

By the above operation, the drain current of the transistor 70 is also supplied to the monitor circuit through the transistor 74 and the wiring ML. The monitor circuit generates a signal including data on the value of the drain current by using the drain current flowing through the wiring ML. Thus, using the above signal, the light-emitting device of one embodiment of the present invention can correct the value of the potential Vdata of the image signal Sig applied to the pixel 11.

Note that external correction in the period t5 is not necessarily performed after the operation in the period t4. For example, in the light-emitting device, the operation in the period t5 may be performed after the operations in the periods t1 to t4 are repeated a plurality of times. Alternatively, after the operation in the period t5 is performed on pixels 11 in one row, the light-emitting elements 78 may be brought into a non-light-emitting state by writing an image signal Sig corresponding to the lowest grayscale level 0 to the pixels 11 in the row which have been subjected to the above operation. Then, the operation in the period t5 may be performed on pixels 11 in the next row.

Note that even when only external correction is performed and internal correction is not performed, not only variation in threshold voltage of the transistors 70 between the pixels 11 but also variation in other electrical characteristics, such as mobility, of the transistors 70 can be corrected. Note that in the case where internal correction is performed in addition to external correction, a negative shift or a positive shift of the threshold voltage is corrected by the internal correction. Thus, external correction may be performed to correct variation in electrical characteristics other than threshold voltage, such as mobility, of the transistor 70. Therefore, in the case where internal correction is performed in addition to external correction, the potential amplitude of a corrected image signal can be made smaller than that in the case where only the external correction is performed. This can prevent a situation where the potential amplitude of the image signal is so large that there are large differences in potential of the image signal between different grayscale levels and it is difficult to express minute gradations of an image with luminance differences. Thus, a decrease in image quality can be prevented.

Configuration Example 3 of Pixel

Next, another specific configuration example of the pixel 11 is described.

Figure 7:
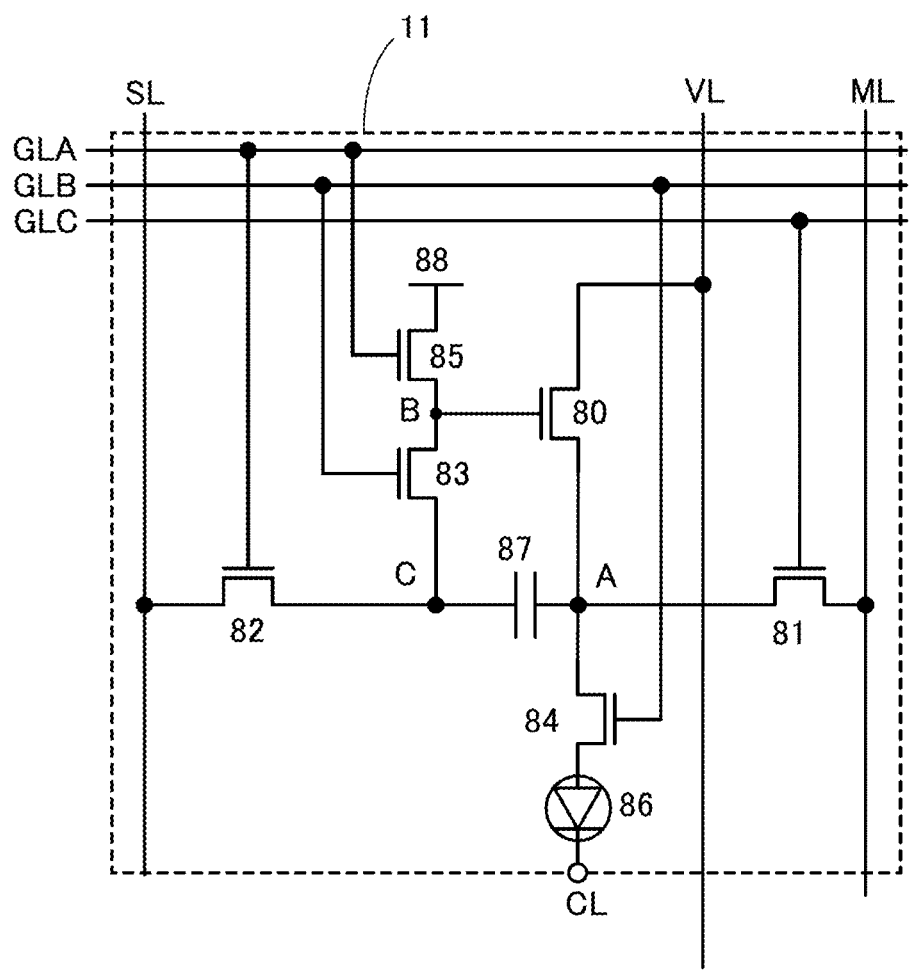
FIG. 7 illustrates a configuration of a pixel.

FIG. 7 illustrates another example of the circuit diagram of the pixel 11. The pixel 11 includes transistors 80 to 85, a light-emitting element 86, and a capacitor 87.

The potential of a pixel electrode of the light-emitting element 86 is controlled by an image signal Sig which is input to the pixel 11. The luminance of the light-emitting element

86 is determined by a potential difference between the pixel electrode and a common electrode. For example, in the case where an OLED is used as the light-emitting element 86, one of the anode and the cathode serves as the pixel electrode and the other thereof serves as the common electrode. FIG. 7 illustrates a configuration of the pixel 11 in which the anode of the light-emitting element 86 is used as the pixel electrode and the cathode of the light-emitting element 86 is used as the common electrode.

The transistor 85 has a function of controlling conduction between a wiring 88 and a gate of the transistor 80. The transistor 83 has a function of controlling conduction between one of a pair of electrodes of the capacitor 87 and the gate of the transistor 80. The transistor 82 has a function of controlling conduction between the wiring SL and the one of the pair of electrodes of the capacitor 87. The other of the pair of electrodes of the capacitor 87 is electrically connected to one of a source and a drain of the transistor 80. The transistor 84 has a function of controlling conduction between the one of the source and the drain of the transistor 80 and the pixel electrode of the light-emitting element 86. The transistor 81 has a function of controlling conduction between the wiring ML and the one of the source and the drain of the transistor 80. The other of the source and the drain of the transistor 80 is electrically connected to the wiring VL.

The switching of the transistor 82 and the switching of the transistor 85 are controlled in accordance with the potential of a wiring GLA electrically connected to a gate of the transistor 82 and the potential thereof electrically connected to a gate of the transistor 85, respectively. The switching of the transistor 83 and the switching of the transistor 84 are controlled in accordance with the potential of a wiring GLB electrically connected to a gate of the transistor 83 and the potential thereof electrically connected to a gate of the transistor 84. The switching of the transistor 81 is controlled in accordance with the potential of a wiring GLC electrically connected to a gate of the transistor 81.

In the transistors included in the pixel 11, an oxide semiconductor or an amorphous, microcrystalline, polycrystalline, or single crystal semiconductor can be used. As a material of such a semiconductor, silicon, germanium, and the like can be given. When the transistor 82, the transistor 83, and the transistor 85 include oxide semiconductors in channel formation regions, the off-state currents of the transistor 82, the transistor 83, and the transistor 85 can be extremely low. Furthermore, when the transistor 82, the transistor 83, and the transistor 85 each having the above-described structure are used in the pixel 11, leakage of electric charge accumulated in the gate of the transistor 80 can be prevented effectively as compared with the case where a transistor including a normal semiconductor such as silicon or germanium is used as the transistor 82, the transistor 83, and the transistor 85.

Accordingly, for example, in the case where image signals Sig each having the same image data are written to the pixel portion for some consecutive frame periods as in the case of displaying a still image, display of an image can be maintained even when driving frequency is low, in other words, the number of operations of writing image signals Sig to the pixel portion for a certain period is reduced. For example, by using a highly purified oxide semiconductor for semiconductor films of the transistor 82, the transistor 83, and the transistor 85, the interval between the operations of writing image signals Sig can be set to 10 seconds or longer, preferably 30 seconds or longer, or further preferably one minute or longer. As the interval between the operations of writing image signals Sig increases, power consumption can be further reduced.

In addition, since the potential of the image signal Sig can be held for a longer period, the quality of an image to be displayed can be prevented from being lowered even when the capacitor 87 for holding the potential of the gate of the transistor 80 is not provided in the pixel 11.

Note that in FIG. 7, the pixel 11 may further include another circuit element such as a transistor, a diode, a resistor, a capacitor, or an inductor as needed.

In FIG. 7, the transistors each have the gate on at least one side of a semiconductor film; alternatively, the transistors may each have a pair of gates with a semiconductor film provided therebetween.

The transistors in FIG. 7 are all n-channel transistors. When the transistors in the pixel 11 have the same channel type, it is possible to omit some of steps for fabricating the transistors, for example, a step of adding an impurity element imparting one conductivity type to the semiconductor film. Note that in the light-emitting device of one embodiment of the present invention, not all the transistors in the pixel 11 are necessarily n-channel transistors. In the case where the cathode of the light-emitting element 86 is electrically connected to the wiring CL, it is preferable that at least the transistor 80 be an n-channel transistor. In the case where the anode of the light-emitting element 86 is electrically connected to the wiring CL, it is preferable that at least the transistor 80 be a p-channel transistor.

FIG. 7 illustrates the case where the transistors in the pixel 11 have a single-gate structure including one gate and one channel formation region; however, one embodiment of the present invention is not limited to this structure. Any or all of the transistors in the pixel 11 may have a multi-gate structure including a plurality of gates electrically connected to each other and a plurality of channel formation regions.

Operation Example 3 of Pixel

Figure 8A:
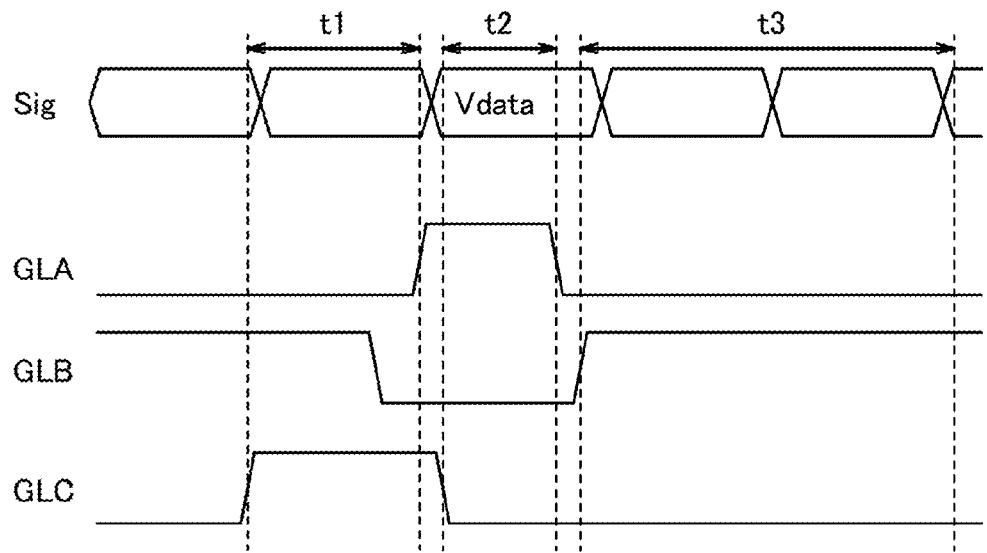
FIGS. 8A and 8B are each a timing chart illustrating the operation of the pixel.

Next, an example of operation of the pixel 11 illustrated in FIG. 7 is described. FIG. 8A is a timing chart of potentials of the wiring GLA, the wiring GLB, and the wiring GLC, which are electrically connected to the pixel 11 illustrated in FIG. 7, and a potential of the image signal Sig applied to the wiring SL. Note that the timing chart illustrated in FIG. 8A is an example in which all the transistors included in the pixel 11 illustrated in FIG. 7 are n-channel transistors.

First, in a period t1, a low-level potential is applied to the wiring GLA, a high-level potential is applied to the wiring GLB, and a high-level potential is applied to the wiring GLC. Accordingly, the transistor 81, the transistor 83, and the transistor 84 are turned on, and the transistor 82 and the transistor 85 are turned off. The transistor 81 and the transistor 84 are turned on, whereby a potential V0, which is the potential of the wiring ML, is applied to the one of the source and the drain of the transistor 80 and the other electrode of the capacitor 87 (hereinafter referred to as a node A).

A potential Vano is applied to the wiring VL, and a potential Vcat is applied to a wiring CL. The potential Vano is preferably higher than the sum of the potential V0 and the threshold voltage Vthe of the light-emitting element 86. The potential V0 is preferably lower than the sum of the potential Vcat and the threshold voltage Vthe of the light-emitting element 86. With the potential V0 set to the value in the above range, current can be prevented from flowing through the light-emitting element 86 in the period t1.

Next, a low-level potential is applied to the wiring GLB, and the transistor 83 and the transistor 84 are accordingly turned off and the node A is held at the potential V0.

Next, in a period t2, a high-level potential is applied to the wiring GLA, a low-level potential is applied to the wiring GLB, and a low-level potential is applied to the wiring GLC. Accordingly, the transistor 82 and the transistor 85 are turned on, and the transistor 81, the transistor 84, and the transistor 83 are turned off.

Note that it is preferable in the transition from the period t1 to the period t2 that the potential applied to the wiring GLA be switched from low to high and then the potential applied to the wiring GLC be switched from high to low. This operation prevents change in the potential of the node A due to the switching of the potential applied to the wiring GLA.

A potential Vano is applied to the wiring VL, and a potential Vcat is applied to the wiring CL. A potential Vdata of the image signal Sig is applied to the wiring SL, and a potential V1 is applied to the wiring 88. Note that the potential V1 is preferably higher than the sum of the potential Vcat and the threshold voltage Vth of the transistor 80 and lower than the sum of the potential Vano and the threshold voltage Vth of the transistor 80.

Note that in the pixel configuration illustrated in FIG. 7, even if the potential V1 is higher than the sum of the potential Vcat and the threshold voltage Vthe of the light-emitting element 86, the light-emitting element 86 does not emit light as long as the transistor 84 is off. Thus, the allowable potential V0 range can be expanded and the allowable range of V1–V0 can be increased. As a result of increasing the degree of freedom of values for V1–V0, the threshold voltage of the transistor 80 can be obtained accurately even when time required to obtain the threshold voltage of the transistor 80 is reduced or limited.

By the above operation, the potential V1 which is higher than the sum of the potential of the node A and the threshold voltage of the transistor 80 is input to the gate of the transistor 80 (hereinafter referred to as a node B), and the transistor 80 is turned on. Thus, electric charge in the capacitor 87 is released through the transistor 80, and the potential of the node A, which is the potential V0, starts to increase. The potential of the node A finally converges to the potential V1–Vth and the gate voltage of the transistor 80 converges to the threshold voltage Vth of the transistor 80; then, the transistor 80 is turned off.

The potential Vdata of the image signal Sig applied to the wiring SL is applied to the one of the pair of electrodes of the capacitor 87 (illustrated as a node C) through the transistor 82.

Next, in a period t3, a low-level potential is applied to the wiring GLA, a high-level potential is applied to the wiring GLB, and a low-level potential is applied to the wiring GLC. Accordingly, the transistor 83 and the transistor 84 are turned on, and the transistor 81, the transistor 85, and the transistor 82 are turned off.

During transition from the period t2 to the period t3, it is preferable that the potential applied to the wiring GLA be switched from high to low, and then, the potential applied to the wiring GLB be switched from low to high. The steps can prevent potential change of the node A due to the switching of the potential applied to the wiring GLA.

A potential Vano is applied to the wiring VL, and a potential Vcat is applied to the wiring CL.

The potential Vdata is applied to the node B by the above operation; thus, the gate voltage of the transistor 80 becomes Vdata–V1+Vth. Accordingly, the gate voltage of the transistor 80 can have the value to which the threshold voltage Vth is added. With the steps, variation of the threshold voltages Vth of the transistor 80 can be reduced. Thus, variation of the values of current supplied to the light-emitting element 86 can be suppressed, whereby unevenness in luminance of the light-emitting device can be reduced.

Note that the potential applied to the wiring GLB is greatly changed here, whereby an influence of variation of threshold voltages of the transistor 84 on the value of current supplied to the light-emitting element 86 can be prevented. In other words, the high-level potential applied to the wiring GLB is much higher than the threshold voltage of the transistor 84, and the low-level potential applied to the wiring GLB is much lower than the threshold voltage of the transistor 84; thus, on/off switching of the transistor 84 is secured and the influence of variation of threshold voltages of the transistor 84 on the value of current supplied to the light-emitting element 86 can be prevented.

The above is the operation example of the pixel 11 including internal correction. Described below is an operation of the pixel 11 in the case where variation in luminance among the pixels 11 due to variation in threshold voltages is suppressed by external correction in addition to the internal correction.

Figure 8B:
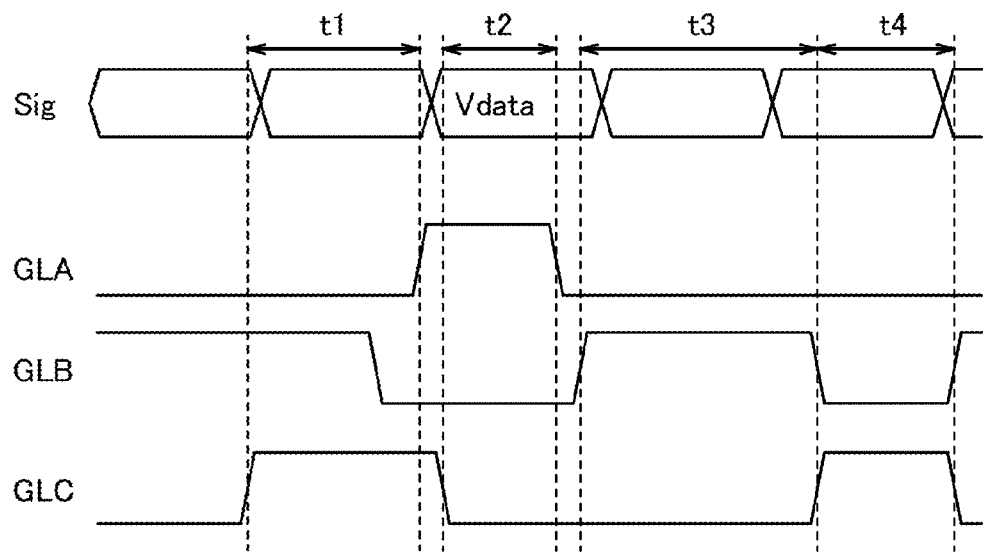

Using the pixel 11 illustrated in FIG. 7 as an example, FIG. 8B is a timing chart of potentials input to the wirings GLA to GLC when both the internal correction and the external correction are performed, and a potential Vdata of the image signal Sig input to the wiring SL. Note that the timing chart illustrated in FIG. 8B is an example in which all the transistors included in the pixel 11 illustrated in FIG. 7 are n-channel transistors.

First, the pixel 11 operates from the period t1 to the period t3 according to the timing chart illustrated in FIG. 8A and the above description.

Next, in a period t4, a low-level potential is applied to the wiring GLA, a low-level potential is applied to the wiring GLB, and a high-level potential is applied to the wiring GLC. Accordingly, the transistor 81 is turned on, and the transistors 82 to 85 are turned off.

In addition, the potential Vano is applied to the wiring VL, and the wiring ML is electrically connected to the monitor circuit.

By the above operation, a drain current Id of the transistor 80 flows not into the light-emitting element 86 but the wiring ML through the transistor 81. The monitor circuit generates a signal including data on the value of the drain current Id by using the drain current Id flowing through the wiring ML. Thus, using the above signal, the light-emitting device of one embodiment of the present invention can correct the value of the potential Vdata of the image signal Sig supplied to the pixel 11.

Note that in the light-emitting device including the pixel 11 illustrated in FIG. 7, the operation in the period t4 is not necessarily performed after the operation in the period t3. For example, in the light-emitting device, the operation in the period t4 may be performed after the operations in the periods t1 to t3 are repeated a plurality of times. Alternatively, after the operation in the period t4 is performed on pixels 11 in one row, the light-emitting elements 86 may be brought into a non-light-emitting state by writing an image signal corresponding to the lowest grayscale level 0 to the pixels 11 in the row which have been subjected to the above operation. Then, the operation in the period t4 may be performed on pixels 11 in the next row.

In the light-emitting device including the pixel 11 illustrated in FIG. 7, the other of the source and the drain of the transistor 80 is electrically isolated from the gate of the transistor 80, so that their potentials can be individually controlled. The potential of the other of the source and the drain of the transistor 80 can be thus set to a value higher than the sum of the potential of the gate of the transistor 80 and the threshold voltage Vth, in the period t2. Therefore, in the case where the transistor 80 is a normally-on transistor, in other words, in the case where the threshold voltage Vth of the transistor 80 is negative, charge can be accumulated in the capacitor 87 until the potential of the source of the transistor 80 becomes higher than the potential V1 of the gate. For these reasons, in the light-emitting device of one embodiment of the present invention, even when the transistor 80 is a normally-on transistor, the threshold voltage can be obtained in the period t2; and in the period t3, the gate voltage of the transistor 80 can be set to a value obtained by adding the threshold voltage Vth.

Therefore, in the pixel 11 illustrated in FIG. 7, display unevenness can be reduced and high-quality images can be displayed even if the transistor 80 including a semiconductor film containing an oxide semiconductor, for example, becomes a normally-on transistor.

Note that even when only external correction is performed and internal correction is not performed, not only variation in threshold voltage of the transistors 80 between the pixels 11 but also variation in other electrical characteristics, such as mobility, of the transistors 80 can be corrected. Note that in the case where internal correction is performed in addition to external correction, a negative shift or a positive shift of the threshold voltage is corrected by the internal correction. Thus, external correction may be performed to correct variation in electrical characteristics other than threshold voltage, such as mobility, of the transistor 80. Therefore, in the case where internal correction is performed in addition to external correction, the potential amplitude of a corrected image signal can be made smaller than in the case where only the external correction is performed. This can prevent a situation where the potential amplitude of the image signal is so large that there are large differences in potential of the image signal between different grayscale levels and it is difficult to express minute gradations of an image with luminance differences. Thus, a decrease in image quality can be prevented.

Configuration Example 4 of Pixel

Next, a specific configuration example of the pixel 11 which differs from that in FIG. 7 is described.

Figure 9:
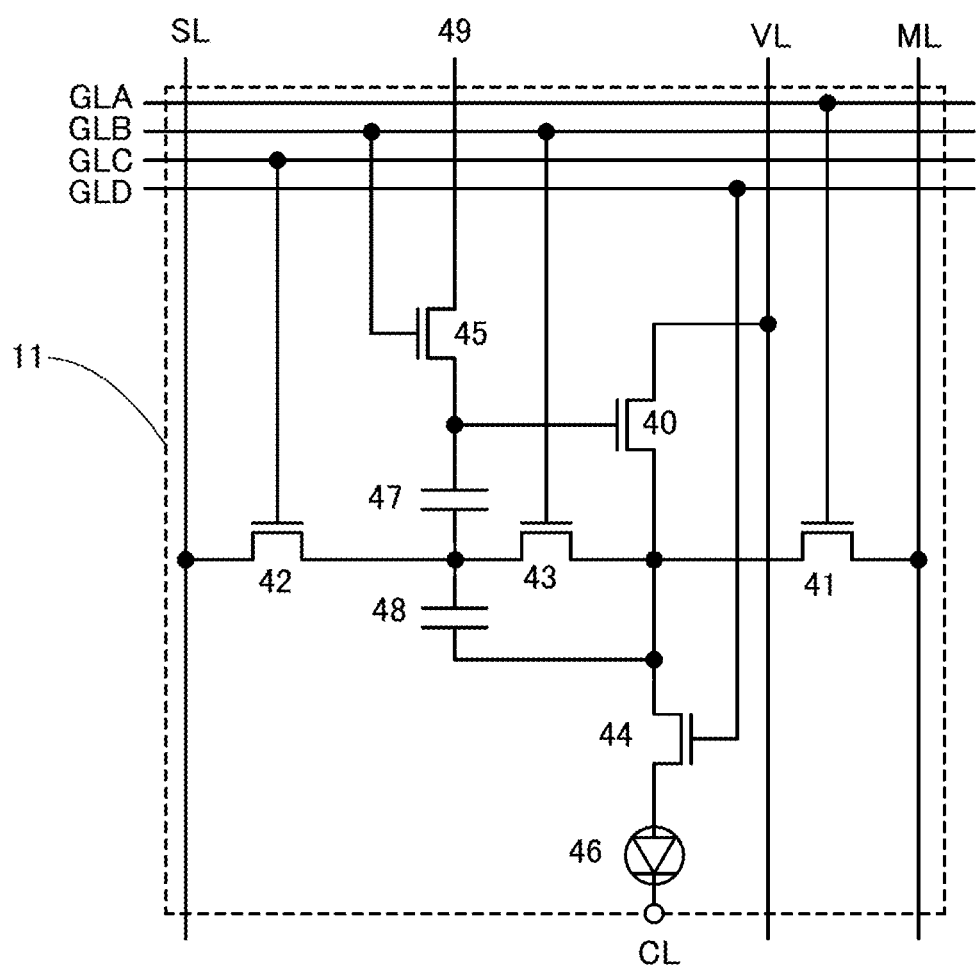
FIG. 9 illustrates a configuration of a pixel.

FIG. 9 illustrates another example of the circuit diagram of the pixel 11. The pixel 11 includes transistors 40 to 45, a light-emitting element 46, a capacitor 47, and a capacitor 48.

The potential of a pixel electrode of the light-emitting element 46 is controlled by an image signal Sig which is input to the pixel 11. The luminance of the light-emitting element 46 is determined by a potential difference between the pixel electrode and a common electrode. For example, in the case where an OLED is used as the light-emitting element 46, one of the anode and the cathode serves as the pixel electrode and the other thereof serves as the common electrode. FIG. 9 illustrates a configuration of the pixel 11 in which the anode of the light-emitting element 46 is used as the pixel electrode and the cathode of the light-emitting element 46 is used as the common electrode.

The transistor 42 has a function of controlling conduction between the wiring SL and one of a pair of electrodes of the capacitor 47. The other of the pair of electrodes of the capacitor 47 is electrically connected to a gate of the transistor 40. The transistor 45 has a function of controlling conduction between a wiring 49 and the gate of the transistor 40. The transistor 43 has a function of controlling conduction between the one of the pair of electrodes of the capacitor 47 and one of a source and a drain of the transistor 40. The transistor 44 has a function of controlling conduction between the one of the source and the drain of the transistor 40 and the anode of the light-emitting element 46. The transistor 41 has a function of controlling conduction between the wiring ML and the one of the source and the drain of the transistor 40. Furthermore, in FIG. 9, the other of the source and the drain of the transistor 40 is electrically connected to the wiring VL. One of a pair of electrodes of the capacitor 48 is electrically connected to the one of the pair of electrodes of the capacitor 47, and the other thereof is electrically connected to the one of the source and the drain of the transistor 40.

The switching of the transistor 42 is performed in accordance with the potential of a wiring GLC electrically connected to a gate of the transistor 42. The switching of the transistor 43 and the switching of the transistor 45 are controlled in accordance with the potential of a wiring GLB electrically connected to a gate of the transistor 43 and the potential thereof electrically connected to a gate of the transistor 45. The switching of the transistor 44 is controlled in accordance with the potential of a wiring GLD electrically connected to a gate of the transistor 44. The switching of the transistor 41 is controlled in accordance with the potential of a wiring GLA electrically connected to a gate of the transistor 41.

In the transistors included in the pixel 11, an oxide semiconductor or an amorphous, microcrystalline, polycrystalline, or single crystal semiconductor can be used. As a material of such a semiconductor, silicon, germanium, and the like can be given. When the transistor 45 includes an oxide semiconductor in a channel formation region, the off-state current of the transistor 45 can be extremely low. Furthermore, when the transistor 45 having the above-described structure is used in the pixel 11, leakage of electric charge accumulated in the gate of the transistor 40 can be prevented effectively as compared with the case where a transistor including a normal semiconductor such as silicon or germanium is used as the transistor 45.

Accordingly, for example, in the case where image signals Sig each having the same image data are written to the pixel portion for some consecutive frame periods as in the case of displaying a still image, display of an image can be maintained even when driving frequency is low, in other words, the number of operations of writing image signals Sig to the pixel portion for a certain period is reduced. For example, by using a highly purified oxide semiconductor for semiconductor films of the transistor 42, the interval between the operations of writing image signals Sig can be set to 10 seconds or longer, preferably 30 seconds or longer, or further preferably 1 minute or longer. As the interval between the operations of writing image signals Sig increases, power consumption can be further reduced.

In addition, since the potential of the image signal Sig can be held for a longer period, the quality of an image to be displayed can be prevented from being lowered even when the capacitor 47 for holding the potential of the gate of the transistor 40 is not provided in the pixel 11.

Note that in FIG. 9, the pixel 11 may further include another circuit element such as a transistor, a diode, a resistor, a capacitor, or an inductor as needed.

In FIG. 9, the transistors each have the gate on at least one side of a semiconductor film; alternatively, the transistors may each have a pair of gates with a semiconductor film provided therebetween.

The transistors in FIG. 9 are all n-channel transistors. When the transistors in the pixel 11 have the same channel type, it is possible to omit some of steps for fabricating the transistors, for example, a step of adding an impurity element imparting one conductivity type to the semiconductor film. Note that in the light-emitting device of one embodiment of the present invention, not all the transistors in the pixel 11 are necessarily n-channel transistors. In the case where the cathode of the light-emitting element 46 is electrically connected to a wiring CL, it is preferable that at least the transistor 40 be an n-channel transistor. In the case where the anode of the light-emitting element 46 is electrically connected to the wiring CL, it is preferable that at least the transistor 40 be a p-channel transistor.

FIG. 9 illustrates the case where the transistors in the pixel 11 have a single-gate structure including one gate and one channel formation region; however, one embodiment of the present invention is not limited to this structure. Any or all of the transistors in the pixel 11 may have a multi-gate structure including a plurality of gates electrically connected to each other and a plurality of channel formation regions.

Operation Example 4 of Pixel

Figure 10A:
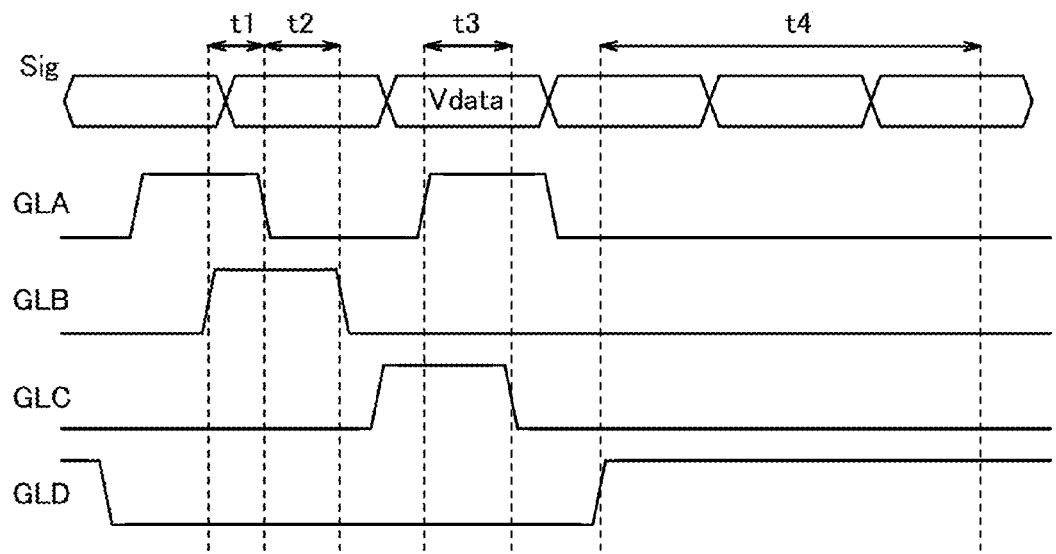
FIGS. 10A and 10B are each a timing chart illustrating the operation of the pixel.
Figure 10B:
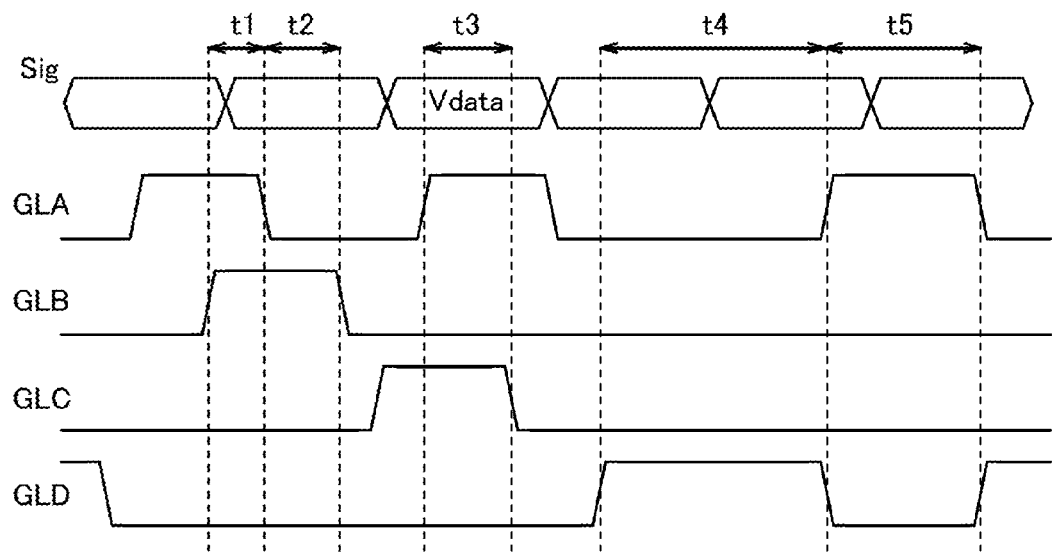

FIGS. 10A and 10B are each a timing chart of potentials of the wiring GLA to the wiring GLD, which are electrically connected to the pixel 11 illustrated in FIG. 9, and a potential of the image signal Sig applied to the wiring SL. Note that the timing charts illustrated in FIGS. 10A and 10B are each an example in which all the transistors included in the pixel 11 illustrated in FIG. 9 are n-channel transistors.

First, in a period t1, a high-level potential is applied to the wiring GLA, a high-level potential is applied to the wiring GLB, a low-level potential is applied to the wiring GLC, and a low-level potential is applied to the wiring GLD. Accordingly, the transistor 43, the transistor 45, and the transistor 41 are turned on, and the transistor 42 and the transistor 44 are turned off. By the above operation, a potential Vi2 of the wiring 49 is applied to the gate of the transistor 40, and a potential Vi1 of the wiring ML is applied to the one of the source and the drain of the transistor 40.

Note that the potential Vi1 is preferably lower than the sum of a potential Vcat and the threshold voltage Vthe of the light-emitting element 46. The potential Vi2 is preferably higher than the sum of the potential Vi1 and the threshold voltage Vth of the transistor 40. Accordingly, the gate voltage of the transistor 40 is Vi2−Vi1 and the transistor 40 is turned on.

The potential Vi1 is applied to the wiring VL, and the potential Vcat is applied to the wiring CL.

Next, in a period t2, a low-level potential is applied to the wiring GLA, a high-level potential is applied to the wiring GLB, a low-level potential is applied to the wiring GLC, and a low-level potential is applied to the wiring GLD. Accordingly, the transistor 43 and the transistor 45 are turned on, and the transistor 42, the transistor 44, and the transistor 41 are turned off. By the above operation, the potential Vi2 is held by the gate of the transistor 40. The potential Vi2 is applied to the wiring VL, and the potential Vcat is applied to the wiring CL.

By the above operation, electric charge in the capacitor 47 is released through the transistor 40 which is on, and the potential of the one of the source and the drain of the transistor 40, which is the potential Vi1, starts to rise. The potential of the one of the source and the drain of the transistor 40 finally converges to the potential Vi2−Vth and the gate voltage of the transistor 40 converges to the threshold voltage Vth of the transistor 40; then, the transistor 40 is turned off.

Note that in the pixel configuration illustrated in FIG. 9, even if the potential Vi2 is higher than the sum of the potential Vcat and the threshold voltage Vthe of the light-emitting element 46, the light-emitting element 46 does not emit light as long as the transistor 44 is off. Thus, the allowable potential Vi1 range can be expanded and the allowable range of Vi2−Vi1 can be increased. As a result of increasing the degree of freedom of values for Vi2−Vi1, the threshold voltage of the transistor 40 can be obtained accurately even when time required to obtain the threshold voltage of the transistor 40 is reduced or limited.

Next, in a period t3, a high-level potential is applied to the wiring GLA, a low-level potential is applied to the wiring GLB, a high-level potential is applied to the wiring GLC, and a low-level potential is applied to the wiring GLD. Accordingly, the transistor 42 and the transistor 41 are turned on, and the transistor 43, the transistor 44, and the transistor 45 are turned off. The potential Vdata of the image signal Sig is applied to the wiring SL, and is applied to the one of the pair of electrodes of the capacitor 47 through the transistor 42.

The transistor 45 is off and thus the gate of the transistor 40 is in a floating state. In addition, the threshold voltage Vth is held by the capacitor 47; therefore, when the potential Vdata is applied to the one of the pair of electrodes of the capacitor 47, the potential of the gate of the transistor 40 which is electrically connected to the other of the pair of electrodes of the capacitor 47 becomes Vdata+Vth in accordance with the principle of conservation of charge. Moreover, the potential Vi1 of the wiring ML is applied to the one of the source and drain of the transistor 40 through the transistor 41. The voltage Vdata−Vi1 is then applied to the capacitor 48 and the gate voltage of the transistor 40 becomes Vth+Vdata−Vi1.

During transition from the period t2 to the period t3, it is preferable that the potential applied to the wiring GLB be switched from high to low, and then, the potential applied to the wiring GLC be switched from low to high. The steps can prevent potential change of the gate of the transistor 40 due to the switching of the potential applied to the wiring GLC.

Next, in a period t4, a low-level potential is applied to the wiring GLA, a low-level potential is applied to the wiring GLB, a low-level potential is applied to the wiring GLC, and a high-level potential is applied to the wiring GLD. Accordingly, the transistor 44 is turned on, and the transistor 42, the transistor 43, the transistor 45, and the transistor 41 are turned off.

The potential Vi2 is applied to the wiring VL, and the potential Vcat is applied to the wiring CL.

By the above operation, the threshold voltage Vth and the voltage Vdata−Vi1 are held by the capacitor 47 and the capacitor 48, respectively; the potential of the anode of the light-emitting element 46 becomes the potential Ve1; the potential of the gate of the transistor 40 becomes the potential Vdata+Vth+Ve1−Vi1; and the gate voltage of the transistor 40 becomes Vdata+Vth−Vi1.

Note that the potential Ve1 is set when current flows into the light-emitting element 46 through the transistor 40. Specifically, the potential Ve1 is set to a potential between the potential Vi2 and the potential Vcat.

Accordingly, the gate voltage of the transistor 40 can have the value to which the threshold voltage Vth is added. With the steps, variation of the threshold voltages Vth of the transistor 40 can be reduced. Thus, variation of the value of current supplied to the light-emitting element 46 can be suppressed, whereby unevenness in luminance of the light-emitting device can be reduced.

Note that the potential applied to the wiring GLD is greatly changed here, whereby an influence of variation of threshold voltages of the transistor 44 on the value of current supplied to the light-emitting element 46 can be prevented. In other words, the high-level potential applied to the wiring GLD is much higher than the threshold voltage of the transistor 44, and the low-level potential applied to the wiring GLD is much lower than the threshold voltage of the transistor 44; thus, on/off switching of the transistor 44 is secured and the influence of variation of threshold voltages of the transistor 44 on the value of current supplied to the light-emitting element 46 can be prevented.

The above is the operation example of the pixel 11 including internal correction. Described below is an operation of the pixel 11 in the case where variation in luminance among the pixels 11 due to variation in threshold voltages is suppressed by external correction in addition to the internal correction.

Using the pixel 11 illustrated in FIG. 9 as an example, FIG. 10B is a timing chart of potentials input to the wirings GLA to GLD when both the internal correction and the external correction are performed, and a potential Vdata of the image signal Sig input to the wiring SL. Note that the timing chart illustrated in FIG. 10B is an example in which all the transistors included in the pixel 11 illustrated in FIG. 9 are n-channel transistors.

First, the pixel 11 operates from the period t1 to the period t4 according to the timing chart illustrated in FIG. 10A and the above description.

Next, in a period t5, a high-level potential is applied to the wiring GLA, a low-level potential is applied to the wiring GLB, a low-level potential is applied to the wiring GLC, and a low-level potential is applied to the wiring GLD. Accordingly, the transistor 41 is turned on, and the transistor 45, the transistor 42, the transistor 43, and the transistor 44 are turned off.

In addition, the potential Vi2 is applied to the wiring VL, and the wiring ML is electrically connected to the monitor circuit.

By the above operation, a drain current Id of the transistor 40 flows not into the light-emitting element 46 but the wiring ML through the transistor 41. The monitor circuit generates a signal including data on the value of the drain current Id by using the drain current Id flowing through the wiring ML. Thus, using the above signal, the light-emitting device of one embodiment of the present invention can correct the value of the potential Vdata of the image signal Sig supplied to the pixel 11.

Note that in the light-emitting device including the pixel 11 illustrated in FIG. 9, the operation in the period t5 is not necessarily performed after the operation in the period t4. For example, in the light-emitting device, the operation in the period t5 may be performed after the operations in the periods t1 to t4 are repeated a plurality of times. Alternatively, after the operation in the period t5 is performed on pixels 11 in one row, the light-emitting elements 46 may be brought into a non-light-emitting state by writing an image signal corresponding to the lowest grayscale level 0 to the pixels 11 in the row which have been subjected to the above operation. Then, the operation in the period t5 may be performed on pixels 11 in the next row.

In the light-emitting device including the pixel 11 illustrated in FIG. 9, the other of the source and the drain of the transistor 40 is electrically isolated from the gate of the transistor 40, so that their potentials can be individually controlled. The potential of the other of the source and the drain of the transistor 40 can be thus set to a value higher than the sum of the potential of the gate of the transistor 40 and the threshold voltage Vth, in the period t2. Therefore, in the case where the transistor 40 is a normally-on transistor, in other words, in the case where the threshold voltage Vth of the transistor 40 is negative, electric charge can be accumulated in the capacitor 47 until the potential of the source of the transistor 40 becomes higher than the potential of the gate.

For these reasons, in the light-emitting device of one embodiment of the present invention, even when the transistor 40 is a normally-on transistor, the threshold voltage can be obtained in the period t2; and in the period t4, the gate voltage of the transistor 40 can be set to a value obtained by adding the threshold voltage Vth.

Therefore, in the light-emitting device of one embodiment of the present invention, display unevenness can be reduced and high-quality images can be displayed even if the transistor 40 including a semiconductor film containing an oxide semiconductor, for example, becomes a normally-on transistor.

Note that even when only external correction is performed and internal correction is not performed, not only variation in threshold voltage of the transistors 40 between the pixels 11 but also variation in other electrical characteristics, such as mobility, of the transistors 40 can be corrected. Note that in the case where internal correction is performed in addition to external correction, a negative shift or a positive shift of the threshold voltage is corrected by the internal correction. Thus, external correction may be performed to correct variation in electrical characteristics other than threshold voltage, such as mobility, of the transistor 40. Therefore, in the case where internal correction is performed in addition to external correction, the potential amplitude of a corrected image signal can be made smaller than in the case where only the external correction is performed. This can prevent a situation where the potential amplitude of the image signal is so large that there are large differences in potential of the image signal between different grayscale levels and it is difficult to express minute gradations of an image with luminance differences. Thus, a decrease in image quality can be prevented.

Configuration Example of Monitor Circuit

Figure 11:
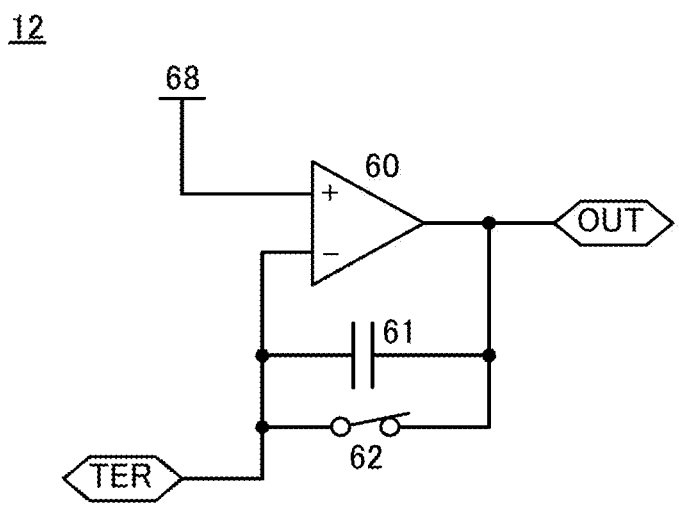
FIG. 11 is a circuit diagram of a monitor circuit.

Next, a configuration example of the monitor circuit 12 is illustrated in FIG. 11. The monitor circuit 12 illustrated in FIG. 11 includes an operational amplifier 60, a capacitor 61, and a switch 62.

One of a pair of electrodes of the capacitor 61 is electrically connected to an inverting input terminal (−) of the operational amplifier 60, and the other of the pair of electrodes of the capacitor 61 is electrically connected to an output terminal of the operation amplifier 60. The switch 62 has a function of releasing electric charge accumulated in the capacitor 61, and specifically has a function of controlling conduction between the pair of electrodes of the capacitor 61. A non-inverting input terminal (+) of the operational amplifier 60 is electrically connected to a wiring 68, and the potential Vano is applied to the wiring 68.

Note that in the case where the pixel 11 illustrated in FIG. 7 operates in accordance with the timing chart illustrated in FIG. 8B, the potential Vano or the potential V0 is applied to the wiring 68. In addition, in the case where the pixel 11 illustrated in FIG. 9 operates in accordance with the timing chart illustrated in FIG. 10B, the potential Vano or the potential Vi1 is applied to the wiring 68.

When current is extracted from the pixel 11 through the wiring ML in order to perform external correction, the monitor circuit 12 functions as a voltage follower, thereby applying the potential Vano to the wiring ML, and then the monitor circuit 12 functions as an integrator circuit, thereby converting the current extracted from the pixel 11 into voltage. Specifically, by turning on the switch 62, the potential Vano applied to the wiring 68 is applied to the wiring ML through the monitor circuit 12, and then the switch 62 is turned off. When the switch 62 is in an off state and the drain current extracted from the pixel 11 is supplied to the wiring TER, electric charge is accumulated in the capacitor 61, so that a voltage is generated between the pair of electrodes of the capacitor 61. The voltage is proportional to the total amount of drain current supplied to the wiring TER; therefore, a potential corresponding to the total amount of the drain current in a predetermined period is applied to a wiring OUT electrically connected to the output terminal of the operational amplifier 60.

In addition, the monitor circuit 12 functions as a voltage follower when the potential V0 is applied to the wiring ML of the pixel 11 in order to perform internal correction in the pixel 11 illustrated in FIG. 7. Specifically, by turning on the switch 62, the potential V0 applied to the wiring 68 can be applied to the wiring ML through the monitor circuit 12.

Moreover, the monitor circuit 12 functions as a voltage follower when the potential Vi1 is applied to the wiring ML of the pixel 11 in order to perform internal correction in the pixel 11 illustrated in FIG. 9. Specifically, by turning on the switch 62, the potential Vi1 applied to the wiring 68 can be applied to the wiring ML through the monitor circuit 12.

Note that in the pixel 11 illustrated in FIG. 7, the potential V0 is applied to the wiring ML in the case of internal correction, and the potential Vano is applied to the wiring ML in the case of external correction. The switching of the potential applied to the wiring ML can be performed by switching the potential applied to the wiring 68 of the monitor circuit 12 between the potential Vano and the potential V0. Moreover, in the pixel 11 illustrated in FIG. 9, the potential Vi1 is applied to the wiring ML in the case of internal correction, and the potential Vano is applied to the wiring ML in the case of external correction. The switching of the potential applied to the wiring ML can be performed by switching the potential applied to the wiring 68 of the monitor circuit 12 between the potential Vano and the potential Vi1.

In addition, in the case where the wiring 33 is electrically connected to the wiring ML in the circuit 21 illustrated in FIG. 4, the potential V0 or the potential Vi1 may be applied to the wiring 33. In that case, the potential V0 or the potential Vi1 of the wiring 33 can be applied to the wiring ML in the case of internal correction, and the potential Vano can be applied from the monitor circuit 12 to the wiring ML through the wiring TER in the case of external correction. Here, the potential Vano may be applied to the wiring 68 of the monitor circuit 12 without being switched to another potential.

Specific Structure Example 2 of Light-Emitting Device

In the light-emitting device 10 illustrated in FIG. 1, an image may be corrected only by internal correction without external correction. FIG. 12, FIG. 13, and FIGS. 14A and 14B illustrate configuration examples of the pixel in that case.

Figure 12:
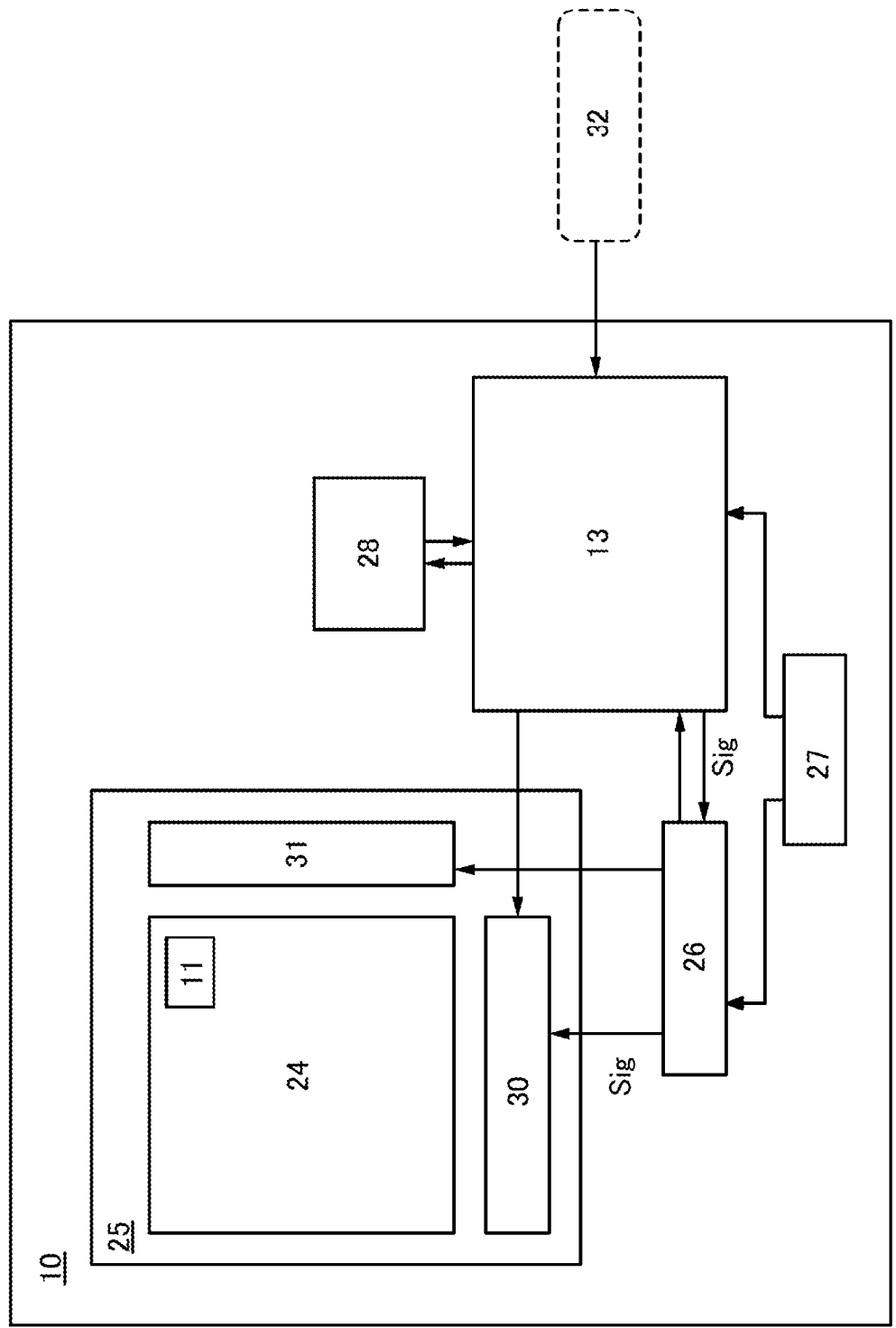
FIG. 12 illustrates a structure of a light-emitting device.

For example, in the case where only internal correction is performed in the light-emitting device 10, the monitor circuit 12 and the memory 29 illustrated in FIG. 1 are not necessary. FIG. 12 illustrates an example of such a case. As for the components in FIG. 12, the description of FIG. 1 can be referred to.

Figure 13:
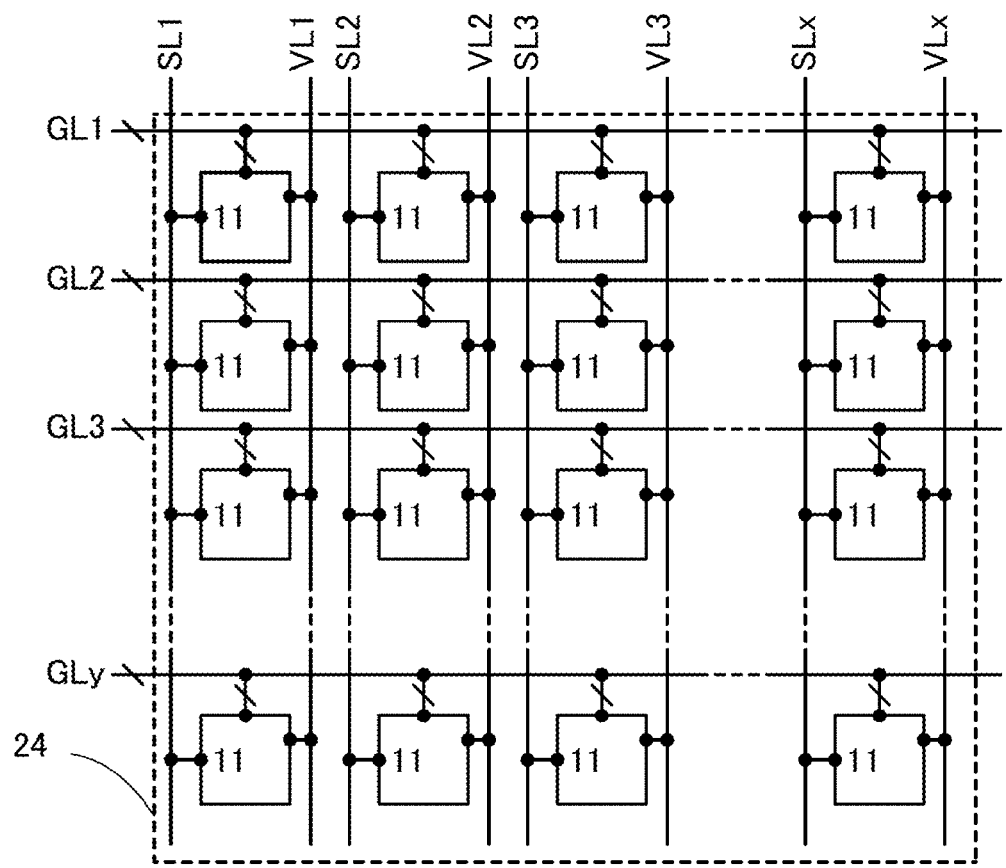
FIG. 13 illustrates a structure of a pixel portion.

For example, in the case where only internal correction is performed in the light-emitting device 10, the circuit 21 and the like illustrated in FIG. 4 are not necessary. FIG. 13 illustrates an example of such a case. As for the components in FIG. 13, the description of FIG. 4 can be referred to.

Configuration Example 5 of Pixel

Figure 14A:
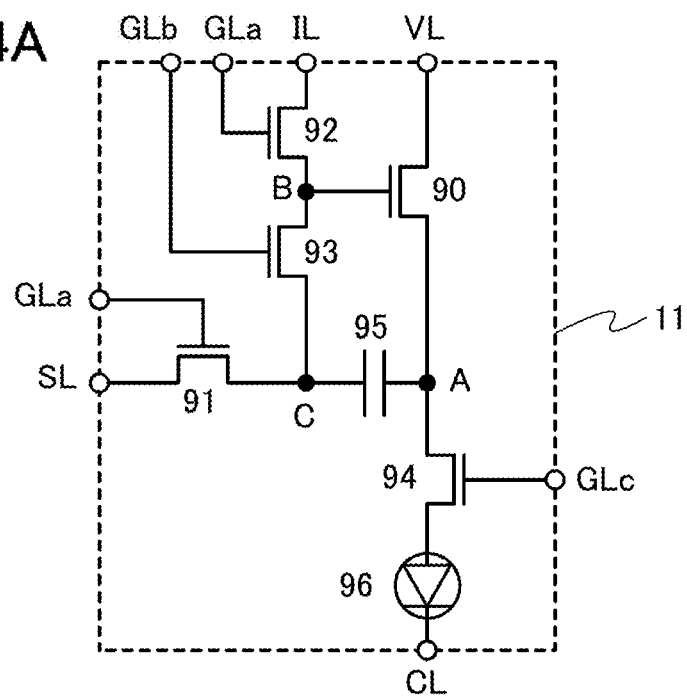
FIGS. 14A and 14B each illustrate a configuration of a pixel.

FIG. 14A illustrates a configuration example of the pixel 11 included in the light-emitting device of one embodiment of the present invention.

The pixel 11 includes transistors 90 to 94, a capacitor 95, and a light-emitting element 96. FIG. 14A illustrates the case where the transistors 90 to 94 are n-channel transistors.

The transistor 91 has a function of selecting conduction or non-conduction between the wiring SL and one of a pair of electrodes of the capacitor 95. The other of the pair of electrodes of the capacitor 95 is electrically connected to one of a source and a drain of the transistor 90. The transistor 92 has a function of selecting conduction or non-conduction between a wiring IL and a gate of the transistor 90. The transistor 93 has a function of selecting conduction or non-conduction between the one of the pair of electrodes of the capacitor 95 and the gate of the transistor 90. The transistor 94 has a function of selecting conduction or non-conduction between the one of the source and the drain of the transistor 90 and an anode of the light-emitting element 96. A cathode of the light-emitting element 96 is electrically connected to a wiring CL.

Furthermore, in FIG. 14A, the other of the source and the drain of the transistor 90 is electrically connected to a wiring VL.

Selection of conduction or non-conduction of the transistor 91 is determined by the potential of a wiring GLa electrically connected to a gate of the transistor 91. Selection of conduction or non-conduction of the transistor 92 is determined by the potential of a wiring GLa electrically connected to a gate of the transistor 92. Selection of conduction or non-conduction of the transistor 93 is determined by the potential of a wiring GLb electrically connected to a gate of the transistor 93. Selection of conduction or non-conduction of the transistor 94 is determined by the potential of a wiring GLc electrically connected to a gate of the transistor 94.

Figure 14B:
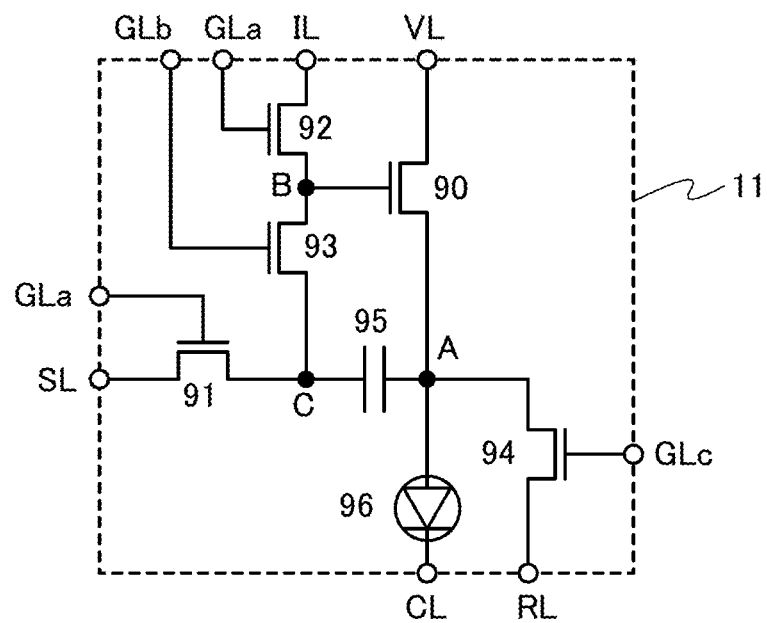

Next, FIG. 14B illustrates another configuration example of the pixel 11 included in the light-emitting device of one embodiment of the present invention.

The pixel 11 includes the transistors 90 to 93, a transistor 94, the capacitor 95, and a light-emitting element 96. FIG. 14B illustrates the case where the transistors 90 to 94 are n-channel transistors.

The transistor 91 has a function of selecting conduction or non-conduction between the wiring SL and the one of the pair of electrodes of the capacitor 95. The other of the pair of electrodes of the capacitor 95 is electrically connected to the one of the source and the drain of the transistor 90 and the anode of the light-emitting element 96. The transistor 92 has a function of selecting conduction or non-conduction between the wiring IL and the gate of the transistor 90. The transistor 93 has a function of selecting conduction or non-conduction between the one of the pair of electrodes of the capacitor 95 and the gate of the transistor 90. The transistor 94 has a function of selecting conduction or non-conduction between the one of the source and the drain of the transistor 90 and an anode of the light-emitting element 96. The other of the source and the drain of the transistor 90 is electrically connected to the wiring VL.

Selection of conduction or non-conduction of the transistor 91 is determined by the potential of the wiring GLa electrically connected to the gate of the transistor 91. Selection of conduction or non-conduction of the transistor 92 is determined by the potential of the wiring GLa electrically connected to the gate of the transistor 92. Selection of conduction or non-conduction of the transistor 93 is determined by the potential of a wiring GLb electrically connected to the gate of the transistor 93. Selection of conduction or non-conduction of the transistor 94 is determined by the potential of the wiring GLc electrically connected to a gate of the transistor 94.

In FIGS. 14A and 14B, the transistors 90 to 94 each have the gate on at least one side of a semiconductor film; alternatively, the transistors may each have a pair of gates with a semiconductor film provided therebetween.

FIGS. 14A and 14B each illustrate the case where all the transistors 90 to 94 are n-channel transistors. When all the transistors 90 to 94 in the pixel 11 have the same polarity, it is possible to omit some of steps for fabricating the transistors, for example, a step of adding an impurity element imparting one conductivity type to the semiconductor film. Note that in the light-emitting device of one embodiment of the present invention, not all the transistors 90 to 94 are necessarily n-channel transistors. At least the transistor 90 is preferably an n-channel transistor when the anode of the light-emitting element 96 is electrically connected to one of a source and a drain of the transistor 94, whereas at least the transistor 90 is preferably a p-channel transistor when a cathode of the light-emitting element 96 is electrically connected to the one of the source and the drain of the transistor 94. In that case, the anode of the light-emitting element 96 is electrically connected to the wiring CL.

In the case where the transistor 90 operates in a saturation region to pass a current therethrough, its channel length or channel width is preferably larger than those of the transistors 91 to 94. When the channel length or the channel width is increased, characteristics in a saturation region have a flat slope; accordingly, a kink effect can be reduced. Alternatively, the increase in the channel length or the channel width allows a large amount of current to flow through the transistor 90 even in the saturation region.

FIGS. 14A and 14B each illustrate the case where the transistors 90 to 94 have a single-gate structure including one gate and one channel formation region; however, one embodiment of the present invention is not limited to this structure. Any or all of the transistors 90 to 94 may have a multi-gate structure including a plurality of gates electrically connected to each other and a plurality of channel formation regions.

Operation Example 5 of Pixel

Next, an example of operation of the pixel 11 illustrated in FIG. 14A is described.

Figure 15A:
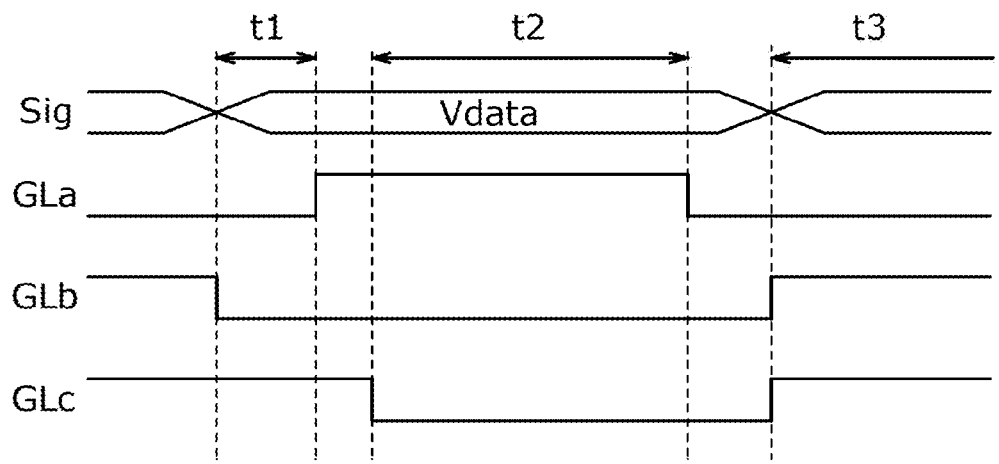
FIGS. 15A and 15B are each a timing chart illustrating the operation of the pixel.

FIG. 15A is a timing chart of potentials of the wiring GLa to the wiring GLc, which are electrically connected to the pixel 11 illustrated in FIG. 14A, and a potential of the image signal Sig applied to the wiring SL. Note that the timing chart illustrated in FIG. 15A is an example in which the transistors 90 to 94 are n-channel transistors. As illustrated in FIG. 15A, the operation of the pixel 11 in FIG. 14A can be mainly divided into a first operation in a period t1, a second operation in a period t2, and a third operation in a period t3.

First, the first operation in the period t1 is described. In the period t1, a low-level potential is applied to the wiring GLa, a low-level potential is applied to the wiring GLb, and a high-level potential is applied to the wiring GLc. Accordingly, the transistor 94 is turned on, and the transistors 91 to 93 are turned off.

A potential Vano is applied to the wiring VL, and a potential Vcat is applied to the wiring CL. The potential Vano is higher than the sum of the threshold voltage Vthe of the light-emitting element 96 and the potential Vcat. Note that the threshold voltage Vthe of the light-emitting element 96 is assumed to be 0 V in the following description.

In the period t1, by the above operation, the potential of the one of the source and the drain of the transistor 90 (illustrated as a node A) becomes the sum of the potential Vcat and the threshold voltage Vthe of the light-emitting element 96. In the following description, the potential of the node A becomes the potential Vcat when the threshold voltage Vthe is assumed to be 0 V.

Next, the second operation in the period t2 is described. In the period t2, a high-level potential is applied to the wiring GLa, a low-level potential is applied to the wiring GLb, and a low-level potential is applied to the wiring GLc. Accordingly, the transistor 91 and the transistor 92 are turned on, and the transistor 93 and the transistor 94 are turned off.

During transition from the period t1 to the period t2, it is preferable that the potential applied to the wiring GLa be switched from low to high, and then, the potential applied to the wiring GLc be switched from high to low. The steps can prevent potential change of the node A due to the switching of the potential applied to the wiring GLa.

The potential Vano is applied to the wiring VL, and the potential Vcat is applied to the wiring CL. A potential V0 is applied to the wiring IL, and a potential Vdata of the image signal Sig is applied to the wiring SL. Note that the potential V0 is preferably higher than the sum of the potential Vcat, the threshold voltage Vth of the transistor 90, and the threshold voltage Vthe of the light-emitting element 96 and lower than the sum of the potential Vano and the threshold voltage Vth of the transistor 90.

In the period t2, the transistor 90 is turned on because the potential V0 is applied to the gate of the transistor 90 (illustrated as a node B) by the above operation. Thus, electric charge in the capacitor 95 is released through the transistor 90, and the potential of the node A, which is the potential Vcat, starts to increase. Then, the potential of the node A finally reaches the potential V0−Vth, that is, the gate voltage of the transistor 90 is decreased to the threshold voltage Vth; then, the transistor 90 is turned off. The potential Vdata is applied to the one of the pair of electrodes of the capacitor 95 (illustrated as a node C).

Next, the third operation in the period t3 is described. In the period t3, a low-level potential is applied to the wiring GLa, a high-level potential is applied to the wiring GLb, and a high-level potential is applied to the wiring GLc. Accordingly, the transistor 93 and the transistor 94 are turned on, and the transistor 91 and the transistor 92 are turned off.

During transition from the period t2 to the period t3, it is preferable that the potential applied to the wiring GLa be switched from high to low, and then, the potentials applied to the wirings GLb and GLc be each switched from low to high. The steps can prevent potential change of the node A due to the switching of the potential applied to the wiring GLa.

The potential Vano is applied to the wiring VL, and the potential Vcat is applied to the wiring CL.

In the period t3, the potential Vdata is applied to the node B by the above operation; thus, the gate voltage of the transistor 90 becomes Vdata−V0+Vth. Accordingly, the gate voltage of the transistor 90 can have the value to which the threshold voltage Vth is added. The steps can prevent variation in the threshold voltage Vth of the transistors 90 from adversely affecting the value of current supplied to the light-emitting element 96. Alternatively, even if the transistor 90 deteriorates and the threshold voltage Vth is changed, the change in the threshold voltage Vth can be prevented from adversely affecting the value of current supplied to the light-emitting element 96. Therefore, display unevenness can be reduced, and high-quality images can be displayed.

Next, an example of operation of the pixel 11 illustrated in FIG. 14B is described.

Figure 15B:
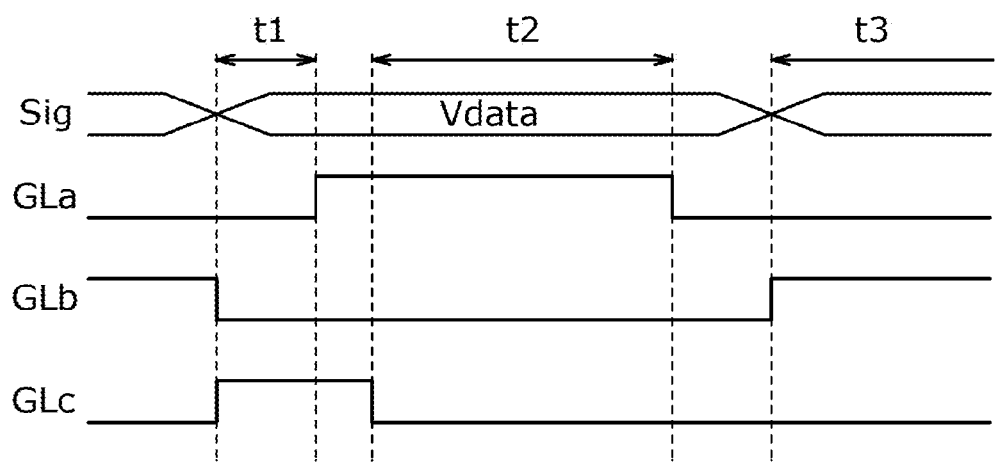

FIG. 15B is a timing chart of potentials of the wiring GLa to the wiring GLc, which are electrically connected to the pixel 11 illustrated in FIG. 14B, and the potential Vdata applied to the wiring SL. Note that the timing chart illustrated in FIG. 15B is an example in which the transistors 90 to 94 are n-channel transistors. As illustrated in FIG. 15B, the operation of the pixel 11 in FIG. 14B can be mainly divided into a first operation in a period t1, a second operation in a period t2, and a third operation in a period t3.

First, the first operation in the period t1 is described. In the period t1, a low-level potential is applied to the wiring GLa, a low-level potential is applied to the wiring GLb, and a high-level potential is applied to the wiring GLc. Accordingly, the transistor 94 is turned on, and the transistors 91 to 93 are turned off.

The potential Vano is applied to the wiring VL, and the potential Vcat is applied to the wiring CL. As described above, the potential Vano is preferably higher than the sum of the threshold voltage Vthe of the light-emitting element 96 and the potential Vcat. Furthermore, a potential V1 is applied to the wiring RL. The potential V1 is preferably lower than the sum of the potential Vcat and the threshold voltage Vthe of the light-emitting element 96. With the potential V1 set to the value in the above range, current can be prevented from flowing through the light-emitting element 96 in the period t1.

In the period t1, the potential V1 is applied to the one of the source and the drain of the transistor 90 (illustrated as the node A) by the above operation.

Next, the second operation in the period t2 is described. In the period t2, a high-level potential is applied to the wiring GLa, a low-level potential is applied to the wiring GLb, and a low-level potential is applied to the wiring GLc. Accordingly, the transistor 91 and the transistor 92 are turned on, and the transistor 93 and the transistor 94 are turned off.

During transition from the period t1 to the period t2, it is preferable that the potential applied to the wiring GLa be switched from low to high, and then, the potential applied to the wiring GLc be switched from high to low. The steps can prevent potential change of the node A due to the switching of the potential applied to the wiring GLa.

The potential Vano is applied to the wiring VL, and the potential Vcat is applied to the wiring CL. The potential V0 is applied to the wiring IL, and the potential Vdata of the image signal Sig is applied to the wiring SL. Note that as described above, the potential V0 is preferably higher than the sum of the potential Vcat, the threshold voltage Vth of the transistor 90, and the threshold voltage Vthe of the light-emitting element 96 and lower than the sum of the potential Vano and the threshold voltage Vth of the transistor 90. Note that unlike in the pixel 11 illustrated in FIG. 14A, the anode of the light-emitting element 96 is electrically connected to the one of the source and the drain of the transistor 90 in the pixel 11 illustrated in FIG. 14B. Accordingly, the potential V0 in the pixel 11 illustrated in FIG. 14B is preferably set to a value lower than that in the pixel 11 illustrated in FIG. 14A in order not to increase the value of current supplied to the light-emitting element 96 in the period t2.

In the period t2, the transistor 90 is turned on because the potential V0 is applied to the gate of the transistor 90 (illustrated as the node B) by the above operation. Thus, electric charge in the capacitor 95 is released through the transistor 90, and the potential of the node A, which is the potential V1, starts to increase. Then, the potential of the node A finally reaches the potential V0−Vth, that is, the gate voltage of the transistor 90 is decreased to the threshold voltage Vth; then, the transistor 90 is turned off. The potential Vdata is applied to the one of the pair of electrodes of the capacitor 95 (illustrated as the node C).

Next, the third operation in the period t3 is described. In the period t3, a low-level potential is applied to the wiring GLa, a high-level potential is applied to the wiring GLb, and a low-level potential is applied to the wiring GLc. Accordingly, the transistor 93 is turned on, and the transistor 91, the transistor 92, and the transistor 94 are turned off.

During transition from the period t2 to the period t3, it is preferable that the potential applied to the wiring GLa be switched from high to low, and then, the potential applied to the wiring GLb be switched from low to high. The steps can prevent potential change of the node A due to the switching of the potential applied to the wiring GLa.

The potential Vano is applied to the wiring VL, and the potential Vcat is applied to the wiring CL.

In the period t3, the potential Vdata is applied to the node B by the above operation; thus, the gate voltage of the transistor 90 becomes Vdata−V0+Vth. Accordingly, the gate voltage of the transistor 90 can have the value to which the threshold voltage Vth is added. The steps can prevent variation in the threshold voltage Vth of the transistors 90 from adversely affecting the value of current supplied to the light-emitting element 96. Alternatively, even if the transistor 90 deteriorates and the threshold voltage Vth is changed, the change in the threshold voltage Vth can be prevented from adversely affecting the value of current supplied to the light-emitting element 96. Therefore, display unevenness can be reduced, and high-quality images can be displayed.

In the light-emitting device of one embodiment of the present invention including the pixel 11 illustrated in FIGS. 14A and 14B, the other of the source and the drain of the transistor 90 is electrically isolated from the gate of the transistor 90, so that their potentials can be individually controlled. The potential of the other of the source and the drain of the transistor 90 can be thus set to a value higher than the sum of the potential of the gate of the transistor 90 and the threshold voltage Vth, in the second operation. Therefore, in the case where the transistor 90 is a normally-on transistor, in other words, in the case where the threshold voltage Vth of the transistor 90 is negative, charge can be accumulated in the capacitor 95 until the potential of the source of the transistor 90 becomes higher than the potential V0 of the gate. For these reasons, in the light-emitting device of one embodiment of the present invention, even when the transistor 90 is a normally-on transistor, the threshold voltage can be obtained in the period t2; and in the third operation, the gate voltage of the transistor 90 can be set to a value obtained by adding the threshold voltage Vth.

Therefore, in the light-emitting device of one embodiment of the present invention, display unevenness can be reduced and high-quality images can be displayed even if the transistor 90 including a semiconductor film containing an oxide semiconductor, for example, becomes a normally-on transistor.

The structure described above in this embodiment can be combined as appropriate with any of the structures described in the other embodiments.

Embodiment 2

In this embodiment, a transistor including an oxide semiconductor that can be used for the pixel portion and the driver circuit of the light-emitting device of one embodiment of the present invention will be described.

Structure Example 1 of Transistor

As examples of the transistor included in the light-emitting device, top-gate transistors are illustrated in FIGS. 16A and 16B and 17A and 17B.

Figure 16A:
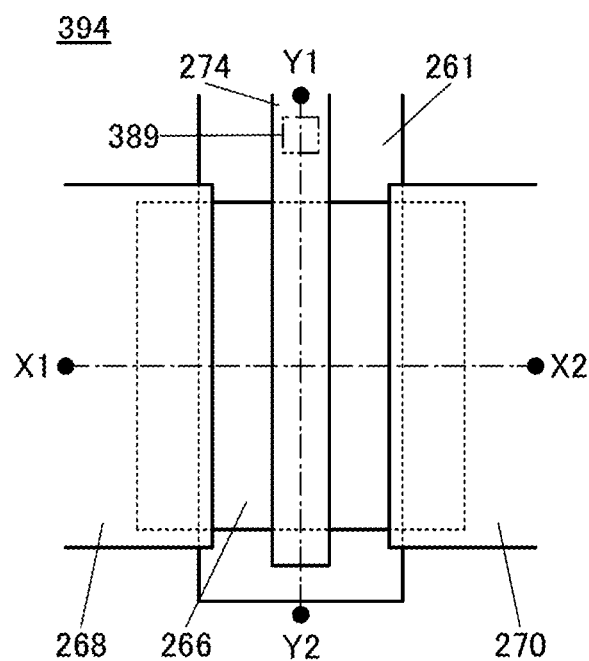
FIGS. 16A and 16B are each a top view of a transistor.
Figure 16B:
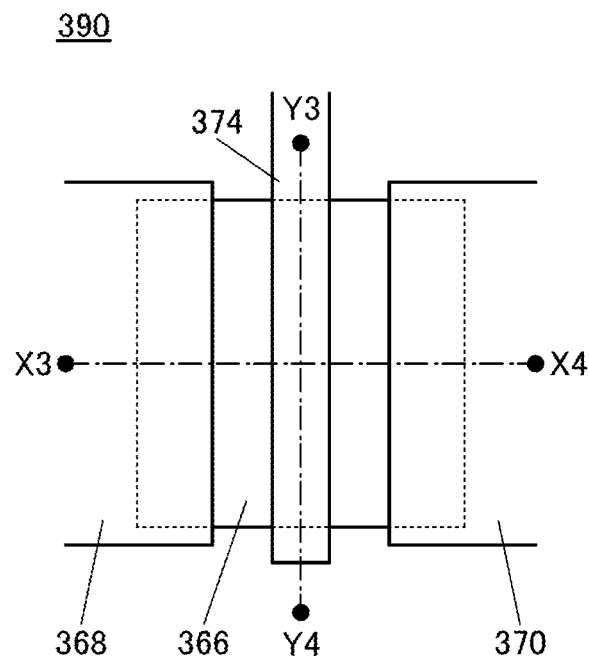
Figure 17A:
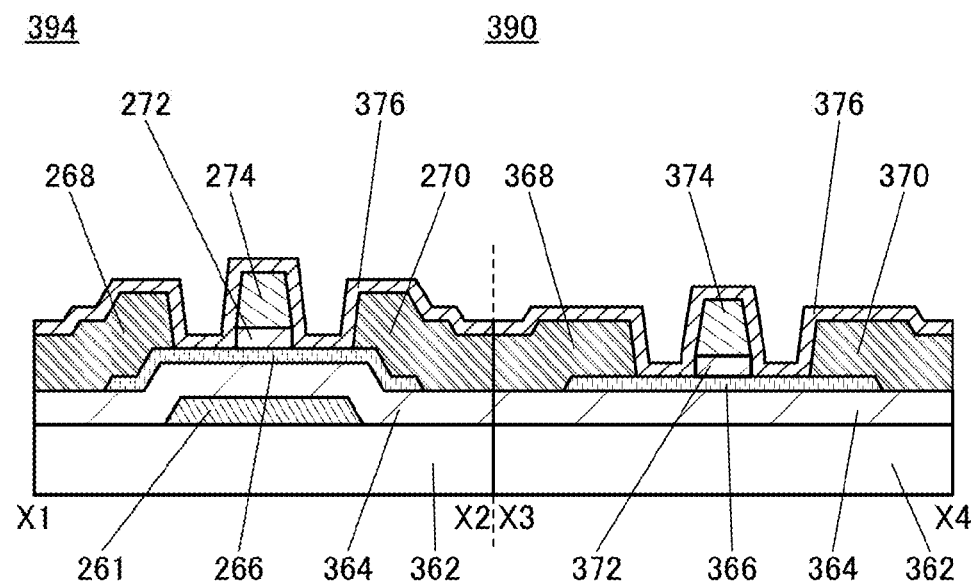
FIGS. 17A and 17B are each a cross-sectional view of the transistor.
Figure 17B:
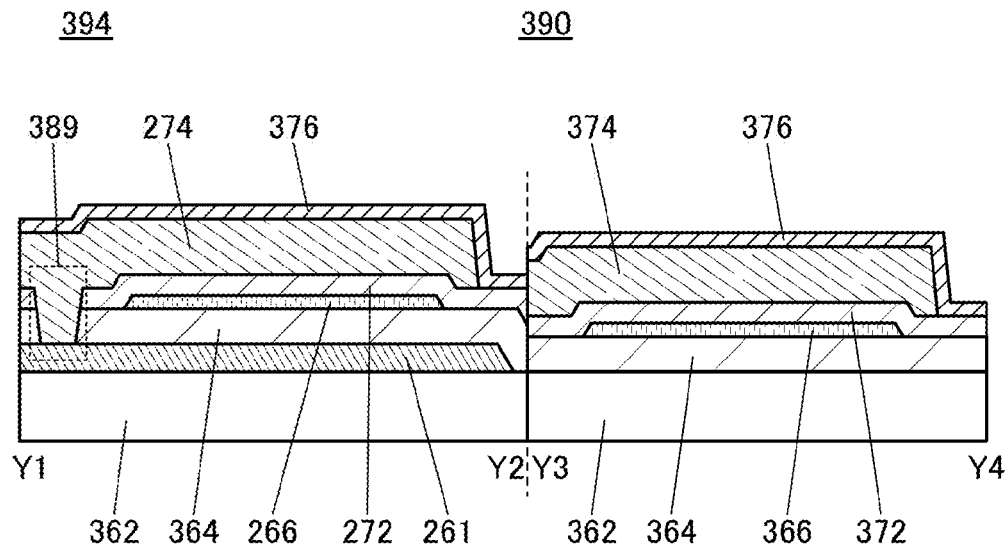

FIGS. 16A and 16B are top views of a transistor 394 provided in the driver circuit and a transistor 390 provided in the pixel portion, and FIGS. 17A and 17B are cross-sectional views of the transistor 394 and the transistor 390. FIG. 16A is the top view of the transistor 394, and FIG. 16B is the top view of the transistor 390. FIG. 17A is the cross-sectional view taken along dashed-dotted line X1-X2 in FIG. 16A and dashed-dotted line X3-X4 in FIG. 16B. FIG. 17B is the cross-sectional view taken along dashed-dotted line Y1-Y2 in FIG. 16A and dashed-dotted line Y3-Y4 in FIG. 16B. Moreover, FIG. 17A is the cross-sectional view of the transistor 390 and the transistor 394 each in the channel length direction. FIG. 17B is the cross-sectional view of the transistor 390 and the transistor 394 each in the channel width direction.

In a manner similar to those of the transistor 394 and the transistor 390, some components are not illustrated in some cases in top views of transistors described below. Furthermore, the directions of the dashed-dotted line X1-X2 and the dashed-dotted line X3-X4 may be called a channel length direction, and the direction of the dashed-dotted line Y1-Y2 and the dashed-dotted line Y3-Y4 may be called a channel width direction.

The transistor 390 illustrated in FIGS. 17A and 17B includes an oxide semiconductor film 366 over an insulating film 364 formed over a substrate 362, conductive films 368 and 370 and an insulating film 372 which are in contact with the oxide semiconductor film 366, and a conductive film 374 overlapping with the oxide semiconductor film 366 with the insulating film 372 provided therebetween. Note that an insulating film 376 is provided over the transistor 390.

The transistor 394 illustrated in FIGS. 17A and 17B includes a conductive film 261 formed over the substrate 362, the insulating film 364 over the conductive film 261, an oxide semiconductor film 266 over the insulating film 364, conductive films 268 and 270 and an insulating film 272 which are in contact with the oxide semiconductor film 266, and a conductive film 274 overlapping with the oxide semiconductor film 266 with the insulating film 272 provided therebetween. Note that the insulating film 376 is provided over the transistor 394.

The transistor 394 includes the conductive film 261 overlapping with the oxide semiconductor film 266 with the insulating film 364 provided therebetween. In other words, the conductive film 261 functions as a gate electrode. The transistor 394 is a dual-gate transistor. The other structures are the same as those of the transistor 390 and the effect similar to that in the case of the transistor 390 can be obtained.

The threshold voltage of the transistor 394 can be controlled by applying different potentials to the conductive film 274 and the conductive film 261 without electrical connection therebetween. On the other hand, as illustrated in FIG. 17B, by electrically connecting the conductive film 274 and the conductive film 261 and applying the same potentials thereto, an on-state current can be increased, variations in the initial characteristics can be reduced, and degradation of the transistor 394 due to the −GBT stress test and a change in the rising voltage of the on-state current at different drain voltages can be suppressed.

In the light-emitting device of one embodiment of the present invention, the structure of the transistor in the driver circuit differs from that in the pixel portion. The transistor included in the driver circuit is a dual-gate transistor. That is, the transistor included in the driver circuit has a higher on-state current than that included in the pixel portion.

Like the transistor 70 illustrated in FIG. 5, a dual-gate transistor can be employed for some transistors used in the pixel portion so as to correct the threshold voltages of the transistors.

In addition, in the light-emitting device, the transistor in the driver circuit and the transistor in the pixel portion may have different channel lengths.

Typically, the channel length of the transistor 394 included in the driver circuit can be set to be less than 2.5 µm, or greater than or equal to 1.45 µm and less than or equal to 2.2 µm. On the other hand, the channel length of the transistor 390 included in the pixel portion can be set to be greater than or equal to 2.5 µm, or greater than or equal to 2.5 µm and less than or equal to 20 µm.

When the channel length of the transistor 394 included in the driver circuit is set to be less than 2.5 µm, or preferably greater than or equal to 1.45 µm and less than or equal to 2.2 µm, the on-state current can be increased as compared with the transistor 390 included in the pixel portion. Consequently, a driver circuit capable of high-speed operation can be obtained.

Regions of the oxide semiconductor film 366 not overlapping with the conductive films 368 and 370 and the conductive film 374 each include an element which forms an oxygen vacancy. In addition, regions of the oxide semiconductor film 266 not overlapping with the conductive films 268 and 270 and the conductive film 274 each include an element which forms an oxygen vacancy. The element which forms oxygen vacancy is described below as an impurity element. Typical examples of an impurity element are hydrogen, a rare gas element, and the like. Typical examples of a rare gas element are helium, neon, argon, krypton, and xenon. Furthermore, boron, carbon, nitrogen, fluorine, aluminum, silicon, phosphorus, chlorine, or the like may be contained in the oxide semiconductor film 366 and the oxide semiconductor film 266 as an impurity element.

In addition, the insulating film 376 is a film containing hydrogen and is typically a nitride insulating film. The insulating film 376 is in contact with the oxide semiconductor film 366 and the oxide semiconductor film 266, whereby hydrogen contained in the insulating film 376 is diffused to the oxide semiconductor film 366 and the oxide semiconductor film 266. Consequently, much hydrogen is contained in the regions of the oxide semiconductor film 366 and the oxide semiconductor film 266 in contact with the insulating film 376.

When hydrogen is added to an oxide semiconductor in which an oxygen vacancy is formed by addition of an impurity element, hydrogen enters an oxygen vacant site and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

Here, the temperature dependence of resistivity of a film formed with an oxide conductor (hereinafter referred to as an oxide conductor film) is described with reference to FIG. 34.

In this embodiment, samples each including an oxide conductor film were manufactured. As the oxide conductor film, an oxide conductor film formed by making the oxide semiconductor film in contact with a silicon nitride film (OC_SiN$_x$), an oxide conductor film formed by making the oxide semiconductor film in contact with a silicon nitride film after addition of argon to the oxide semiconductor film in a doping apparatus (OC_Ar dope+SiN$_x$), or an oxide conductor film formed by making the oxide semiconductor film in contact with a silicon nitride film after exposure of the oxide semiconductor film to argon plasma (OC_Ar plasma+SiN$_x$) was formed. Note that the silicon nitride film contains hydrogen.

A method for forming a sample including the oxide conductor film (OC_SiN$_x$) is as follows. A 400-nm-thick silicon oxynitride film was formed over a glass substrate by a plasma CVD method and then exposed to oxygen plasma, and an oxygen ion was added to the silicon oxynitride film; accordingly, a silicon oxynitride film that releases oxygen by heating was formed. Next, a 100-nm-thick In—Ga—Zn oxide film was formed over the silicon oxynitride film that releases oxygen by heating by a sputtering method using a sputtering target in which the atomic ratio of In to Ga and Zn was 1:1:1.2, and heat treatment was performed at 450° C. in a nitrogen atmosphere and then heat treatment was performed at 450° C. in a mixed atmosphere of nitrogen and oxygen. Then, a 100-nm-thick silicon nitride film was formed by a plasma CVD method. After that, heat treatment was performed at 350° C. in a mixed gas atmosphere of nitrogen and oxygen.

A method for forming a sample including the oxide conductor film (OC_Ar dope+SiN$_x$) is as follows. A 400-nm-thick silicon oxynitride film was formed over a glass substrate by a plasma CVD method and then exposed to oxygen plasma, and an oxygen ion was added to the silicon oxynitride film; accordingly, a silicon oxynitride film that releases oxygen by heating was formed. Next, a 100-nm-thick In—Ga—Zn oxide film was formed over the silicon oxynitride film that releases oxygen by heating by a sputtering method using a sputtering target in which the atomic ratio of In to Ga and Zn was 1:1:1.2, and heat treatment was performed at 450° C. in a nitrogen atmosphere and then heat treatment was performed at 450° C. in a mixed atmosphere of nitrogen and oxygen. Then, with a doping apparatus, argon having a dose of $5\times10^{14}$/cm$^2$ was added to the In—Ga—Zn oxide film at an acceleration voltage of 10 kV, and oxygen vacancies were formed in the In—Ga—Zn oxide film. After that, a 100-nm-thick silicon nitride film was formed by a plasma CVD method. Subsequently, heat treatment was performed at 350° C. in a mixed gas atmosphere of nitrogen and oxygen.

A method for forming a sample including the oxide conductor film (OC_Ar plasma+SiN$_x$) is as follows. A 400-nm-thick silicon oxynitride film was formed over a glass substrate by a plasma CVD method and then exposed to oxygen plasma; accordingly, a silicon oxynitride film that releases oxygen by heating was formed. Next, a 100-nm-thick In—Ga—Zn oxide film was formed over the silicon oxynitride film that releases oxygen by heating by a sputtering method using a sputtering target in which the atomic ratio of In to Ga and Zn was 1:1:1.2, and heat treatment was performed at 450° C. in a nitrogen atmosphere and then heat treatment was performed at 450° C. in a mixed atmosphere of nitrogen and oxygen. Then, in a plasma processing apparatus, argon plasma was generated, accelerated argon ions were made to collide with the In—Ga—Zn oxide film, and oxygen vacancies were formed in the In—Ga—Zn oxide film. After that, a 100-nm-thick silicon nitride film was formed by a plasma CVD method. Subsequently, heat treatment was performed at 350° C. in a mixed gas atmosphere of nitrogen and oxygen.

Figure 34:
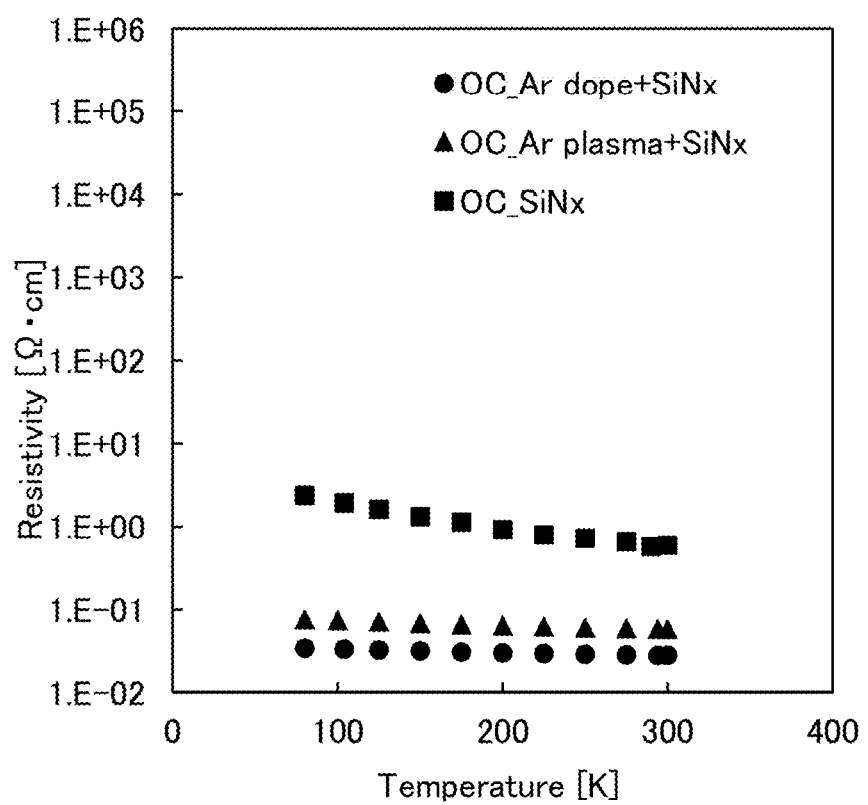
FIG. 34 shows temperature dependence of resistivity.

Next, FIG. 34 shows the measured resistivity of the samples. Here, the resistivity was measured by the Van der Pauw method using four terminals. In FIG. 34, the horizontal axis represents measurement temperature, and the vertical axis represents resistivity. Measurement results of the oxide conductor film (OC_SiN$_x$) are plotted as squares, measurement results of the oxide conductor film (OC_Ar plasma+SiN$_x$) are plotted as triangles, and measurement results of the oxide conductor film (OC_Ar dope+SiN$_x$) are plotted as circles.

Note that although not shown, the oxide semiconductor film which is not in contact with the silicon nitride film had high resistivity, which was difficult to measure. Therefore, it is found that the oxide conductor film has lower resistivity than the oxide semiconductor film.

According to FIG. 34, in the case where the oxide conductor film (OC_Ar dope+SiN$_x$) and the oxide conductor film (OC_Ar plasma+SiN$_x$) contain an oxygen vacancy and hydrogen, variation in resistivity is small. Typically, the variation in resistivity at temperatures from 80 K to 290 K is lower than ±20%. Alternatively, the variation in resistivity at temperatures from 150 K to 250 K is lower than ±10%. In other words, the oxide conductor is a degenerate semiconductor and it is suggested that the conduction band edge agrees with or substantially agrees with the Fermi level. Thus, when the oxide conductor film is used as a source region and a drain region of a transistor, an ohmic contact occurs at a portion where the oxide conductor film is in contact with a conductive film functioning as a source electrode and a drain electrode, and the contact resistance of the oxide conductor film and the conductive film functioning as a source electrode and a drain electrode can be reduced. Furthermore, the oxide conductor has low temperature resistance of resistivity; thus, a fluctuation of contact resistance of the oxide conductor film and a conductive film functioning as a source electrode and a drain electrode is small, and a highly reliable transistor can be obtained.

Figure 18A:
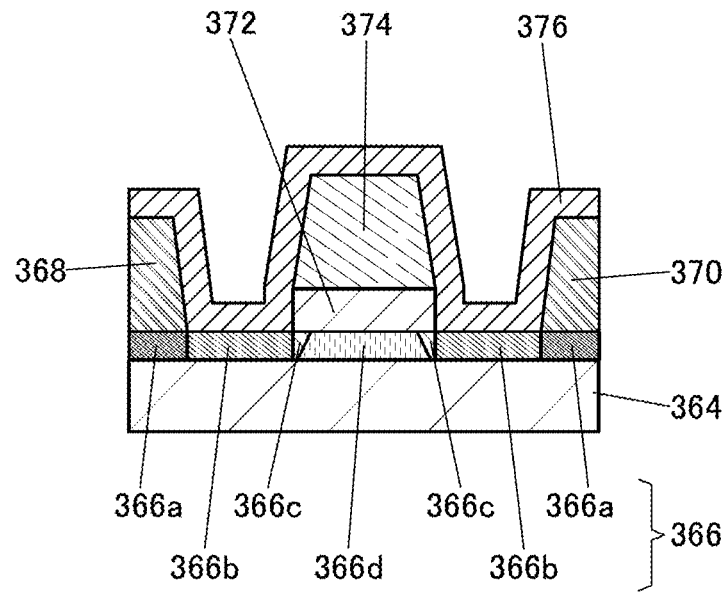
FIGS. 18A and 18B are each a cross-sectional view of the transistor.

Here, FIG. 18A is a partial enlarged view of the oxide semiconductor film 366. Note that as typical examples, description is made with reference to the partial enlarged views of the oxide semiconductor film 366 included in the transistor 390. As illustrated in FIG. 18A, the oxide semiconductor film 366 includes regions 366a in contact with the conductive films 368 and 370, regions 366b in contact with the insulating film 376, and a region 366d in contact with the insulating film 372. Note that in the case where the conductive film 374 has a tapered side surface, the oxide semiconductor film 366 may include a region 366c overlapping with a tapered portion of the conductive film 374.

The regions 366a function as a source region and a drain region. In the case where the conductive films 368 and 370 are formed using a conductive material that is easily bonded to oxygen, such as tungsten, titanium, aluminum, copper, molybdenum, chromium, tantalum, or an alloy of any of these conductive materials, oxygen contained in the oxide semiconductor film 366 and the conductive materials contained in the conductive films 368 and 370 are bonded to each other; thus, oxygen vacancies are formed in the oxide semiconductor film 366. Furthermore, in some cases, part of constituent elements of the conductive material that forms the conductive films 368 and 370 is mixed into the oxide semiconductor film 366. As a result, the region 366a in contact with the conductive film 368 or 370 has higher conductivity and accordingly functions as a source region or a drain region.

The region 366b functions as a low-resistance region. The region 366b contains at least a rare gas element and hydrogen as impurity elements. Note that in the case where the conductive film 374 has a tapered side surface, the impurity element is added to the region 366c through the tapered portion of the conductive film 374; therefore, the region 366c contains the impurity element, though the concentration of the rare gas element which is an example of the impurity element of the region 366c is lower than that in the region 366b. With the regions 366c, source-drain breakdown voltage of the transistor can be increased.

In the case where the oxide semiconductor film 366 is formed by a sputtering method, the regions 366a to 366d each contain the rare gas element, and the concentrations of the rare gas elements in the regions 366b and 366c are higher than those in the regions 366a and 366d. This is due to the fact that in the case where the oxide semiconductor film 366 is formed by a sputtering method, the rare gas element is contained in the oxide semiconductor film 366 because the rare gas element is used as a sputtering gas and the rare gas element is intentionally added to the regions 366b and 366c in order to form oxygen vacancies in the regions 366b and 366c. Note that a rare gas element different from that in the regions 366a and 366d may be added to the regions 366b and 366c.

Since the region 366b is in contact with the insulating film 376, the concentration of hydrogen in the region 366b is higher than those in the regions 366a and 366d. In addition, in the case where hydrogen is diffused from the region 366b to the region 366c, the concentration of hydrogen in the region 366c is higher than those in the regions 366a and 366d. However, the concentration of hydrogen in the region 366b is higher than that in the region 366c.

In the regions 366b and 366c, the concentrations of hydrogen measured by secondary ion mass spectrometry (SIMS) can be greater than or equal to $8\times10^{19}$ atoms/cm$^3$, greater than or equal to $1\times10^{20}$ atoms/cm$^3$, or greater than or equal to $5\times10^{20}$ atoms/cm$^3$. Note that the concentrations of hydrogen in the regions 366a and 366d which are measured by secondary ion mass spectrometry can be less than or equal to $5\times10^{19}$ atoms/cm$^3$, less than or equal to $1\times10^{19}$ atoms/cm$^3$, less than or equal to $5\times10^{18}$ atoms/cm$^3$, less than or equal to $1\times10^{18}$ atoms/cm$^3$, less than or equal to $5\times10^{17}$ atoms/cm$^3$, or less than or equal to $1\times10^{16}$ atoms/cm$^3$.

In the case where boron, carbon, nitrogen, fluorine, aluminum, silicon, phosphorus, or chlorine is added to the oxide semiconductor film 366 as an impurity element, only the regions 366b and 366c contain the impurity element. Therefore, the concentrations of the impurity element in the regions 366b and 366c are higher than those in the regions 366a and 366d. Note that the concentrations of the impurity element in the regions 366b and 366c which are measured by secondary ion mass spectrometry can be greater than or equal to $1\times10^{18}$ atoms/cm$^3$ and less than or equal to $1\times10^{22}$ atoms/cm$^3$, greater than or equal to $1\times10^{19}$ atoms/cm$^3$ and less than or equal to $1\times10^{21}$ atoms/cm$^3$, or greater than or equal to $5\times10^{19}$ atoms/cm$^3$ and less than or equal to $5\times10^{20}$ atoms/cm$^3$.

The regions 366b and 366c have higher concentrations of hydrogen and larger amounts of oxygen vacancies due to addition of the rare gas element than the region 366d. Therefore, the regions 366b and 366c have higher conductivity and function as low-resistance regions. The resistivity of the regions 366b and 366c can be typically greater than or equal to $1\times10^{-3}$ Ωcm and less than $1\times10^{4}$ Ωcm, or greater than or equal to $1\times10^{-3}$ Ωcm and less than $1\times10^{-1}$ Ωcm.

Note that when the amount of hydrogen in each of the regions 366b and 366c is the same as or smaller than the amount of oxygen vacancies therein, hydrogen is easily captured by oxygen vacancies and is less likely to be diffused to the region 366d serving as a channel. As a result, a transistor having normally-off characteristics can be obtained.

The region 366d functions as a channel.

Figure 18B:
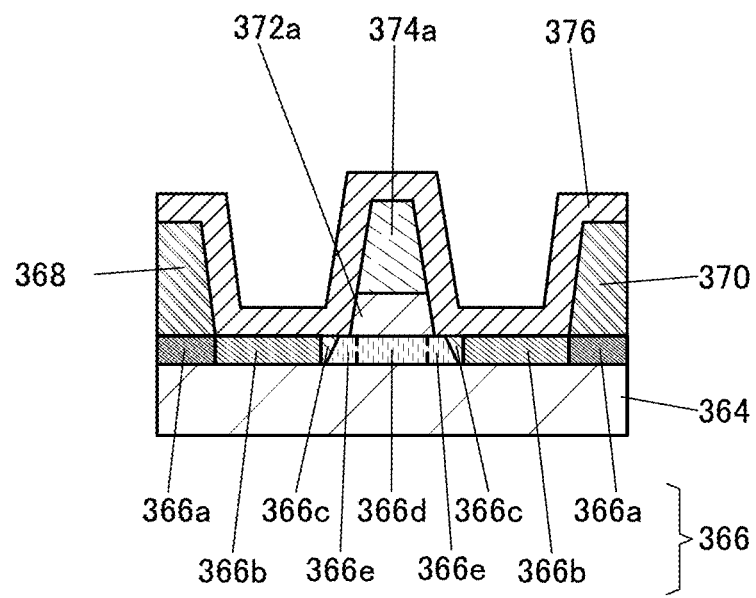

In addition, after the impurity element is added to the oxide semiconductor film 366 using the conductive films 368 and 370 and the conductive film 374 as masks, the area of the conductive film 374 when seen from the above may be reduced (see FIG. 18B). More specifically, after the impurity element is added to the oxide semiconductor film 366, slimming process is performed on a mask (e.g., a photoresist) over the conductive film 374. Then, the conductive film 374 and the insulating film 372 are etched using the mask. Through this step, a conductive film 374a and an insulating film 372a illustrated in FIG. 18B can be formed. As the slimming process, an ashing process using an oxygen radical or the like can be employed, for example.

As a result, an offset region 366e is formed between the region 366c and the region 366d serving as a channel in the oxide semiconductor film 366. Note that the length of the offset region 366e in the channel length direction is set to be less than 0.1 μm, whereby a decrease in the on-state current of the transistor can be suppressed.

The insulating film 372 and the insulating film 272 each function as a gate insulating film.

The conductive films 368 and 370 and the conductive films 268 and 270 each function as a source electrode or a drain electrode.

The conductive film 374 and the conductive film 274 each function as a gate electrode.

The transistor 390 and the transistor 394 described in this embodiment each include the region 366b and/or the region 366c between the region 366d functioning as a channel and each of the regions 366a functioning as a source region and a drain region. Accordingly, resistance between the channel and each of the source region and the drain region can be reduced, and the transistor 390 and the transistor 394 each have a high on-state current and a high field-effect mobility.

In addition, in the transistor 390 and the transistor 394, parasitic capacitance between the conductive film 374 and each of the conductive films 368 and 370 can be reduced by forming the conductive film 374 so as not overlap with the conductive films 368 and 370. Moreover, parasitic capacitance between the conductive film 274 and each of the conductive films 268 and 270 can be reduced by forming the conductive film 274 so as not to overlap with the conductive films 268 and 270. As a result, in the case where a large-sized substrate is used as the substrate 362, signal delays in the conductive films 368 and 370 and the conductive film 374, and signal delays in the conductive films 268 and 270 and the conductive film 274 can be reduced.

In the transistor 390, the rare gas element is added to the oxide semiconductor film 366 using the conductive films 368 and 370 and the conductive film 374 as masks, so that regions having oxygen vacancies are formed. In the transistor 394, the impurity element is added to the oxide semiconductor film 266 using the conductive films 268 and 270 and the conductive film 274 as masks, so that regions having oxygen vacancies are formed. Furthermore, the regions having oxygen vacancies are in contact with the insulating film 376 containing hydrogen; therefore, hydrogen contained in the insulating film 376 is diffused to the regions having oxygen vacancies and thus low-resistance regions are formed. That is, the low-resistance regions can be formed in a self-aligned manner.

In the transistor 390 and the transistor 394 described in this embodiment, when the rare gas element is added to the regions 366b, oxygen vacancies are formed and hydrogen is added thereto. Therefore, the conductivity of the region 366b can be increased and variation in conductivity of the region 366b in each transistor can be reduced. That is, addition of the rare gas element and hydrogen to the region 366b can control the conductivity of the region 366b.

The structure illustrated in FIGS. 17A and 17B is described below in detail.

The type of the substrate 362 is not limited to a certain type, and any of a variety of substrates can be used as the substrate 362. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of a glass substrate include a barium borosilicate glass substrate, an aluminoborosilicate glass substrate, and a soda lime glass substrate. Examples of a flexible substrate, an attachment film, a base material film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, when the transistors are formed using a semiconductor substrate, a single crystal substrate, an SOI substrate, or the like, it is possible to form a transistor with few variations in characteristics, size, shape, or the like, with high current supply capability, and with a small size. By forming a circuit with the use of such a transistor, power consumption of the circuit can be reduced or the circuit can be highly integrated.

Still alternatively, a flexible substrate may be used as the substrate 362, and the transistors may be directly provided on the flexible substrate. Alternatively, a separation layer may be provided between the substrate 362 and each of the transistors. The separation layer can be used when part or the whole of a semiconductor device formed over the separation layer is completed and separated from the substrate 362 and transferred to another substrate. In such a case, the transistors can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of a substrate to which the transistors are transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. When such a substrate is used, a transistor with excellent properties or a transistor with low power consumption can be formed, a device with high durability, high heat resistance can be provided, or reduction in weight or thickness can be achieved.

The insulating film 364 can be formed with a single layer or a stack using one or more of an oxide insulating film and a nitride insulating film. Note that an oxide insulating film is preferably used as at least a region of the insulating film 364 that is in contact with the oxide semiconductor films 266 and 366, in order to improve characteristics of the interface with the oxide semiconductor films 266 and 366. An oxide insulating film that releases oxygen by being heated is preferably used as the insulating film 364, in which case oxygen contained in the insulating film 364 can be moved to the oxide semiconductor films 266 and 366 by heat treatment.

The thickness of the insulating film 364 can be greater than or equal to 50 nm and less than or equal to 5000 nm, greater than or equal to 100 nm and less than or equal to 3000 nm, or greater than or equal to 200 nm and less than or equal to 1000 nm. With the use of the thick insulating film 364, the amount of oxygen released from the insulating film 364 can be increased, and the interface states between the insulating film 364 and each of the oxide semiconductor films 266 and 366 and oxygen vacancies included in the regions 366d of the oxide semiconductor films 266 and 366 can be reduced.

The insulating film 364 can be formed with a single layer or a stack using, for example, one or more of silicon oxide, silicon oxynitride, silicon nitride oxide, silicon nitride, aluminum oxide, hafnium oxide, gallium oxide, a Ga—Zn oxide, and the like.

The oxide semiconductor films 366 and 266 are typically formed using a metal oxide such as an In—Ga oxide, an In—Zn oxide, or an In-M-Zn oxide (M is Mg, Al, Ti, Ga, Y, Zr, La, Ce, Nd, or Hf). Note that the oxide semiconductor films 366 and 266 have light-transmitting properties.

Note that in the case of using an In-M-Zn oxide as the oxide semiconductor films 366 and 266, when summation of In and M is assumed to be 100 atomic %, the proportions of In and M are preferably set to be greater than or equal to 25 atomic % and less than 75 atomic %, respectively, or greater than or equal to 34 atomic % and less than 66 atomic %, respectively.

The energy gaps of the oxide semiconductor films 366 and 266 are each 2 eV or more, 2.5 eV or more, or 3 eV or more.

The thicknesses of the oxide semiconductor films 366 and 266 are each greater than or equal to 3 nm and less than or equal to 200 nm, greater than or equal to 3 nm and less than or equal to 100 nm, or greater than or equal to 3 nm and less than or equal to 50 nm.

In the case where the oxide semiconductor films 366 and 266 are each an In-M-Zn oxide (M is Mg, Al, Ti, Ga, Y, Zr, La, Ce, Nd, or Hf), it is preferable that the atomic ratio of metal elements of a sputtering target used for forming a film of the In-M-Zn oxide satisfy In M and Zn M. As the atomic ratio of metal elements of the sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, or the like is preferable. Note that the atomic ratios of metal elements in the formed oxide semiconductor films 366 and 266 vary from the above atomic ratio of metal elements of the sputtering target within a range of ±40% as an error.

When silicon or carbon that is one of elements belonging to Group 14 is contained in the oxide semiconductor films 366 and 266, oxygen vacancies are increased, and the oxide semiconductor films 366 and 266 become n-type films. Thus, the concentrations of silicon or carbon (the concentrations are measured by secondary ion mass spectrometry (SIMS)) of the oxide semiconductor films 366 and 266, in particular, the regions 366d are preferably less than or equal to $2 \times 10^{18}$ atoms/cm$^3$ or less than or equal to $2 \times 10^{17}$ atoms/cm$^3$. As a result, the transistors each have positive threshold voltage (normally-off characteristics).

In addition, the concentrations of alkali metals or alkaline earth metals measured by secondary ion mass spectrometry (SIMS) of the oxide semiconductor films 366 and 266, in particular, the regions 366d are preferably less than or equal to $1 \times 10^{18}$ atoms/cm$^3$ or less than or equal to $2 \times 10^{16}$ atoms/cm$^3$. An alkali metal and an alkaline earth metal might generate carriers when bonded to an oxide semiconductor, in which case the off-state current of the transistors might be increased. Therefore, it is preferable to reduce the concentration of an alkali metal or an alkaline earth metal in the region 366d. As a result, the transistors each have positive threshold voltage (normally-off characteristics).

Furthermore, when containing nitrogen, each of the oxide semiconductor films 366 and 266, in particular, the regions 366d might become an n-type film by generation of electrons serving as carriers and an increase of carrier density. Thus, the transistors 390 and 394 each including an oxide semiconductor film which contains nitrogen is likely to have normally-on characteristics. For this reason, nitrogen in the oxide semiconductor film, in particular, the region 366d is preferably reduced as much as possible. The concentration of nitrogen measured by secondary ion mass spectrometry (SIMS) can be set to be, for example, less than or equal to $5 \times 10^{18}$ atoms/cm$^3$.

When an impurity element in each of the oxide semiconductor films 366 and 266, in particular, the regions 366d is reduced, the carrier density of the oxide semiconductor film is preferably lowered. For example, each of the oxide semiconductor films 366 and 266, in particular, the regions 366d has a carrier density less than or equal to $1 \times 10^{17}$/cm$^3$, preferably less than or equal to $1 \times 10^{15}$/cm$^3$, further preferably less than or equal to $1 \times 10^{13}$/cm$^3$, or still further preferably less than or equal to $1 \times 10^{11}$/cm$^3$.

An oxide semiconductor film with a low impurity concentration and a low density of defect states can be used for the oxide semiconductor films 366 and 266, in which case the transistors can have more excellent electrical characteristics. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has low density of trap states in some cases. Furthermore, a highly purified intrinsic or substantially highly purified intrinsic oxide semiconductor film has an extremely small off-state current; the off-state current can be smaller than or equal to the measurement limit of a semiconductor parameter analyzer, i.e., smaller than or equal to $1 \times 10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases.

In addition, each of the oxide semiconductor films 366 and 266 may have a non-single-crystal structure, for example. The non-single crystal structure includes a c-axis aligned crystalline oxide semiconductor (CAAC-OS), a polycrystalline structure, a microcrystalline structure, or an amorphous structure, for example. Among the non-single crystal structure, the amorphous structure has the highest density of defect states, whereas CAAC-OS has the lowest density of defect states. Note that for details of the CAAC-OS, description is made in Embodiment 6.

Note that the oxide semiconductor films 366 and 266 may be a mixed film including two or more of the following: a region having an amorphous structure, a region having a microcrystalline structure, a region having a polycrystalline structure, a region of CAAC-OS, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure. Furthermore, the mixed film has a stacked-layer structure including, for example, two or more of a region having an amorphous structure, a region having a microcrystalline structure, a region having a polycrystalline structure, a CAAC-OS region, and a region having a single-crystal structure in some cases.

Note that in some cases, the regions 366b and 366d are different in crystallinity in each of the oxide semiconductor films 366 and 266. In addition, in some cases, the regions 366c and 366d are different in crystallinity in each of the oxide semiconductor films 366 and 266. This is because when an impurity element is added to the region 366b or 366c, the region 366b or 366c is damaged and thus has lower crystallinity.

The insulating films 272 and 372 can be formed with a single layer or a stack using one or more of an oxide insulating film and a nitride insulating film. Note that an oxide insulating film is preferably used as at least regions of the insulating films 272 and 372 that are in contact with the oxide semiconductor films 266 and 366, respectively, in order to improve characteristics of the interface with the oxide semiconductor films 366 and 266. The insulating films 272 and 372 can be formed with a single layer or a stack using, for example, one or more of silicon oxide, silicon oxynitride, silicon nitride oxide, silicon nitride, aluminum oxide, hafnium oxide, gallium oxide, a Ga—Zn oxide, and the like.

Furthermore, it is possible to prevent outward diffusion of oxygen from the oxide semiconductor films 366 and 266 and entry of hydrogen, water, or the like into the oxide semiconductor films 366 and 266 from the outside by providing an insulating film having a blocking effect against oxygen, hydrogen, water, and the like as the insulating films 272 and 372. As the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The insulating films 272 and 372 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistors can be reduced.

An oxide insulating film that releases oxygen by being heated is preferably used as the insulating films 272 and 372, in which case oxygen contained in the insulating films 272 and 372 can be moved to the oxide semiconductor films 266 and 366, respectively, by heat treatment.

In addition, a silicon oxynitride film with few defects can be used as the insulating films 272 and 372. In an ESR spectrum at 100 K or lower of the silicon oxynitride film with few defects, after heat treatment, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The total spin density of the first to third signals is less than $1 \times 10^{18}$ spins/cm$^3$, typically greater than or equal to $1 \times 10^{17}$ spins/cm$^3$ and less than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, or greater than or equal to 1 and smaller than or equal to 2). In other words, the lower the total spin density of the first to third signals is, the lower the content of nitrogen oxide in the silicon oxynitride film is.

The concentration of nitrogen in the silicon oxynitride film with few defects which is measured by secondary ion mass spectrometry is less than or equal to 6×10$^{20}$ atoms/cm$^3$. With the use of the silicon oxynitride film with few defects as the insulating films 272 and 372, a nitrogen oxide is unlikely to be generated, so that the carrier trap at the interface between the insulating film and each of the oxide semiconductor films 366 and 266 can be inhibited. Furthermore, a shift in the electrical characteristics of each of the transistors included in the light-emitting device, such as a threshold voltage, can be reduced, which leads to a smaller change in the electrical characteristics of the transistors.

The total thickness of the insulating films 272 and 372 can be greater than or equal to 5 nm and less than or equal to 400 nm, greater than or equal to 5 nm and less than or equal to 300 nm, or greater than or equal to 10 nm and less than or equal to 250 nm.

Each of the conductive films 368 and 370, the conductive film 374, the conductive films 268 and 270, the conductive film 261, and the conductive film 274 can be formed using a metal element selected from aluminum, chromium, copper, tantalum, titanium, molybdenum, nickel, iron, cobalt, and tungsten; an alloy containing any of these metal elements as a component; an alloy containing these metal elements in combination; or the like. Furthermore, one or more metal elements selected from manganese and zirconium may be used. The conductive film may have a single-layer structure or a stacked-layer structure of two or more layers. For example, any of the following can be used: a single-layer structure of an aluminum film containing silicon; a single-layer structure of a copper film containing manganese; two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum, tungsten, molybdenum, chromium, neodymium, and scandium may be used.

The conductive films 368 and 370, the conductive film 374, the conductive films 268 and 270, the conductive film 261, and the conductive film 274 each can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Alternatively, a stacked-layer structure of the above light-transmitting conductive material and a conductive material containing the above metal element may be employed.

The thicknesses of the conductive films 368 and 370, the conductive film 374, the conductive films 268 and 270, the conductive film 261, and the conductive film 274 each can be greater than or equal to 30 nm and less than or equal to 500 nm, or greater than or equal to 100 nm and less than or equal to 400 nm.

The insulating film 376 is a film containing hydrogen and is typically a nitride insulating film. The nitride insulating film can be formed using silicon nitride, aluminum nitride, or the like.

Structure Example 2 of Transistor

Next, another structure of the transistor included in the light-emitting device is described with reference to FIGS. 19A to 19C. Description is made here using a transistor 391 as a modified example of the transistor 390 provided in the pixel portion; however, the structure of an insulating film 364 or the structure of a conductive film 368, 370, or 374 of the transistor 391 can be applied as appropriate to the transistor 394 in the driver circuit.

Figure 19A:
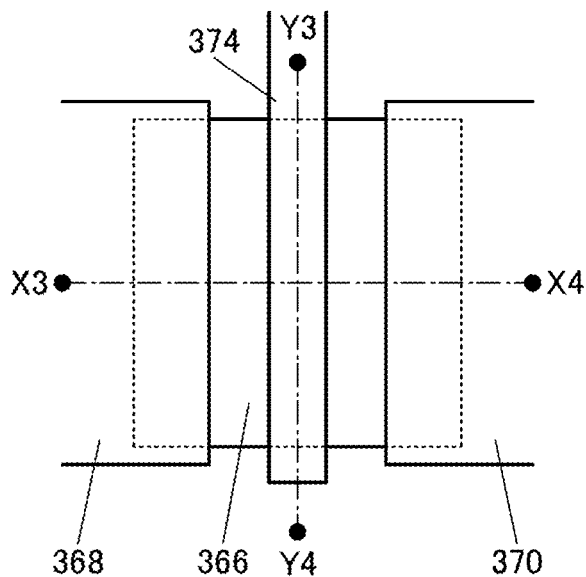
FIGS. 19A to 19C are a top view and cross-sectional views of a transistor.
Figure 19B:
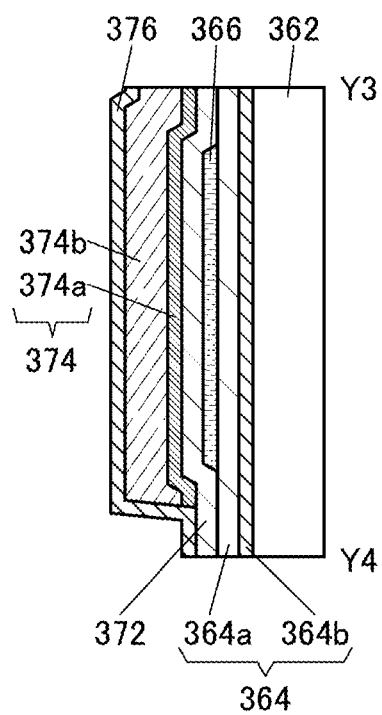
Figure 19C:
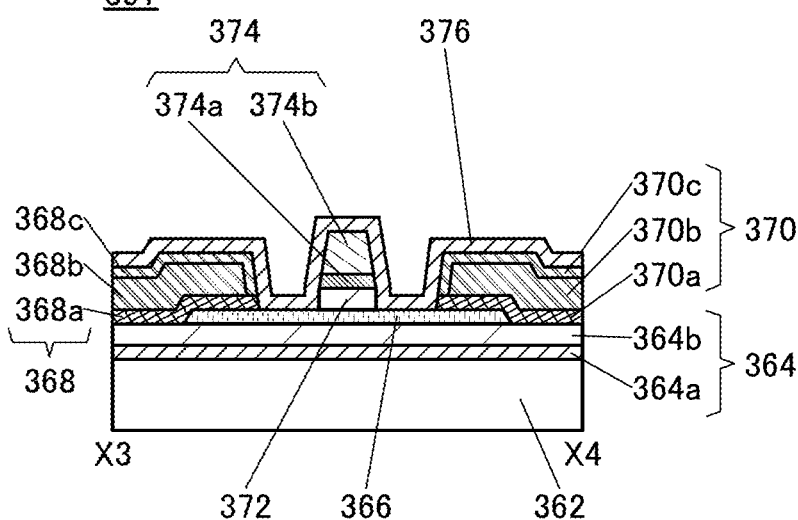

FIGS. 19A to 19C are a top view and cross-sectional views of the transistor 391 included in the light-emitting device. FIG. 19A is a top view of the transistor 391, FIG. 19B is a cross-sectional view taken along dashed-dotted line Y3-Y4 in FIG. 19A, and FIG. 19C is a cross-sectional view taken along dashed-dotted line X3-X4 in FIG. 19A.

The transistor 391 illustrated in FIGS. 19A to 19C has a two- or three-layer structure of the conductive films 368 and 370 and the conductive film 374. In addition, the insulating film 364 has a stacked-layer structure of a nitride insulating film 364a and an oxide insulating film 364b. The other structures are the same as those of the transistor 390 and the effect similar to that in the case of the transistor 390 can be obtained.

First, the conductive films 368 and 370 and the conductive film 374 are described.

In the conductive film 368, conductive films 368a, 368b, and 368c are stacked in this order and the conductive films 368a and 368c cover the surfaces of the conductive film 368b. That is, the conductive films 368a and 368c function as protective films of the conductive film 368b.

In a manner similar to that of the conductive film 368, in the conductive film 370, conductive films 370a, 370b, and 370c are stacked in this order and the conductive films 370a and 370c cover the surfaces of the conductive film 370b. That is, the conductive films 370a and 370c function as protective films of the conductive film 370b.

In the conductive film 374, conductive films 374a and 374b are stacked in this order.

The conductive films 368a and 370a and the conductive film 374a are formed using materials that prevent metal elements contained in the conductive films 368b and 370b and the conductive film 374b, respectively, from diffusing to the oxide semiconductor film 366. The conductive films 368a and 370a and the conductive film 374a can be formed using titanium, tantalum, molybdenum, tungsten, an alloy of any of these materials, titanium nitride, tantalum nitride, molybdenum nitride, tungsten nitride, or the like. Alternatively, the conductive films 368a and 370a and the conductive film 374a can be formed using Cu—X alloy (X is Mn, Ni, Cr, Fe, Co, Mo, Ta, or Ti) or the like.

The conductive films 368b and 370b and the conductive film 374b are each formed using a low-resistance material. The conductive films 368b and 370b and the conductive film 374b can be formed using copper, aluminum, gold, silver, an alloy of any of these materials, a compound containing any of these materials as a main component, or the like.

When the conductive films 368c and 370c are formed using films in which the metal elements contained in the conductive films 368b and 370b, respectively, are passivated, the metal elements contained in the conductive films 368b and 370b can be prevented from moving to the oxide semiconductor film 366 in a step of forming the insulating film 376. The conductive films 368c and 370c can be formed using a metal silicide or a metal silicide nitride, typically, $CuSi_x$ (x>0), $CuSi_xN_y$ (x>0, y>0), or the like.

Here, a method for forming the conductive films 368c and 370c is described. Note that the conductive films 368b and 370b are formed using copper. In addition, the conductive films 368c and 370c are formed using $CuSi_xN_y$ (x>0, y>0).

The conductive films 368b and 370b are exposed to plasma generated in a reducing atmosphere such as a hydrogen atmosphere, an ammonia atmosphere, or a carbon monoxide atmosphere and the oxide formed on the surfaces of the conductive films 368b and 370b are reduced.

Next, the conductive films 368b and 370b are exposed to silane while being heated at a temperature higher than or equal to 200° C. and lower than or equal to 400° C. As a result, copper contained in the conductive films 368b and 370b acts as a catalyst, and silane is decomposed into Si and H2, and $CuSi_x$ (x>0) is formed on the surfaces of the conductive films 368b and 370b.

Next, the conductive films 368b and 370b are exposed to plasma generated in an atmosphere containing nitrogen, such as an ammonia atmosphere or a nitrogen atmosphere, whereby $CuSi_x$ (x>0) formed on the surfaces of the conductive films 368b and 370b reacts with nitrogen contained in the plasma and accordingly $CuSi_xN_y$ (x>0, y>0) is formed as the conductive films 368c and 370c.

Note that in the above step, $CuSi_xN_y$ (x>0, y>0) may be formed as the conductive films 368c and 370c in such a manner that the conductive films 368b and 370b are exposed to plasma generated in an atmosphere containing nitrogen, such as an ammonia atmosphere or a nitrogen atmosphere, and then exposed to silane while being heated at a temperature higher than or equal to 200° C. and lower than or equal to 400° C.

Next, the insulating film 364 in which the nitride insulating film 364a and the oxide insulating film 364b are stacked is described.

The nitride insulating film 364a can be formed using silicon nitride, silicon nitride oxide, aluminum nitride, or aluminum nitride oxide, for example. The oxide insulating film 364b can be formed using silicon oxide, silicon oxynitride, aluminum oxide, or the like, for example. The structure in which the nitride insulating film 364a is provided on the substrate 362 side can prevent hydrogen, water, or the like from diffusing to the oxide semiconductor film 366 from the outside.

Structure Example 3 of Transistor

Next, another structure of the transistor included in the light-emitting device is described with reference to FIGS. 20A to 20C and FIGS. 21A to 21C. Description is made here using a transistor 392 and a transistor 393 as modified examples of the transistor 390 provided in the pixel portion; however, the structure of an oxide semiconductor film 366 included in the transistor 392 or the structure of an oxide semiconductor film 366 included in the transistor 393 can be applied as appropriate to the transistor 394 in the driver circuit.

Figure 20A:
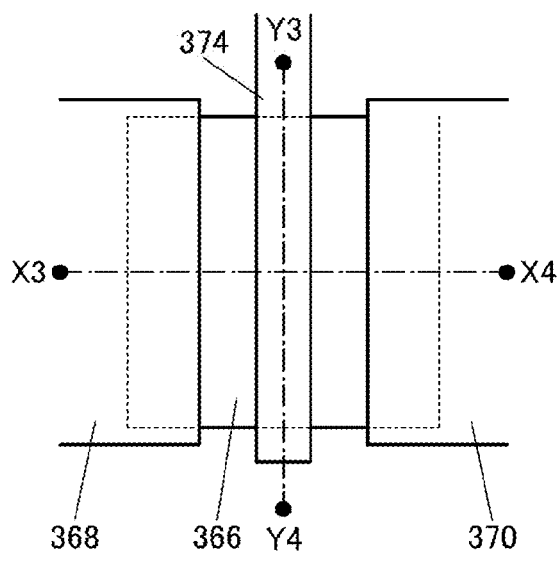
FIGS. 20A to 20C are a top view and cross-sectional views of a transistor.
Figure 20B:
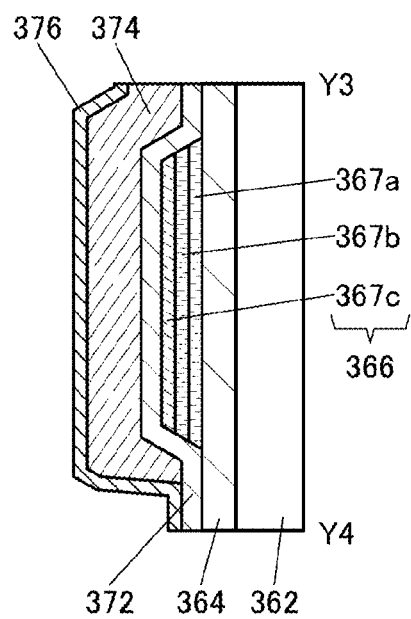
Figure 20C:
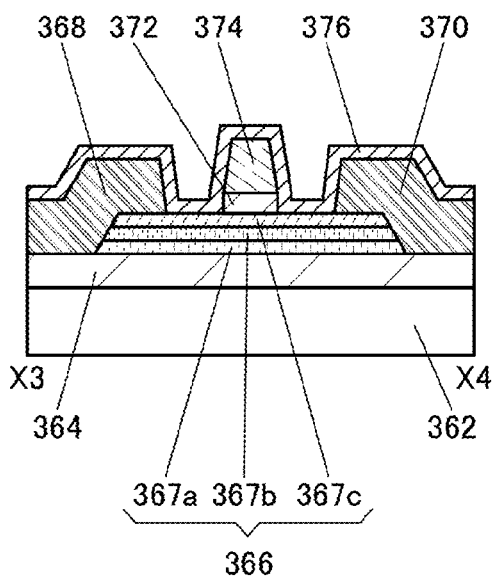

FIGS. 20A to 20C are a top view and cross-sectional views of the transistor 392 included in the light-emitting device. FIG. 20A is a top view of the transistor 392, FIG. 20B is a cross-sectional view taken along dashed-dotted line Y3-Y4 in FIG. 20A, and FIG. 20C is a cross-sectional view taken along dashed-dotted line X3-X4 in FIG. 20A.

The oxide semiconductor film 366 of the transistor 392 illustrated in FIGS. 20A to 20C has a multilayer structure. Specifically, the oxide semiconductor film 366 includes an oxide semiconductor film 367a in contact with the insulating film 364, an oxide semiconductor film 367b in contact with the oxide semiconductor film 367a, and an oxide semiconductor film 367c in contact with the oxide semiconductor film 367b, the conductive films 368 and 370, and the insulating films 372 and 376. The other structures are the same as those of the transistor 390 and the effect similar to that in the case of the transistor 390 can be obtained.

The oxide semiconductor films 367a, 367b, and 367c are typically formed using a metal oxide such as an In—Ga oxide, an In—Zn oxide, or an In-M-Zn oxide (M is Mg, Al, Ti, Ga, Y, Zr, La, Ce, Nd, or Hf).

The oxide semiconductor films 367a and 367c are typically each an In—Ga oxide, an In—Zn oxide, an In—Mg oxide, a Zn—Mg oxide, or an In-M-Zn oxide (M is Mg, Al, Ti, Ga, Y, Zr, La, Ce, Nd, or Hf), and has the energy at the bottom of the conduction band closer to a vacuum level than that of the oxide semiconductor film 367b. Typically, a difference between the energy at the bottom of the conduction band of the oxide semiconductor film 367b and the energy at the bottom of the conduction band of each of the oxide semiconductor films 367a and 367c is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. Note that the difference between the vacuum level and the energy at the bottom of the conduction band is referred to as electron affinity.

In the case where the oxide semiconductor film 367b is an In-M-Zn oxide (M is Mg, Al, Ti, Ga, Y, Zr, La, Ce, Nd, or Hf) and a target having the atomic ratio of metal elements of In:M:Zn=$x_1$:$y_1$:$z_1$ is used for depositing the oxide semiconductor film 367b, $x_1/y_1$ is preferably greater than or equal to ⅓ and less than or equal to 6, or further preferably greater than or equal to 1 and less than or equal to 6, and $z_1/y_1$ is preferably greater than or equal to ⅓ and less than or equal to 6, or further preferably greater than or equal to 1 and less than or equal to 6. Note that when $z_1/y_1$ is greater than or equal to 1 and less than or equal to 6, a CAAC-OS film to be described later as the oxide semiconductor film 367b is easily formed. As typical examples of the atomic ratio of metal elements of the target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, and the like can be given.

In the case where the oxide semiconductor films 367a and 367c are each an In-M-Zn oxide (M is Mg, Al, Ti, Ga, Y, Zr, La, Ce, Nd, or Hf) and a target having the atomic ratio of metal elements of In:M:Zn=$x_2$:$y_2$:$z_2$ is used for forming the oxide semiconductor films 367a and 367c, $x_2/y_2$ is preferably less than $x_1/y_1$, and $z_2/y_2$ is preferably greater than or equal to ⅓ and less than or equal to 6, or further preferably greater than or equal to 1 and less than or equal to 6. Note that when $z_2/y_2$ is greater than or equal to 1 and less than or equal to 6, a CAAC-OS film to be described later as the oxide semiconductor films 367a and 367c is easily formed. As typical examples of the atomic ratio of metal elements of the target, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, In:M:Zn=1:6:9, and the like can be given.

Note that a proportion of each atom in the atomic ratio of the oxide semiconductor films 367a, 367b, and 367c varies within a range of ±40% as an error.

The atomic ratio is not limited to the above, and the atomic ratio may be appropriately set in accordance with needed semiconductor characteristics.

The oxide semiconductor films 367a and 367c may have the same composition. For example, as the oxide semiconductor films 367a and 367c, an In—Ga—Zn oxide having an atomic ratio of In:Ga:Zn=1:3:2, 1:3:4, 1:4:5, 1:4:6, 1:4:7, or 1:4:8 may be used.

Alternatively, the oxide semiconductor films 367a and 367c may have different compositions. For example, as the oxide semiconductor film 367a, an In—Ga—Zn oxide film having an atomic ratio of In:Ga:Zn=1:3:2 may be used, and as the oxide semiconductor film 367c, an In—Ga—Zn oxide film having an atomic ratio of In:Ga:Zn=1:3:4 or 1:4:5 may be used.

The thickness of each of the oxide semiconductor films 367a and 367c is greater than or equal to 3 nm and less than or equal to 100 nm, or preferably greater than or equal to 3 nm and less than or equal to 50 nm. The thickness of the oxide semiconductor film 367b is greater than or equal to 3 nm and less than or equal to 200 nm, greater than or equal to 3 nm and less than or equal to 100 nm, or greater than or equal to 3 nm and less than or equal to 50 nm. When the thicknesses of the oxide semiconductor films 367a and 367c are made smaller than that of the oxide semiconductor film 367b, the amount of change in the threshold voltage of the transistor can be reduced.

The interface between the oxide semiconductor film 367b and each of the oxide semiconductor films 367a and 367c can be observed by scanning transmission electron microscopy (STEM) in some cases.

Oxygen vacancies in the oxide semiconductor film 367b can be reduced by providing the oxide semiconductor films 367a and 367c in which oxygen vacancies are less likely to be generated than the oxide semiconductor film 367b in contact with the upper surface and the lower surface of the oxide semiconductor film 367b. Furthermore, since the oxide semiconductor film 367b is in contact with the oxide semiconductor films 367a and 367c containing one or more metal elements forming the oxide semiconductor film 367b, the interface state densities between the oxide semiconductor film 367a and the oxide semiconductor film 367b and between the oxide semiconductor film 367b and the oxide semiconductor film 367c are extremely low. Accordingly, oxygen vacancies contained in the oxide semiconductor film 367b can be reduced.

In addition, with the oxide semiconductor film 367a, variation in the electrical characteristics of the transistor, such as a threshold voltage, can be reduced.

Since the oxide semiconductor film 367c containing one or more metal elements forming the oxide semiconductor film 367b is provided in contact with the oxide semiconductor film 367b, scattering of carriers does not easily occur at an interface between the oxide semiconductor film 367b and the oxide semiconductor film 367c, and thus the field-effect mobility of the transistor can be increased.

Furthermore, the oxide semiconductor films 367a and 367c each also serve as a barrier film which suppresses formation of an impurity state due to the entry of the constituent elements of the insulating films 364 and 372 into the oxide semiconductor film 367b.

As described above, in the transistors described in this embodiment, variation in the electrical characteristics of the transistors, such as a threshold voltage, is reduced.

Figure 21A:
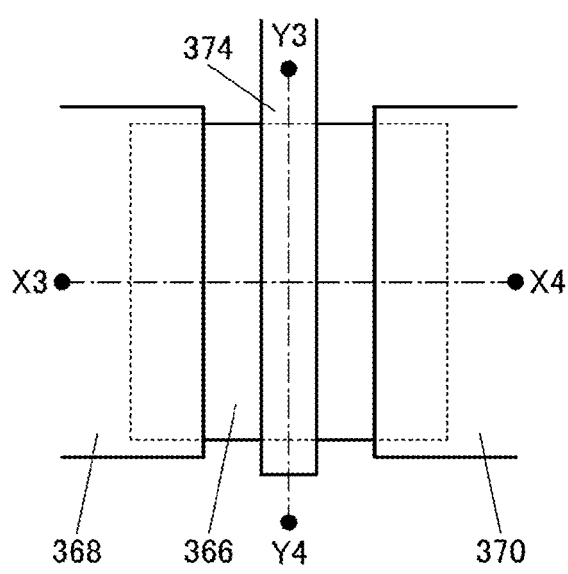
FIGS. 21A to 21C are a top view and cross-sectional views of a transistor.
Figure 21B:
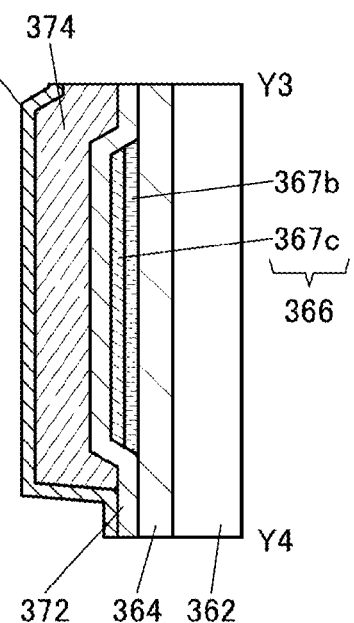
Figure 21C:
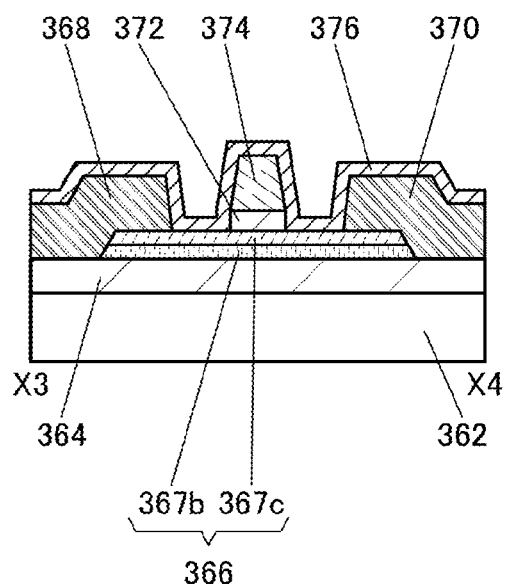

A transistor having a structure different from that in FIGS. 20A to 20C is illustrated in FIGS. 21A to 21C.

FIGS. 21A to 21C are a top view and cross-sectional views of the transistor 393 included in the light-emitting device. FIG. 21A is a top view of the transistor 393, FIG. 21B is a cross-sectional view taken along dashed-dotted line Y3-Y4 in FIG. 21A, and FIG. 21C is a cross-sectional view taken along dashed-dotted line X3-X4 in FIG. 21A. Note that in FIG. 21A, the substrate 362, the insulating films 364, 372, and 376, and the like are omitted for simplicity. FIG. 21B is the cross-sectional view of the transistor 393 in the channel width direction. Moreover, FIG. 21C is the cross-sectional view of the transistor 393 in the channel length direction.

Like the oxide semiconductor film 366 of the transistor 393 illustrated in FIGS. 21A to 21C, the oxide semiconductor film 366 may have a stacked-layer structure of the oxide semiconductor film 367b in contact with the insulating film 364 and the oxide semiconductor film 367c in contact with the oxide semiconductor film 367b and the insulating film 372.

<Band Structure>

Figure 22A:
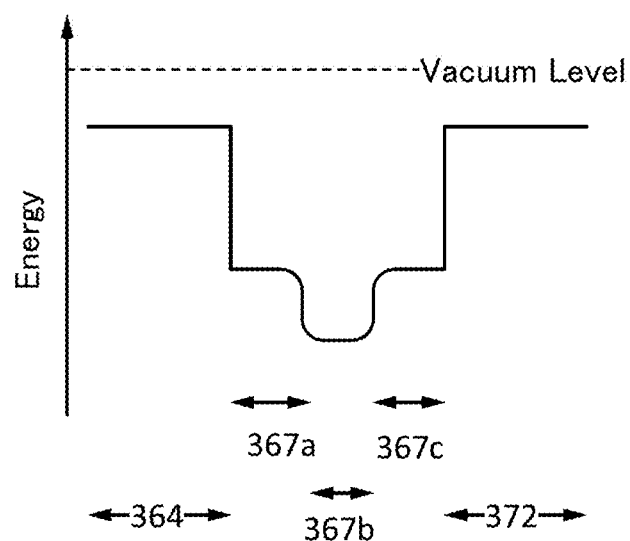
FIGS. 22A and 22B each show a band diagram of the transistor.
Figure 22B:
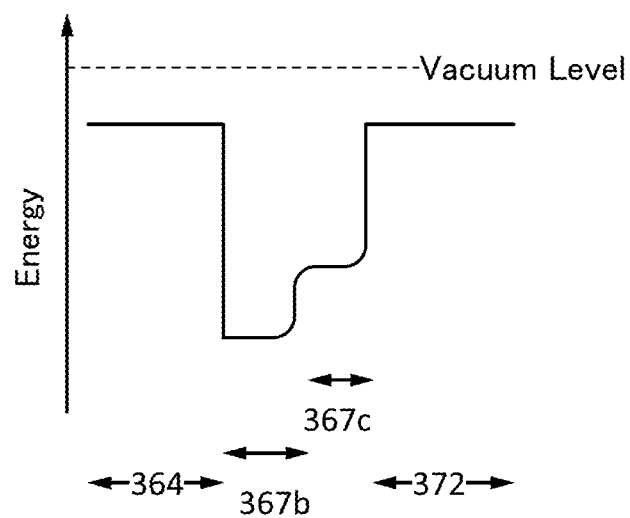

Here, the band structures of the transistor illustrated in FIGS. 20A to 20C and the transistor illustrated in FIGS. 21A to 21C are described. Note that FIG. 22A shows the band structure of the transistor 392 illustrated in FIGS. 20A to 20C, and for easy understanding, the energy (Ec) of the bottom of the conduction band of each of the insulating film 364, the oxide semiconductor films 367a, 367b, and 367c, and the insulating film 372 is shown. FIG. 22B shows the band structure of the transistor 393 illustrated in FIGS. 21A to 21C, and for easy understanding, the energy (Ec) of the bottom of the conduction band of each of the insulating film 364, the oxide semiconductor films 367b and 367c, and the insulating film 372 is shown.

As illustrated in FIG. 22A, the energies at the bottoms of the conduction bands are changed continuously in the oxide semiconductor films 367a, 367b, and 367c. This can be understood also from the fact that the constituent elements are common among the oxide semiconductor films 367a, 367b, and 367c and oxygen is easily diffused among the oxide semiconductor films 367a to 367c. Thus, the oxide semiconductor films 367a, 367b, and 367c have a continuous physical property although they are a stack of films having different compositions.

The oxide semiconductor films that are stacked and contain the same main components have not only a simple stacked-layer structure of the layers but also a continuous energy band (here, in particular, a well structure having a U shape in which energies at the bottoms of the conduction bands are changed continuously between layers (U-shaped well)). That is, the stacked-layer structure is formed so that a defect state which serves as a trap center or a recombination center in an oxide semiconductor, or an impurity which inhibits the flow of carriers does not exist at interfaces between the layers. If impurities are mixed between the oxide semiconductor films stacked, the continuity of the energy band is lost and carriers disappear by a trap or recombination.

Note that FIG. 22A illustrates the case where the Ec of the oxide semiconductor film 367a and the Ec of the oxide semiconductor film 367c are equal to each other; however, they may be different from each other.

As illustrated in FIG. 22A, the oxide semiconductor film 367b serves as a well and a channel of the transistor 392 is formed in the oxide semiconductor film 367b. Note that since the energies at the bottoms of the conduction bands are changed continuously in the oxide semiconductor films 367a, 367b, and 367c, a channel in the well structure having a U shape can also be referred to as a buried channel.

As illustrated in FIG. 22B, the energies at the bottoms of the conduction bands are changed continuously in the oxide semiconductor films 367b and 367c.

As illustrated in FIG. 22B, the oxide semiconductor film 367b serves as a well and a channel of the transistor 393 is formed in the oxide semiconductor film 367b.

The transistor 392 illustrated in FIGS. 20A to 20C includes the oxide semiconductor films 367a and 367c containing one or more metal elements forming the semiconductor film 367b; therefore, interface states are not easily formed at the interface between the oxide semiconductor film 367a and the oxide semiconductor film 367b and the interface between the oxide semiconductor film 367c and the oxide semiconductor film 367b. Thus, with the oxide semiconductor films 367a and 367c, variation or change in the electrical characteristics of the transistor, such as a threshold voltage, can be reduced.

The transistor 393 illustrated in FIGS. 21A to 21C includes the oxide semiconductor film 367c containing one or more metal elements forming the semiconductor film 367b; therefore, an interface state is not easily formed at the interface between the oxide semiconductor film 367c and the oxide semiconductor film 367b. Thus, with the oxide semiconductor film 367c, variation or change in the electrical characteristics of the transistor, such as a threshold voltage, can be reduced.

Structure Example 4 of Transistor

Next, another structure of the transistor included in the light-emitting device is described with reference to FIGS. 23A to 23C and FIG. 24.

Figure 23A:
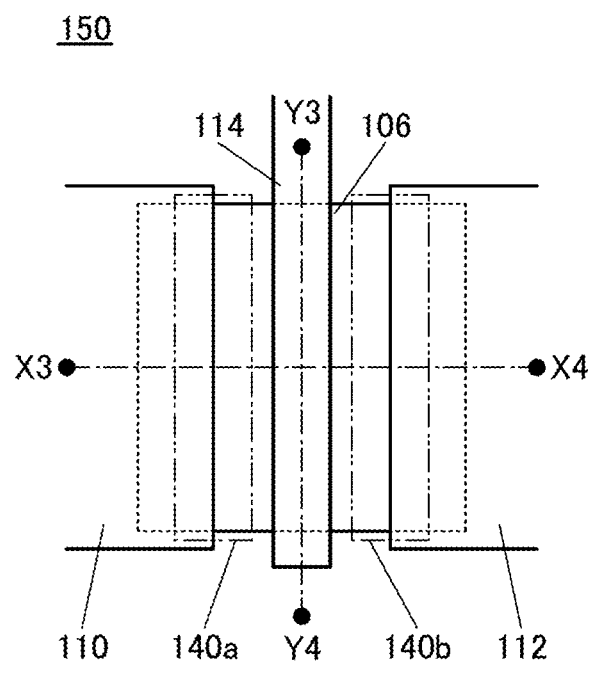
FIGS. 23A to 23C are a top view and cross-sectional views of a transistor.
Figure 23B:
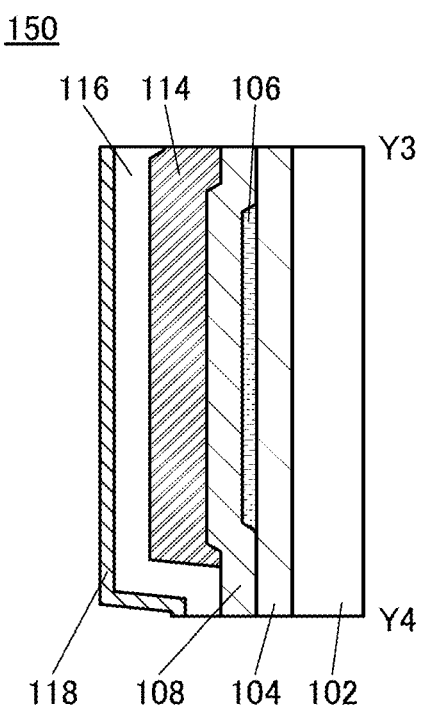
Figure 23C:
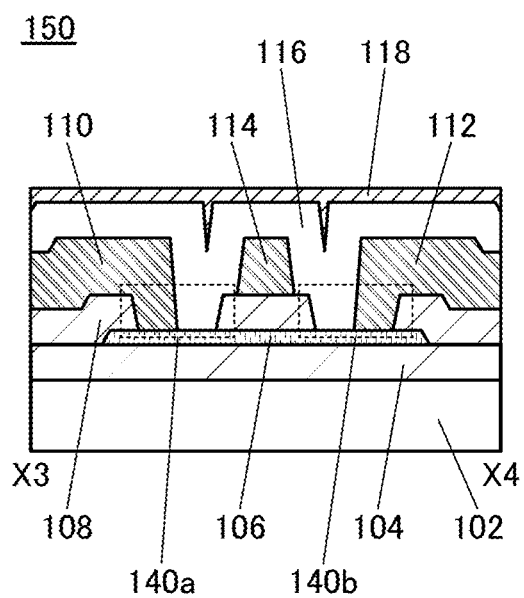

FIGS. 23A to 23C are a top view and cross-sectional views of a transistor 150 included in the light-emitting device. FIG. 23A is a top view of the transistor 150, FIG. 23B is a cross-sectional view taken along dashed-dotted line Y3-Y4 in FIG. 23A, and FIG. 23C is a cross-sectional view taken along dashed-dotted line X3-X4 in FIG. 23A.

The transistor 150 illustrated in FIGS. 23A to 23C includes an oxide semiconductor film 106 over an insulating film 104 formed over a substrate 102, an insulating film 108 in contact with the oxide semiconductor film 106, a conductive film 110 in contact with the oxide semiconductor film 106 in part of an opening 140a formed in the insulating film 108, a conductive film 112 in contact with the oxide semiconductor film 106 in part of an opening 140b formed in the insulating film 108, and a conductive film 114 overlapping with the oxide semiconductor film 106 with the insulating film 108 provided therebetween. Note that insulating films 116 and 118 may be provided over the transistor 150.

Regions of the oxide semiconductor film 106 not overlapping with the conductive films 110 and 112 and the conductive film 114 each include an element which forms an oxygen vacancy. An element which forms oxygen vacancy is described below as an impurity element. Typical examples of an impurity element are hydrogen, boron, carbon, nitrogen, fluorine, aluminum, silicon, phosphorus, chlorine, a rare gas element, and the like. Typical examples of a rare gas element are helium, neon, argon, krypton, and xenon.

When the impurity element is added to the oxide semiconductor film, a bond between a metal element and oxygen in the oxide semiconductor film is cut, whereby an oxygen vacancy is formed. When the impurity element is added to the oxide semiconductor film, oxygen bonded to a metal element in the oxide semiconductor film is bonded to the impurity element, whereby oxygen is detached from the metal element and accordingly an oxygen vacancy is formed. As a result, the oxide semiconductor film has a higher carrier density and thus the conductivity thereof becomes higher.

Figure 24:
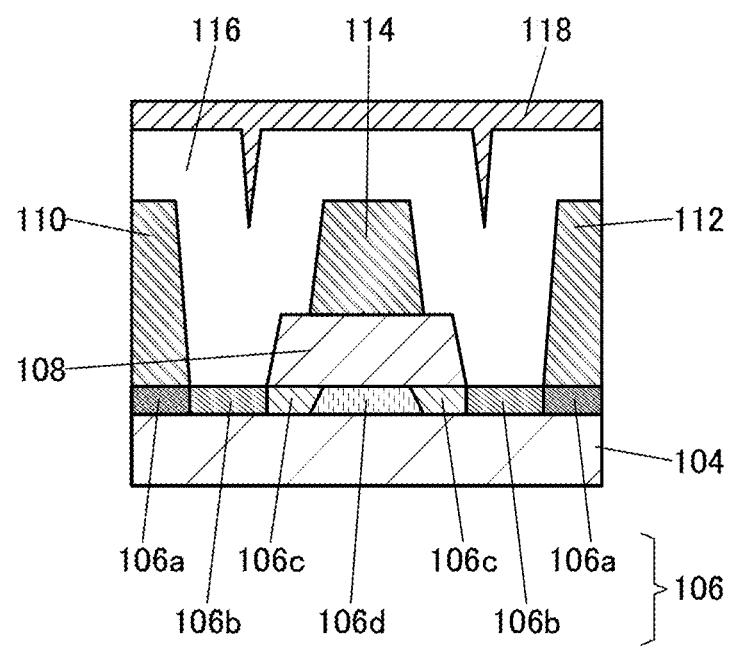
FIG. 24 is a cross-sectional view of the transistor.

Here, FIG. 24 is a partial enlarged view of the oxide semiconductor film 106. As illustrated in FIG. 24, the oxide semiconductor film 106 includes regions 106a in contact with the conductive films 110 and 112, regions 106b in contact with the insulating film 116, and regions 106c and a region 106d overlapping with the insulating film 108.

The region 106a has high conductivity and functions as a source region or a drain region in a manner similar to that of the region 366a illustrated in FIGS. 18A and 18B.

The regions 106b and 106c function as low-resistance regions. The regions 106b and 106c contain an impurity element. Note that the concentrations of the impurity element in the regions 106b are higher than those in the regions 106c. Note that in the case where the conductive film 114 has a tapered side surface, part of the regions 106c may overlap with the conductive film 114.

In the case where a rare gas element is used as the impurity element and the oxide semiconductor film 106 is formed by a sputtering method, the regions 106a to 106d contain the rare gas element, and the concentrations of the rare gas elements in the regions 106b and 106c are higher than those in the regions 106a and 106d. This is due to the fact that in the case where the oxide semiconductor film 106 is formed by a sputtering method, the rare gas element is contained in the oxide semiconductor film 106 because the rare gas element is used as a sputtering gas and the rare gas element is intentionally added to the oxide semiconductor film 106 in order to form oxygen vacancies in the regions 106b and 106c. Note that a rare gas element different from that in the regions 106a and 106d may be added to the regions 106b and 106c.

In the case where the impurity element is boron, carbon, nitrogen, fluorine, aluminum, silicon, phosphorus, or chlorine, only the regions 106b and 106c contain the impurity element. Therefore, the concentrations of the impurity element in the regions 106b and 106c are higher than those in the regions 106a and 106d. Note that the concentrations of the impurity element in the regions 106b and 106c which are measured by SIMS can be greater than or equal to $1 \times 10^{18}$ atoms/cm$^3$ and less than or equal to $1 \times 10^{22}$ atoms/cm$^3$, greater than or equal to $1 \times 10^{19}$ atoms/cm$^3$ and less than or equal to $1 \times 10^{21}$ atoms/cm$^3$, or greater than or equal to $5 \times 10^{19}$ atoms/cm$^3$ and less than or equal to $5 \times 10^{20}$ atoms/cm$^3$.

The concentrations of the impurity element in the regions 106b and 106c are higher than those in the regions 106a and 106d in the case where the impurity elements are hydrogen. Note that the concentrations of hydrogen in the regions 106b and 106c which are measured by SIMS can be greater than or equal to $8 \times 10^{19}$ atoms/cm$^3$, greater than or equal to $1 \times 10^{20}$ atoms/cm$^3$, or greater than or equal to $5 \times 10^{20}$ atoms/cm$^3$.

Since the regions 106b and 106c contain the impurity elements, oxygen vacancies and carrier densities of the regions 106b and 106c are increased. As a result, the regions 106b and 106c have higher conductivity and function as low-resistance regions.

Note that impurity element may be a combination of one or more of hydrogen, boron, carbon, nitrogen, fluorine, aluminum, silicon, phosphorus, and chlorine and one or more of the rare gas elements. In that case, due to interaction between oxygen vacancies formed by the rare gas elements in the regions 106b and 106c and one or more of hydrogen, boron, carbon, nitrogen, fluorine, aluminum, silicon, phosphorus, and chlorine added to the above regions, the conductivity of the regions 106b and 106c might be further increased.

The region 106d functions as a channel.

A region of the insulating film 108 overlapping with the oxide semiconductor film 106 and the conductive film 114 functions as a gate insulating film. In addition, a region of the insulating film 108 overlapping with the oxide semiconductor film 106 and the conductive films 110 and 112 functions as an interlayer insulating film.

The conductive films 110 and 112 function as a source electrode and a drain electrode. The conductive film 114 functions as a gate electrode.

In the manufacturing process of the transistor 150 described in this embodiment, the conductive film 114 functioning as a gate electrode and the conductive films 110 and 112 functioning as a source electrode and a drain electrode are formed at the same time. Therefore, in the transistor 150, the conductive film 114 does not overlap with the conductive films 110 and 112, and parasitic capacitance formed between the conductive film 114 and each of the conductive films 110 and 112 can be reduced. As a result, in the case where a large-sized substrate is used as the substrate 102, signal delays in the conductive films 110 and 112 and the conductive film 114 can be reduced.

In addition, in the transistor 150, the impurity element is added to the oxide semiconductor film 106 using the conductive films 110 and 112 and the conductive film 114 as masks. That is, the low-resistance region can be formed in a self-aligned manner.

The substrate 362 illustrated in FIGS. 17A and 17B can be used as appropriate as the substrate 102.

The insulating film 364 illustrated in FIGS. 17A and 17B can be used as appropriate as the insulating film 104.

The oxide semiconductor films 266 and 366 illustrated in FIGS. 17A and 17B can be used as appropriate as the oxide semiconductor film 106.

The insulating films 272 and 372 illustrated in FIGS. 17A and 17B can be used as appropriate as the insulating film 108.

Since the conductive films 110 and 112 and the conductive film 114 are formed at the same time, they are formed using the same materials and have the same stacked-layer structures.

The conductive films 368 and 370, the conductive film 374, the conductive films 268 and 270, the conductive film 261, and the conductive film 274 illustrated in FIGS. 17A and 17B can be used as appropriate as the conductive films 110 and 112 and the conductive film 114.

The insulating film 116 can be formed with a single layer or a stack using one or more of an oxide insulating film and a nitride insulating film. Note that an oxide insulating film is preferably used as at least a region of the insulating film 116 that is in contact with the oxide semiconductor film 106, in order to improve characteristics of the interface with the oxide semiconductor film 106. An oxide insulating film that releases oxygen by being heated is preferably used as the insulating film 116, in which case oxygen contained in the insulating film 116 can be moved to the oxide semiconductor film 106 by heat treatment.

The insulating film 116 can be formed with a single layer or a stack using, for example, one or more of silicon oxide, silicon oxynitride, silicon nitride oxide, silicon nitride, aluminum oxide, hafnium oxide, gallium oxide, a Ga—Zn oxide, and the like.

It is preferable that the insulating film 118 be a film functioning as a barrier film against hydrogen, water, or the like from the outside. The insulating film 118 can be formed with a single layer or a stack using, for example, one or more of silicon nitride, silicon nitride oxide, aluminum oxide, and the like.

The thicknesses of the insulating films 116 and 118 each can be greater than or equal to 30 nm and less than or equal to 500 nm, or greater than or equal to 100 nm and less than or equal to 400 nm.

Note that in a manner similar to that of the transistor 394 illustrated in FIGS. 17A and 17B, the transistor 150 can have a dual-gate structure in which a conductive film is provided below the insulating film 104 so as to overlap with the oxide semiconductor film 106.

Structure Example 5 of Transistor

Next, another structure of the transistor included in the light-emitting device is described with reference to FIGS. 25A to 25C and FIGS. 26A and 26B.

Figure 25A:
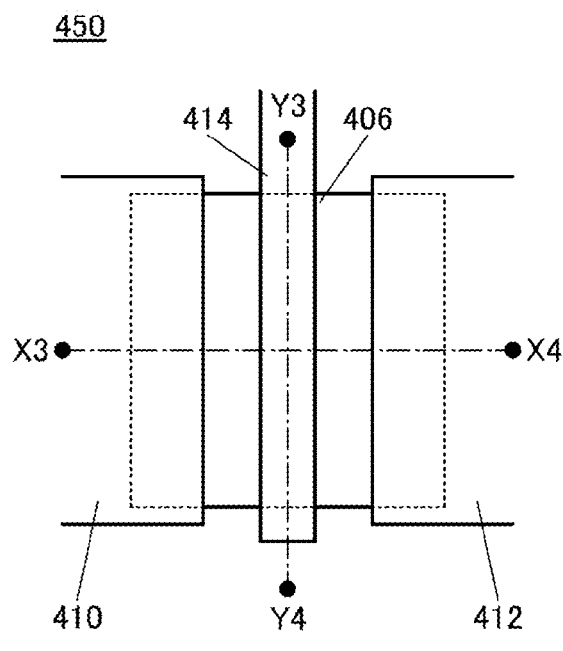
FIGS. 25A to 25C are a top view and cross-sectional views of a transistor.
Figure 25B:
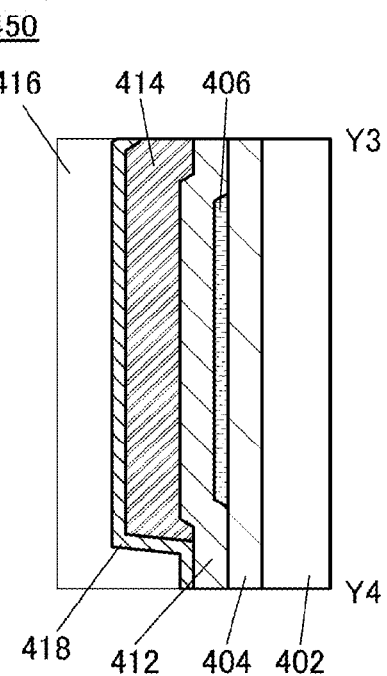
Figure 25C:
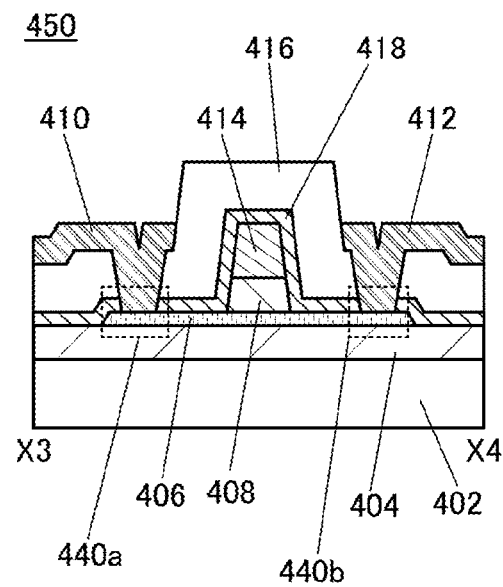

FIGS. 25A to 25C are a top view and cross-sectional views of a transistor 450 included in the light-emitting device. FIG. 25A is a top view of the transistor 450, FIG. 25B is a cross-sectional view taken along dashed-dotted line Y3-Y4 in FIG. 25A, and FIG. 25C is a cross-sectional view taken along dashed-dotted line X3-X4 in FIG. 25A.

The transistor 450 illustrated in FIGS. 25A to 25C includes an oxide semiconductor film 406 over an insulating film 404 formed over a substrate 402, an insulating film 408 in contact with the oxide semiconductor film 406, a conductive film 414 overlapping with the oxide semiconductor film 406 with the insulating film 408 provided therebetween, an insulating film 418 in contact with the oxide semiconductor film 406, an insulating film 416 formed over the insulating film 418, a conductive film 410 in contact with the oxide semiconductor film 406 in an opening 440a formed in the insulating films 418 and 416, and a conductive film 412 in contact with the oxide semiconductor film 406 in an opening 440b formed in the insulating films 418 and 416.

The conductive film 414 of the transistor 450 functions as a gate electrode. The conductive films 410 and 412 function as a source electrode and a drain electrode.

Regions of the oxide semiconductor film 406 not overlapping with the conductive films 410 and 412 and the conductive film 414 each include an element which forms an oxygen vacancy. An element which forms oxygen vacancy is described below as an impurity element. Typical examples of an impurity element are hydrogen, boron, carbon, nitrogen, fluorine, aluminum, silicon, phosphorus, chlorine, a rare gas element, and the like. Typical examples of a rare gas element are helium, neon, argon, krypton, and xenon.

When the impurity element is added to the oxide semiconductor film, a bond between a metal element and oxygen in the oxide semiconductor film is cut, whereby an oxygen vacancy is formed. When the impurity element is added to the oxide semiconductor film, oxygen bonded to a metal element in the oxide semiconductor film is bonded to the impurity element, whereby oxygen is detached from the metal element and accordingly an oxygen vacancy is formed. As a result, the oxide semiconductor film has a higher carrier density and thus the conductivity thereof becomes higher.

Figure 26A:
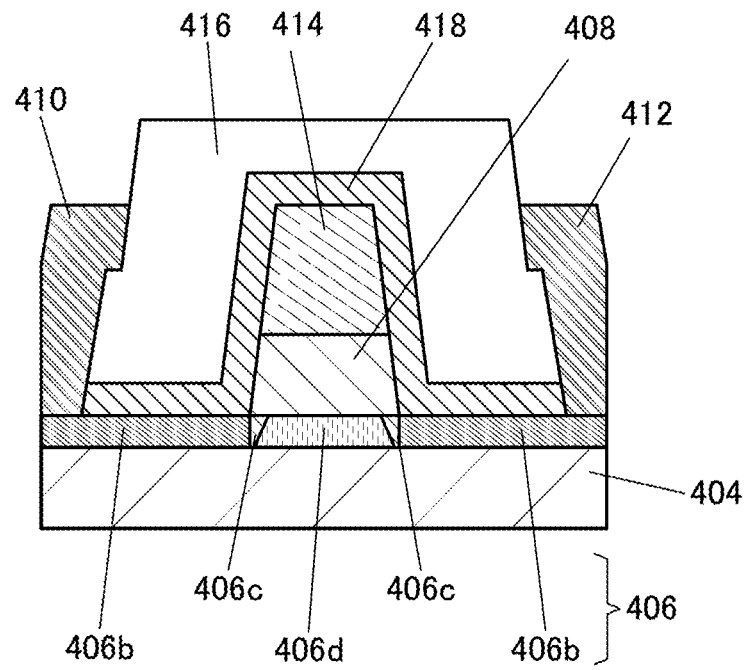
FIGS. 26A and 26B are each a cross-sectional view of a transistor.

Here, FIG. 26A is a partial enlarged view of the oxide semiconductor film 406. As illustrated in FIG. 26A, the oxide semiconductor film 406 includes a region 406b in contact with the conductive films 410 and 412 or the insulating film 418 and a region 406d in contact with the insulating film 408. Note that in the case where the conductive film 414 has a tapered side surface, the oxide semiconductor film 406 may include a region 406c overlapping with a tapered portion of the conductive film 414.

The region 406b functions as a low-resistance region. The region 406b contains at least a rare gas element and hydrogen as impurity elements. Note that in the case where the conductive film 414 has a tapered side surface, the impurity element is added to the region 406c through the tapered portion of the conductive film 414; therefore, the region 406c contains the impurity element, though the concentration of the rare gas element which is an example of the impurity element of the region 406c is lower than that in the region 406b. With the regions 406c, source-drain breakdown voltage of the transistor can be increased.

In the case where the oxide semiconductor film 406 is formed by a sputtering method, the regions 406b to 406d each contain the rare gas element, and the concentrations of the rare gas elements in the regions 406b and 406c are higher than those in the region 406d. This is due to the fact that in the case where the oxide semiconductor film 406 is formed by a sputtering method, the rare gas element is contained in the oxide semiconductor film 406 because the rare gas element is used as a sputtering gas and the rare gas element is intentionally added to the oxide semiconductor film 406 in order to form oxygen vacancies in the regions 406b and 406c. Note that a rare gas element different from that in the region 406d may be added to the regions 406b and 406c.

Since the region 406b is in contact with the insulating film 418, the concentration of hydrogen in the region 406b is higher than that in the region 406d. In addition, in the case where hydrogen is diffused from the region 406b to the region 406c, the concentration of hydrogen in the region 406c is higher than that in the region 406d. However, the concentration of hydrogen in the region 406b is higher than that in the region 406c.

In the regions 406b and 406c, the concentrations of hydrogen measured by secondary ion mass spectrometry (SIMS) can be greater than or equal to $8 \times 10^{19}$ atoms/cm$^3$, greater than or equal to $1 \times 10^{20}$ atoms/cm$^3$, or greater than or equal to $5 \times 10^{20}$ atoms/cm$^3$. Note that the concentration of hydrogen in the region 406d which is measured by secondary ion mass spectrometry can be less than or equal to $5 \times 10^{19}$ atoms/cm$^3$, less than or equal to $1 \times 10^{19}$ atoms/cm$^3$, less than or equal to $5 \times 10^{18}$ atoms/cm$^3$, less than or equal to $1 \times 10^{18}$ atoms/cm$^3$, less than or equal to $5 \times 10^{17}$ atoms/cm$^3$, or less than or equal to $1 \times 10^{16}$ atoms/cm$^3$.

In the case where boron, carbon, nitrogen, fluorine, aluminum, silicon, phosphorus, or chlorine is added to the oxide semiconductor film 406 as an impurity element, only the regions 406b and 406c contain the impurity element. Therefore, the concentrations of the impurity element in the regions 406b and 406c are higher than that in the region 406d. Note that the concentrations of the impurity element in the regions 406b and 406c which are measured by secondary ion mass spectrometry can be greater than or equal to $1 \times 10^{18}$ atoms/cm$^3$ and less than or equal to $1 \times 10^{22}$ atoms/cm$^3$, greater than or equal to $1 \times 10^{19}$ atoms/cm$^3$ and less than or equal to $1 \times 10^{21}$ atoms/cm$^3$, or greater than or equal to $5 \times 10^{19}$ atoms/cm$^3$ and less than or equal to $5 \times 10^{20}$ atoms/cm$^3$.

The regions 406b and 406c have higher concentrations of hydrogen and larger amounts of oxygen vacancies due to addition of the rare gas element than the region 406d. Therefore, the regions 406b and 406c have higher conductivity and function as low-resistance regions. The resistivity of the regions 406b and 406c can be typically greater than or equal to $1 \times 10^{-3}$ Ωcm and less than $1 \times 10^{4}$ Ωcm, or greater than or equal to $1 \times 10^{-3}$ Ωcm and less than $1 \times 10^{-1}$ Ωcm.

Note that when the amount of hydrogen in each of the regions 406b and 406c is the same as or smaller than the amount of oxygen vacancies therein, hydrogen is easily captured by oxygen vacancies and is less likely to be diffused to the region 406d serving as a channel. As a result, a transistor having normally-off characteristics can be obtained.

The region 406d functions as a channel.

Figure 26B:
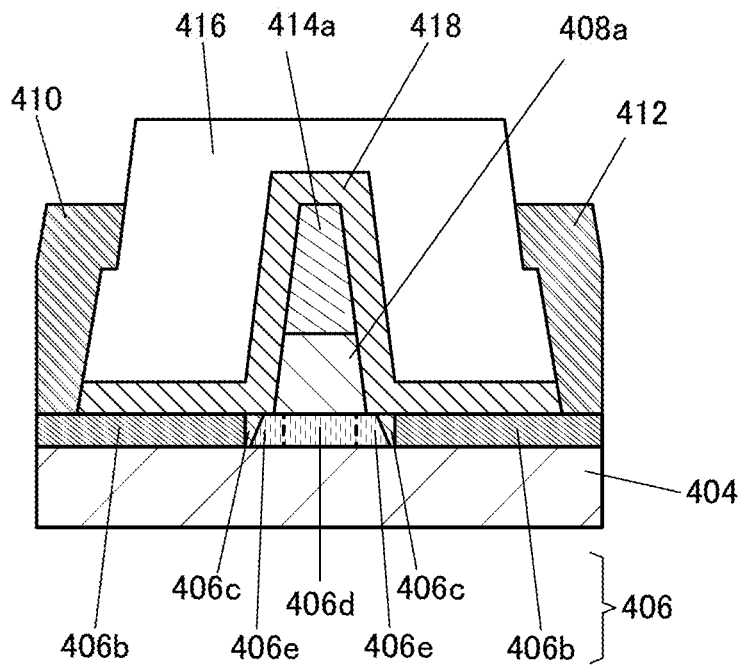

In addition, after the impurity element is added to the oxide semiconductor film 406 using the conductive film 414 as a mask, the area of the conductive film 414 when seen from the above may be reduced (see FIG. 26B). More specifically, after the impurity element is added to the oxide semiconductor film 406, slimming process is performed on a mask (e.g., a photoresist) over the conductive film 414. Then, the conductive film 414 and the insulating film 408 are etched using the mask. Through this step, a conductive film 414a and an insulating film 408a illustrated in FIG. 26B can be formed. As the slimming process, an ashing process using an oxygen radical or the like can be employed, for example.

As a result, an offset region 406e is formed between the region 406c and the region 406d serving as a channel in the oxide semiconductor film 406. Note that the length of the offset region 406e in the channel length direction is set to be less than 0.1 μm, whereby a decrease in the on-state current of the transistor can be suppressed.

The substrate 362 illustrated in FIGS. 17A and 17B can be used as appropriate as the substrate 402 illustrated in FIGS. 25A to 25C.

The insulating film 364 illustrated in FIGS. 17A and 17B can be used as appropriate as the insulating film 404 illustrated in FIGS. 25A to 25C.

The oxide semiconductor films 266 and 366 illustrated in FIGS. 17A and 17B can be used as appropriate as the oxide semiconductor film 406 illustrated in FIGS. 25A to 25C.

The insulating films 272 and 372 illustrated in FIGS. 17A and 17B can be used as appropriate as the insulating film 408 illustrated in FIGS. 25A to 25C.

The conductive films 368 and 370, the conductive film 374, the conductive films 268 and 270, the conductive film 261, and the conductive film 274 illustrated in FIGS. 17A and 17B can be used as appropriate as the conductive films 410 and 412 and the conductive film 414 illustrated in FIGS. 25A to 25C.

The insulating film 116 illustrated in FIGS. 23A to 23C can be used as appropriate as the insulating film 416 illustrated in FIGS. 25A to 25C.

The insulating film 376 illustrated in FIGS. 17A and 17B can be used as appropriate as the insulating film 418 illustrated in FIGS. 25A to 25C.

The thicknesses of the insulating films 416 and 418 each can be greater than or equal to 30 nm and less than or equal to 500 nm, or greater than or equal to 100 nm and less than or equal to 400 nm.

In the transistor 450, the conductive film 414 does not overlap with the conductive films 410 and 412, and parasitic capacitance formed between the conductive film 414 and each of the conductive films 410 and 412 can be reduced. As a result, in the case where a large-sized substrate is used as the substrate 402, signal delays in the conductive films 410 and 412 and the conductive film 414 can be reduced.

In addition, in the transistor 450, the impurity element is added to the oxide semiconductor film 406 using the conductive film 414 as a mask. That is, the low-resistance region can be formed in a self-aligned manner.

Note that in a manner similar to that of the transistor 394 illustrated in FIGS. 17A and 17B, the transistor 450 can have a dual-gate structure in which a conductive film is provided below the insulating film 404 so as to overlap with the oxide semiconductor film 406.

The structure described above in this embodiment can be combined as appropriate with any of the structures described in the other embodiments.

Embodiment 3

In this embodiment, modified examples of the transistors used in the pixel portion and the driver circuit of the light-emitting device of one embodiment of the present invention will be described with reference to FIGS. 27A to 27F, FIGS. 28A to 28F, and FIGS. 29A to 29E. A transistor illustrated in FIGS. 27A to 27F includes an oxide semiconductor film 828 formed over an insulating film 824 over a substrate 821, an insulating film 837 in contact with the oxide semiconductor film 828, and a conductive film 840 which is in contact with the insulating film 837 and overlaps with the oxide semiconductor film 828. Note that the insulating film 837 functions as a gate insulating film. The conductive film 840 functions as a gate electrode.

In addition, the transistor includes an insulating film 846 in contact with the oxide semiconductor film 828 and an insulating film 847 in contact with the insulating film 846. Moreover, the transistor includes conductive films 856 and 857 in contact with the oxide semiconductor film 828 in openings formed in the insulating films 846 and 847. Note that the conductive films 856 and 857 function as a source electrode and a drain electrode. Furthermore, an insulating film 862 in contact with the insulating film 847 and the conductive films 856 and 857 is provided.

As the structures of the transistor described in this embodiment and the conductive film and the insulating film in contact with the structures, the structures of the transistor described in the above embodiment and the conductive film and the insulating film in contact with the structures can be used as appropriate.

Figure 27A:
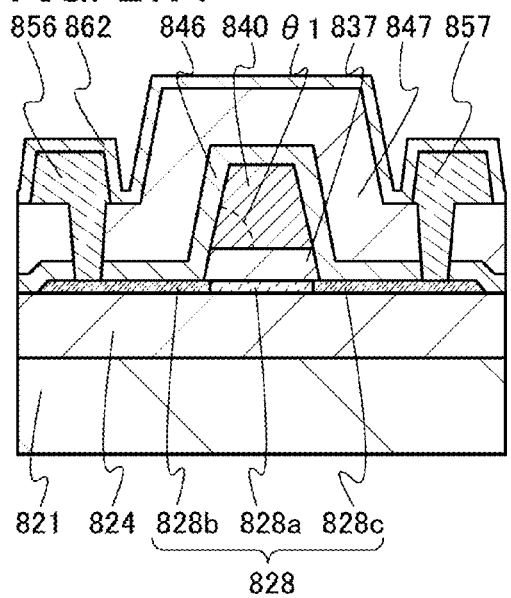
FIGS. 27A to 27F are each a cross-sectional view of a transistor.

In the transistor illustrated in FIG. 27A, the oxide semiconductor film 828 includes a region 828a overlapping with the conductive film 840 and regions 828b and 828c containing an impurity element. The regions 828b and 828c are formed so that the region 828a is provided therebetween. The conductive films 856 and 857 are in contact with the regions 828b and 828c, respectively. The region 828a functions as a channel region. The regions 828b and 828c have lower resistivity than the region 828a and can be referred to as low resistance regions. The regions 828b and 828c function as a source region and a drain region.

Figure 27B:
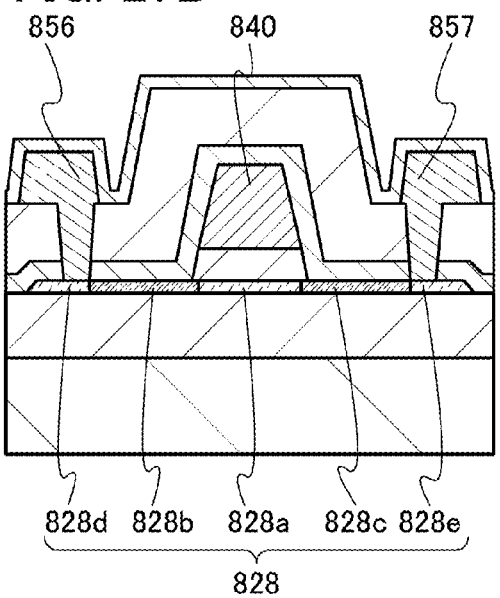

Alternatively, as in the transistor illustrated in FIG. 27B, an impurity element is not necessarily added to regions 828d and 828e of the oxide semiconductor film 828 which are in contact with the conductive films 856 and 857, respectively. In this case, the regions 828b and 828c containing an impurity element are provided between the region 828a and the regions 828d and 828e in contact with the conductive films 856 and 857. The regions 828d and 828e have conductivity when the voltage is applied to the conductive films 856 and 857; thus, the regions 828d and 828e function as a source region and a drain region.

Note that the transistor illustrated in FIG. 27B can be formed in such a manner that after the conductive films 856 and 857 are formed, an impurity element is added to the oxide semiconductor film using the conductive film 840 and the conductive films 856 and 857 as masks.

An end portion of the conductive film 840 may have a tapered shape. That is, the angle θ1 formed between a surface where the insulating film 837 and the conductive film 840 are in contact with each other and a side surface of the conductive film 840 may be less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°. When the angle θ1 is less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°, the coverage of the side surfaces of the insulating film 837 and the conductive film 840 with the insulating film 846 can be improved.

Next, modification examples of the regions 828b and 828c are described. FIGS. 27C to 27F are each an enlarged view of the vicinity of the oxide semiconductor film 828 illustrated in FIG. 27A. The channel length L indicates a distance between a pair of regions containing an impurity element.

Figure 27C:
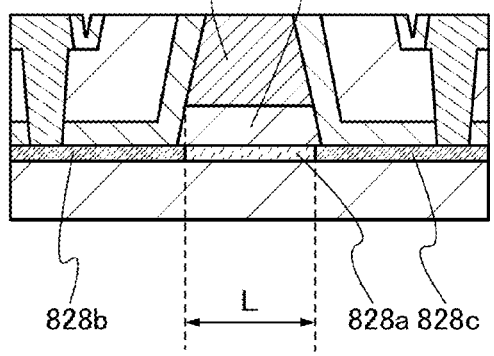

As illustrated in FIG. 27C in a cross-sectional view in the channel length direction, the boundaries between the region 828a and the regions 828b and 828c are aligned or substantially aligned with the end portion of the conductive film 840 with the insulating film 837 provided therebetween. That is, the boundaries between the region 828a and the regions 828b and 828c are aligned or substantially aligned with the end portion of the conductive film 840, when seen from the above.

Figure 27D:
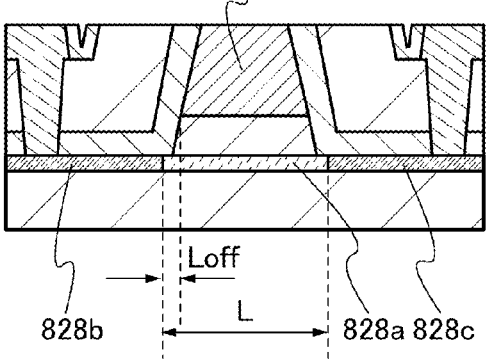

Alternatively, as illustrated in FIG. 27D in a cross-sectional view in the channel length direction, the region 828a has a region that does not overlap with the conductive film 840. The region functions as an offset region. The length of the offset region in the channel length direction is referred to as $L_{off}$. When a plurality of offset regions are provided, $L_{off}$ indicates the length of one offset region. Note that $L_{off}$ is included in the channel length L. Note that $L_{off}$ is smaller than 20%, smaller than 10%, smaller than 5%, or smaller than 2% of the channel length L.

Figure 27E:
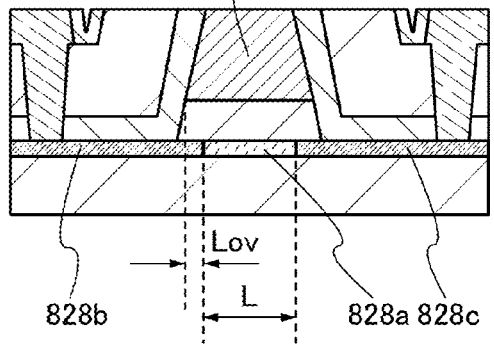

Alternatively, as illustrated in FIG. 27E in a cross-sectional view in the channel length direction, the regions 828b and 828c each have a region overlapping with the conductive film 840 with the insulating film 837 provided therebetween. The regions function as an overlap region. The overlap region in the channel length direction is referred to as $L_{ov}$. Note that $L_{ov}$ is smaller than 20%, smaller than 10%, smaller than 5%, or smaller than 2% of the channel length L.

Figure 27F:
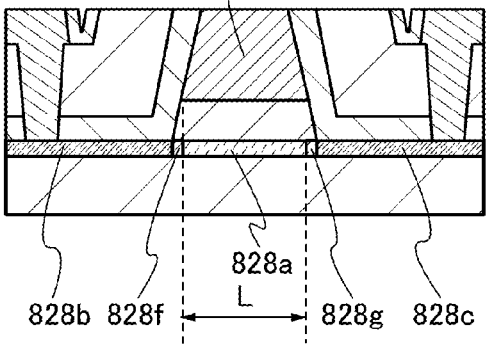

Alternatively, as illustrated in FIG. 27F in a cross-sectional view in the channel length direction, a region 828f is provided between the region 828a and the region 828b, and a region 828g is provided between the region 828a and the region 828c. The regions 828f and 828g have lower concentrations of an impurity element and higher resistivity than the regions 828b and 828c. Although the regions 828f and 828g overlap with the insulating film 837 in this case, they may overlap with the insulating film 837 and the conductive film 840.

Note that in FIGS. 27C to 27F, the transistor illustrated in FIG. 27A is described; however, the transistor illustrated in FIG. 27B can employ any of the structures in FIGS. 27C to 27F as appropriate.

Figure 28A:
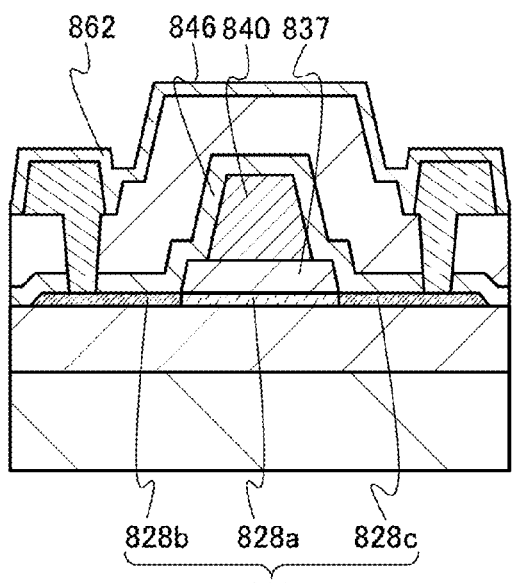
FIGS. 28A to 28F are each a cross-sectional view of a transistor.

In the transistor illustrated in FIG. 28A, the end portion of the insulating film 837 is positioned on an outer side than the end portion of the conductive film 840. That is, the insulating film 837 has a shape such that the end portion extends beyond the end portion of the conductive film 840. The insulating film 846 can be kept away from the region 828a; thus, entry of nitrogen, hydrogen, and the like contained in the insulating film 846 into the region 828a functioning as a channel region can be suppressed.

Figure 28B:
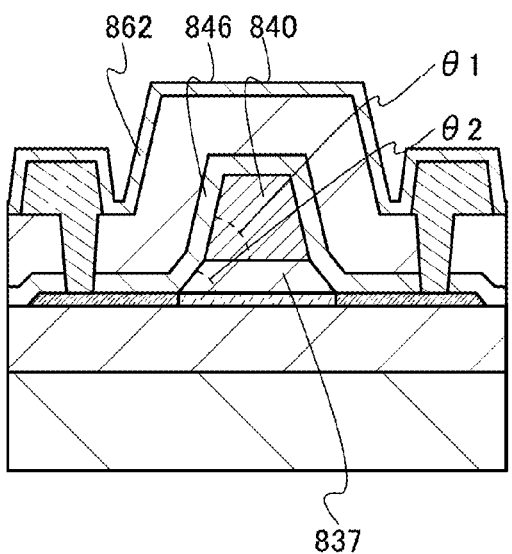

In the transistor illustrated in FIG. 28B, the insulating film 837 and the conductive film 840 each have a tapered shape, and the angles of the tapered shapes are different from each other. In other words, the angle θ1 formed between a surface where the insulating film 837 and the conductive film 840 are in contact with each other and a side surface of the conductive film 840 is different from an angle θ2 formed between a surface where the oxide semiconductor film 828 and the insulating film 837 are in contact with each other and the side surface of the insulating film 837. The angle θ2 may be less than 90°, greater than or equal to 30° and less than or equal to 85°, or greater than or equal to 45° and less than or equal to 70°. For example, when the angle θ2 is less than the angle θ1, the coverage with the insulating film 846 is improved. In contrast, when the angle θ2 is larger than angle θ1, the transistor can be miniaturized.

Next, modification examples of the regions 828b and 828c are described with reference to FIGS. 28C to 28F. FIGS. 28C to 28F are each an enlarged view of the vicinity of the oxide semiconductor film 828 illustrated in FIG. 28A.

Figure 28C:
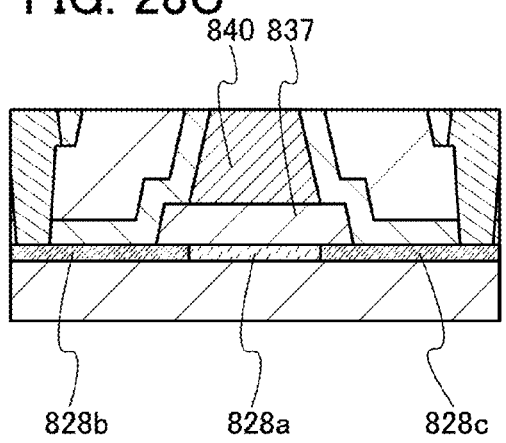

As illustrated in FIG. 28C in a cross-sectional view in the channel length direction, the boundaries between the region 828a and the regions 828b and 828c are aligned or substantially aligned with the end portion of the conductive film 840 with the insulating film 837 provided therebetween. That is, when seen from the above, the boundaries between the region 828a and the regions 828b and 828c are aligned or substantially aligned with the end portion of the conductive film 840.

Figure 28D:
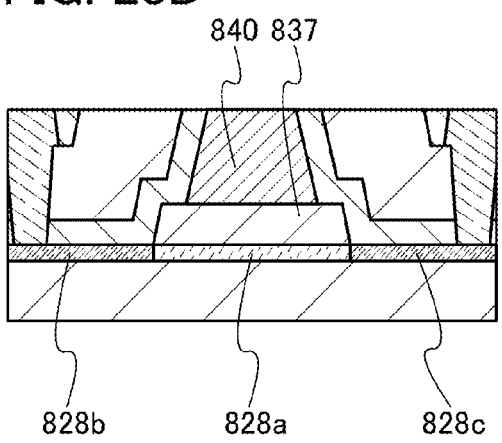

Alternatively, as illustrated in FIG. 28D in a cross-sectional view in the channel length direction, the region 828a has a region that does not overlap with the conductive film 840. The region functions as an offset region. That is, when seen from the above, the end portions of the regions 828b and 828c are aligned or substantially aligned with the end portion of the insulating film 837 and do not overlap with the conductive film 840.

Figure 28E:
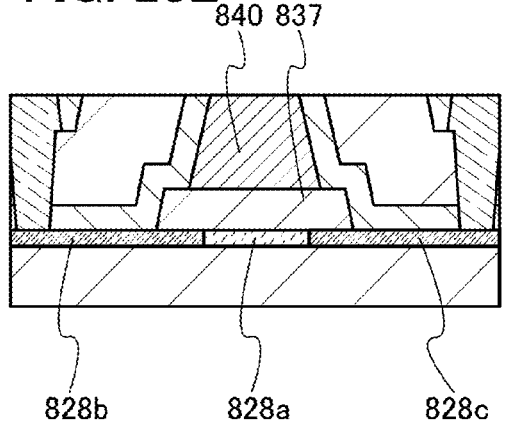

Alternatively, as illustrated in FIG. 28E in a cross-sectional view in the channel length direction, the regions 828b and 828c each have a region overlapping with the conductive film 840 with the insulating film 837 provided therebetween. Such a region is referred to as an overlap region. That is, when seen from the above, the end portions of the regions 828b and 828c overlap with the conductive film 840.

Figure 28F:
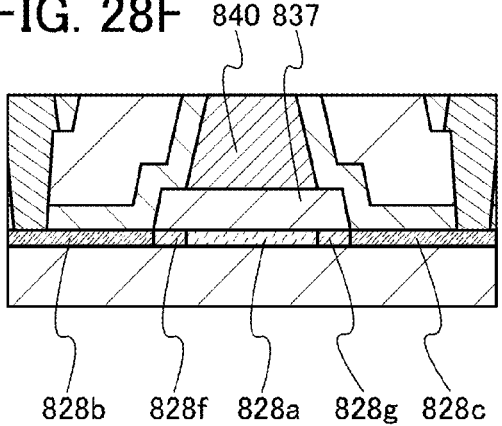

As illustrated in FIG. 28F in a cross-sectional view in the channel length direction, the region 828f is provided between the region 828a and the region 828b, and the region 828g is provided between the region 828a and the region 828c. The regions 828f and 828g have lower concentrations of an impurity element and higher resistivity than the regions 828b and 828c. Although the regions 828f and 828g overlap with the insulating film 837 in this case, they may overlap with the insulating film 837 and the conductive film 840.

Note that in FIGS. 28C to 28F, the transistor illustrated in FIG. 28A is described; however, the transistor illustrated in FIG. 28B can employ any of the structures in FIGS. 28C to 28F as appropriate.

Figure 29A:
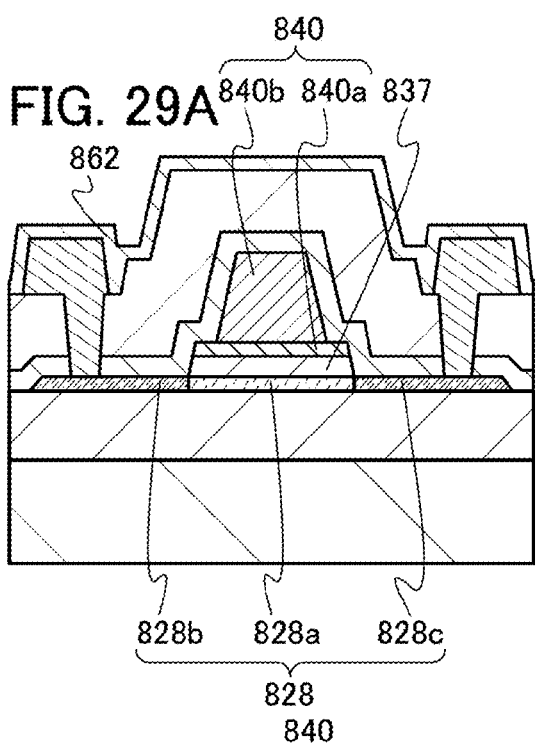
FIGS. 29A to 29E are each a cross-sectional view of a transistor.

In the transistor illustrated in FIG. 29A, the conductive film 840 has a stacked-layer structure including a conductive film 840a in contact with the insulating film 837 and a conductive film 840b in contact with the conductive film 840a. The end portion of the conductive film 840a is positioned on an outer side than the end portion of the conductive film 840b. That is, the conductive film 840a has such a shape that the end portion extends beyond the end portion of the conductive film 840b.

Next, modification examples of the regions 828b and 828c are described. FIGS. 29B to 29E are each an enlarged view of the vicinity of the oxide semiconductor film 828 illustrated in FIG. 29A.

Figure 29B:
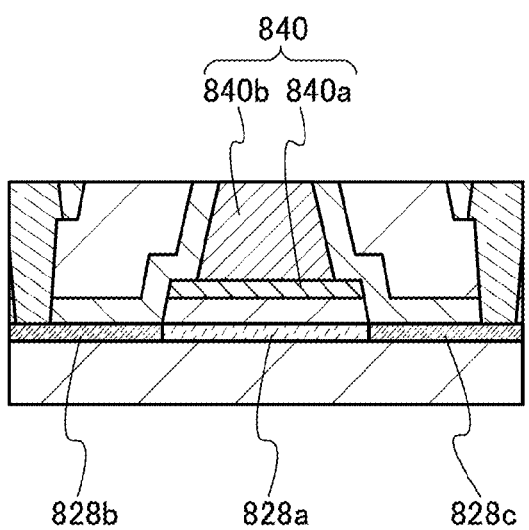

As illustrated in FIG. 29B in a cross-sectional view in the channel length direction, the boundaries between the region 828a and the regions 828b and 828c are aligned or substantially aligned with the end portion of the conductive film 840a in the conductive film 840 with the insulating film 837 provided therebetween. That is, when seen from the above, the boundaries between the region 828a and the regions 828b and 828c are aligned or substantially aligned with the end portion of the conductive film 840.

Figure 29C:
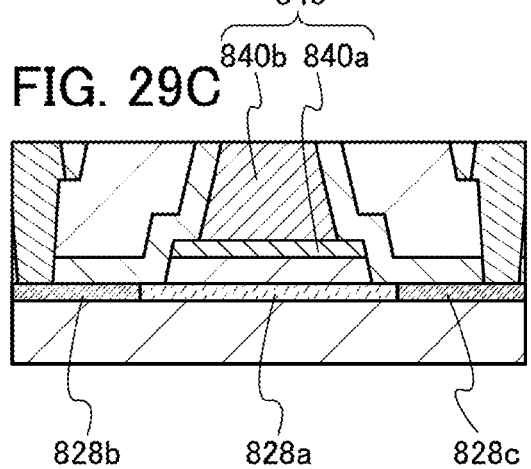

Alternatively, as illustrated in FIG. 29C in a cross-sectional view in the channel length direction, the region 828a has a region that does not overlap with the conductive film 840. The region functions as an offset region. That is, when seen from the above, the end portions of the regions 828b and 828c do not overlap with the conductive film 840a.

Figure 29D:
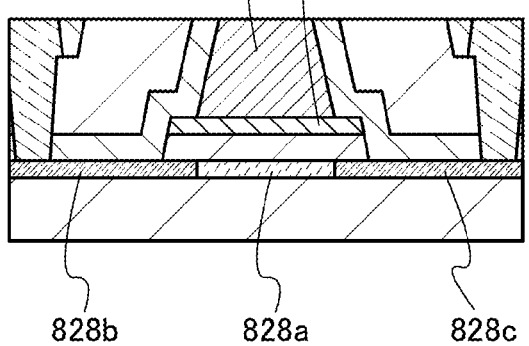

As illustrated in FIG. 29D in a cross-sectional view in the channel length direction, the regions 828b and 828c each have a region overlapping with the conductive film 840, specifically the conductive film 840a. Such a region is referred to as an overlap region. That is, when seen from the above, the end portions of the regions 828b and 828c overlap with the conductive film 840a.

Figure 29E:
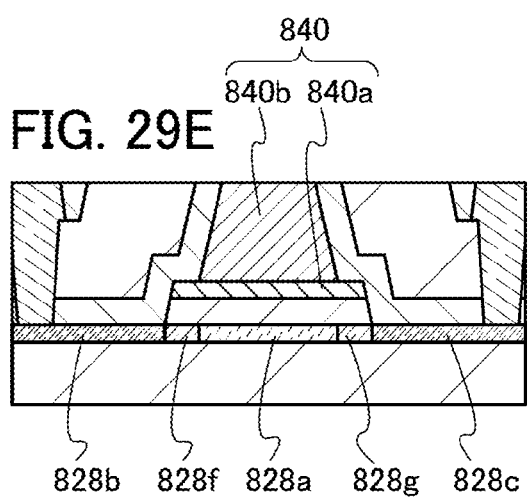

As illustrated in FIG. 29E in a cross-sectional view in the channel length direction, the region 828f is provided between the region 828a and the region 828b, and the region 828g is provided between the region 828a and the region 828c. The impurity element is added to the regions 828f and 828g through the conductive film 840a; thus, the regions 828f and 828g have lower concentrations of an impurity element and higher resistivity than the regions 828b and 828c. Note that the regions 828f and 828g may overlap with the conductive film 840a or the conductive film 840b.

The end portion of the insulating film 837 may be positioned on the outer side than the end portion of the conductive film 840a.

Alternatively, the side surface of the insulating film 837 may be curved.

Alternatively, the insulating film 837 may have a tapered shape. That is, an angle formed between a surface where the oxide semiconductor film 828 and the insulating film 837 are in contact with each other and a side surface of the insulating film 837 may be less than 90°, preferably greater than or equal to 30° and less than 90°.

As described with reference to FIGS. 29A to 29E, the oxide semiconductor film 828 includes the regions 828f and 828g having lower concentrations of impurity elements and higher resistivity than the regions 828b and 828c, whereby the electric field of the drain region can be relaxed. Thus, a deterioration of the transistor due to the electric field of the drain region, such as a shift of the threshold voltage of the transistor, can be inhibited.

The structure described above in this embodiment can be combined as appropriate with any of the structures described in the other embodiments.

Embodiment 4

In this embodiment, examples of a top view and a cross-sectional view of the pixel of the light-emitting device of one embodiment of the present invention will be described.
<Pixel Layout>

Figure 30:
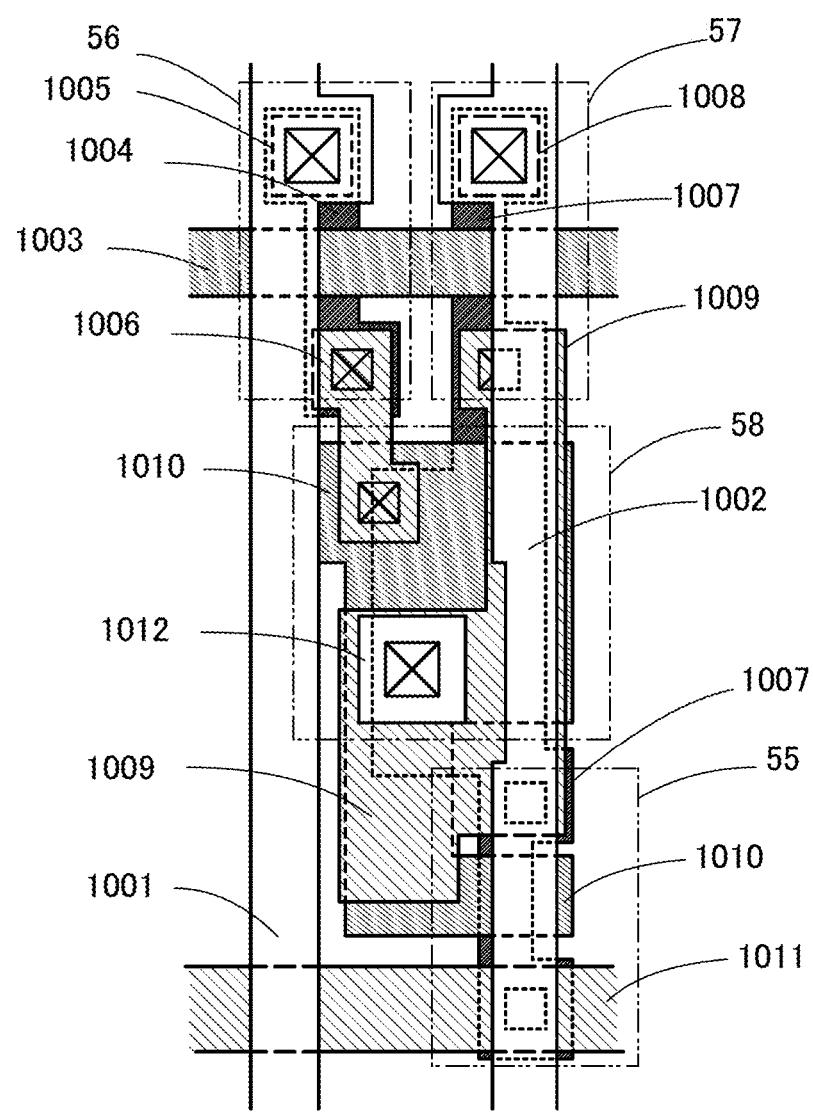
FIG. 30 is a top view of the pixel.

FIG. 30 illustrates an example of a top view of the pixel 11 illustrated in FIG. 1. To clarify the layout of the pixel 11, the insulating films, the pixel electrode, and the light-emitting element 54 are omitted in FIG. 30.

Note that the structures of the transistors 55, 56, and 57 illustrated in FIG. 30 are each assumed to be that of the transistor 450 illustrated in FIGS. 25A to 25C.

The transistor 56 includes a conductive film 1003 functioning as a gate, a semiconductor film 1004, and conductive films 1005 and 1006 functioning as a source and a drain electrically connected to the semiconductor film 1004. The conductive film 1003 functions as the wiring GL. The conductive film 1005 is electrically connected to a conductive film 1001 functioning as the wiring SL through a contact hole.

The transistor 57 includes the conductive film 1003 functioning as a gate, a semiconductor film 1007, and conductive films 1008 and 1009 functioning as a source and a drain electrically connected to the semiconductor film 1007. The conductive film 1008 is electrically connected to a conductive film 1002 functioning as the wiring ML through a contact hole.

The transistor 55 includes a conductive film 1010 functioning as a gate, a semiconductor film 1007, and conductive films 1009 and 1011 functioning as a source and a drain electrically connected to the semiconductor film 1007. The conductive film 1011 functions as the wiring VL.

The capacitor 58 includes the semiconductor film 1007 functioning as a first electrode, the conductive film 1010 functioning as a second electrode, and an insulating film (not illustrated) provided between the semiconductor film 1007 and the conductive film 1010. It is preferable that the resistance of the semiconductor film 1007 be sufficiently reduced so that the semiconductor film 1007 functions as an electrode.

The conductive film 1009 is electrically connected to a conductive film 1013 (not illustrated) functioning as a pixel electrode, through the conductive film 1012. The conductive film 1013 also functions as the anode or the cathode of the light-emitting element 54.

For the conductive film 1013, any of metals, alloys, electrically conductive compounds, and mixtures thereof, and the like can be used. Specific examples are indium oxide-tin oxide (indium tin oxide (ITO)), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti). In addition, an element belonging to Group 1 or Group 2 of the periodic table, for example, an alkali metal such as lithium (Li) or cesium (Cs), an alkaline earth metal such as calcium (Ca) or strontium (Sr), magnesium (Mg), an alloy containing such an element (MgAg, AlLi), a rare earth metal such as europium (Eu) or ytterbium (Yb), an alloy containing such an element, graphene, and the like can be used. The electrode is formed using a material selected from the above as appropriate and formed to an optimum thickness, so that a top-emission structure, a bottom-emission structure, or a dual-emission structure can be selectively formed.

For the light-emitting device of one embodiment of the present invention, it is possible to employ a color filter method in which full-color images are displayed using a combination of a color filter and a light-emitting element that emits light of a single color such as white. Alternatively, a method in which a full-color image is displayed with the use of a plurality of light-emitting elements emitting light with different hues can be employed. This method is referred to as a separate coloring method because EL layers, which are each placed between a pair of electrodes in a light-emitting element, are separately colored with their corresponding colors.

In the separate coloring method, in general, EL layers are separately applied by vapor deposition with the use of a mask such as a metal mask. Thus, the size of pixels depends on the accuracy of separate deposition of the EL layers by vapor deposition. On the other hand, unlike the separate coloring method, EL layers do not need to be separately formed in the color filter method. Accordingly, pixels can be downsized more easily than in the separate coloring method; thus, a high-definition pixel portion can be achieved.

In the top-emission structure, light emitted from a light-emitting element is not blocked by an element such as a wiring, a transistor, or a capacitor, so that the efficiency of light extraction from a pixel can be made higher than that in the bottom-emission structure. Accordingly, the top-emission structure can achieve high luminance even when the value of current supplied to the light-emitting element is reduced, and therefore is advantageous in improving the lifetime of a light-emitting element.

In one embodiment of the present invention, the light-emitting device may have a microcavity (micro optical resonator) structure in which light emitted from an EL layer resonates within a light-emitting element. With a microcavity structure, the light-extraction efficiency of light with a particular wavelength from the light-emitting element can be increased, so that the luminance and the color purity of the pixel portion can be improved.

<Cross-Sectional Structure of Light-Emitting Device>

Figure 31:
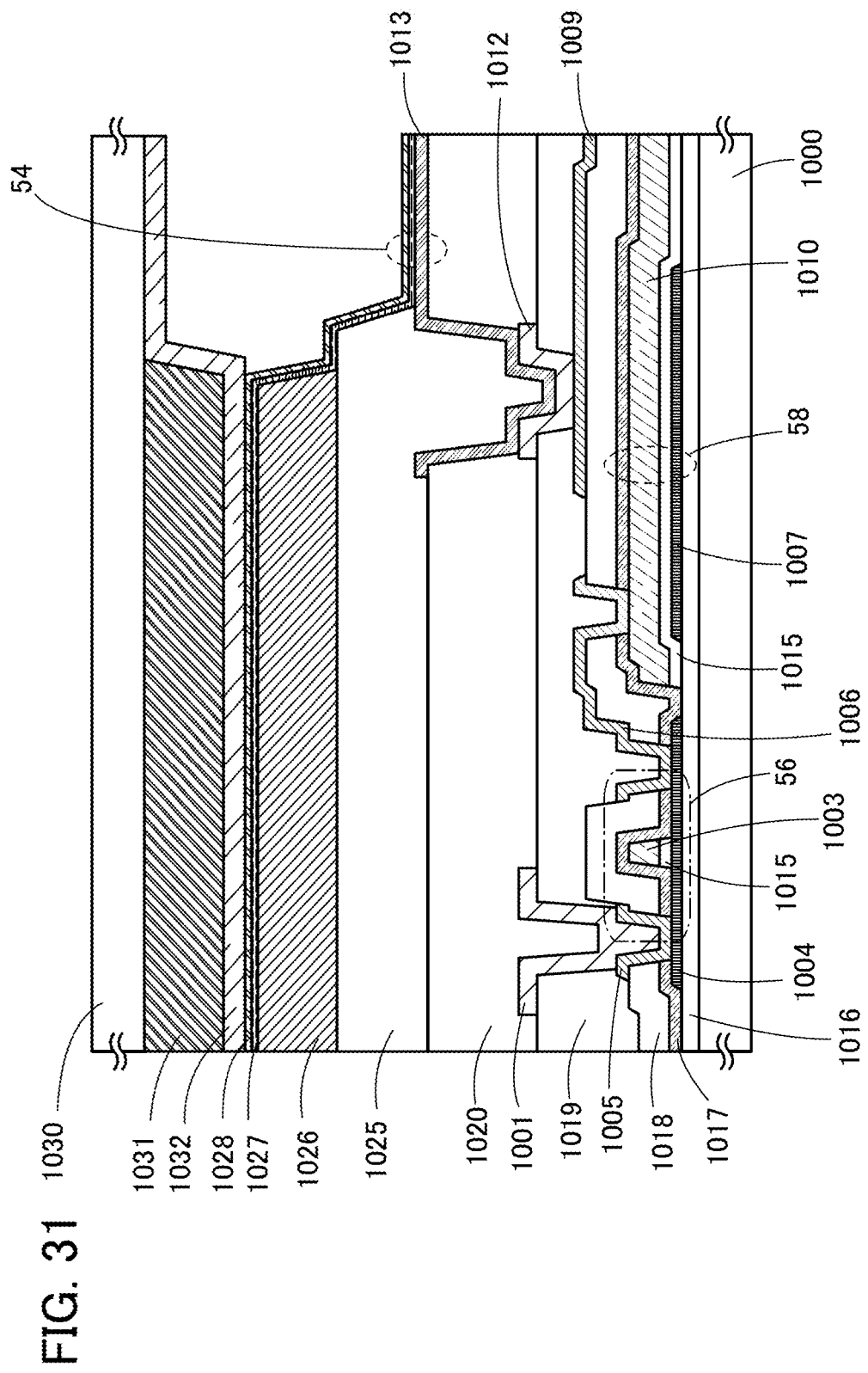
FIG. 31 illustrates a cross-sectional view of a light-emitting device.

FIG. 31 illustrates, as an example, the cross-sectional structure of the pixel portion in the light-emitting device of one embodiment of the present invention. Note that FIG. 31 illustrates the cross-sectional structures of the transistor 56, the capacitor 58, and the light-emitting element 54 of the pixel 11 illustrated in FIG. 2 and FIG. 30.

Specifically, the light-emitting device illustrated in FIG. 31 includes an insulating film 1016 over a substrate 1000, and the transistor 56 and the capacitor 58 over the insulating film 1016. The transistor 56 includes the semiconductor film 1004, an insulating film 1015 over the semiconductor film 1004, the conductive film 1003 overlapping with the semiconductor film 1004 with the insulating film 1015 provided therebetween and functioning as a gate, the conductive film 1005 which is in contact with the semiconductor film 1004 and is provided in an opening formed in an insulating film 1017 and an insulating film 1018, and the conductive film 1006 which is similarly in contact with the semiconductor film 1004 and is provided in the opening formed in the insulating films 1017 and 1018. Note that the conductive films 1005 and 1006 function as a source and a drain of the transistor 56.

The capacitor 58 includes the semiconductor film 1007 functioning as an electrode, the insulating film 1015 over the semiconductor film 1007, and the conductive film 1010 overlapping with the semiconductor film 1007 with the insulating film 1015 provided therebetween and functioning as an electrode.

The insulating film 1015 may be formed with a single layer or a stack of an insulating film containing one or more of aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Note that in this specification, oxynitride contains more oxygen than nitrogen, and nitride oxide contains more nitrogen than oxygen.

In the case where an oxide semiconductor is used for the semiconductor film 1004, it is preferable to use a material that can supply oxygen to the semiconductor film 1004 for the insulating film 1016. By using the material for the insulating film 1016, oxygen contained in the insulating film 1016 can be moved to the semiconductor film 1004, and the amount of oxygen vacancy in the semiconductor film 1004 can be reduced. Oxygen contained in the insulating film 1016 can be moved to the semiconductor film 1004 efficiently by heat treatment performed after the semiconductor film 1004 is formed.

The insulating film 1017 is provided over the semiconductor film 1004 and the conductive films 1003 and 1010; the insulating film 1018 is provided over the insulating film 1017; and the conductive films 1005, 1006, and 1009, and an insulating film 1019 are provided over the insulating film 1018. The conductive films 1001 and 1012 are provided over the insulating film 1019, the conductive film 1001 is electrically connected to the conductive film 1005 in an opening formed in the insulating film 1019, and the conductive film 1012 is electrically connected to the conductive film 1009 in the opening formed in the insulating film 1019.

In the case where an oxide semiconductor is used for the semiconductor film 1004, the insulating film 1017 preferably has a function of blocking oxygen, hydrogen, water, an alkali metal, an alkaline earth metal, and the like. It is possible to prevent outward diffusion of oxygen from the semiconductor film 1004 and entry of hydrogen, water, or the like into the semiconductor film 1004 from the outside by providing the insulating film 1017. The insulating film 1017 can be formed using a nitride insulating film, for example. As the nitride insulating film, a silicon nitride film, a silicon nitride oxide film, an aluminum nitride film, an aluminum nitride oxide film, and the like can be given. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

An insulating film 1020 and the conductive film 1013 are provided over the insulating film 1019 and the conductive films 1001 and 1012, and the conductive film 1013 is electrically connected to the conductive film 1012 in an opening formed in the insulating film 1020. For the detail of the conductive film 1013, the description of the conductive film 1013 in FIG. 30 is referred to.

An insulating film 1025 is provided over the insulating film 1020 and the conductive film 1013. The insulating film 1025 has an opening in a region overlapping with the conductive film 1013. Over the insulating film 1025, an insulating film 1026 is provided in a region different from the opening of the insulating film 1025. An EL layer 1027 and a conductive film 1028 are sequentially stacked over the insulating films 1025 and 1026. A portion in which the conductive films 1013 and 1028 overlap with each other with the EL layer 1027 provided therebetween functions as the light-emitting element 54. One of the conductive films 1013 and 1028 functions as the anode, and the other functions as the cathode.

The light-emitting device includes a substrate 1030 that faces the substrate 1000 with the light-emitting element 54 provided therebetween. A blocking film 1031 having a function of blocking light is provided under the substrate 1030, i.e., a surface of the substrate 1030 that is closer to the light-emitting element 54 is provided with the blocking film 1031. The blocking film 1031 has an opening in a region overlapping with the light-emitting element 54. In the opening overlapping with the light-emitting element 54, a coloring layer 1032 that transmits visible light in a specific wavelength range is provided under the substrate 1030.

Note that the insulating film 1026 is provided to adjust the distance between the light-emitting element 54 and the substrate 1030 and may be omitted in some cases.

Although the top-emission structure is employed in this embodiment in which light of the light-emitting element 54 is extracted from the side opposite to the element substrate, a bottom-emission structure in which light of the light-emitting element 54 is extracted from the element substrate side or a dual-emission structure in which light of the light-emitting element 54 is extracted from both the element substrate side and the side opposite to the element substrate can also be applied to embodiments of the present invention.

The structure described above in this embodiment can be combined as appropriate with any of the structures described in the other embodiments.

Embodiment 5

In this embodiment, a display module and electronic devices that can be formed using the light-emitting device of one embodiment of the present invention will be described with reference to drawings.

<External View of Light-Emitting Device>

Figure 32:
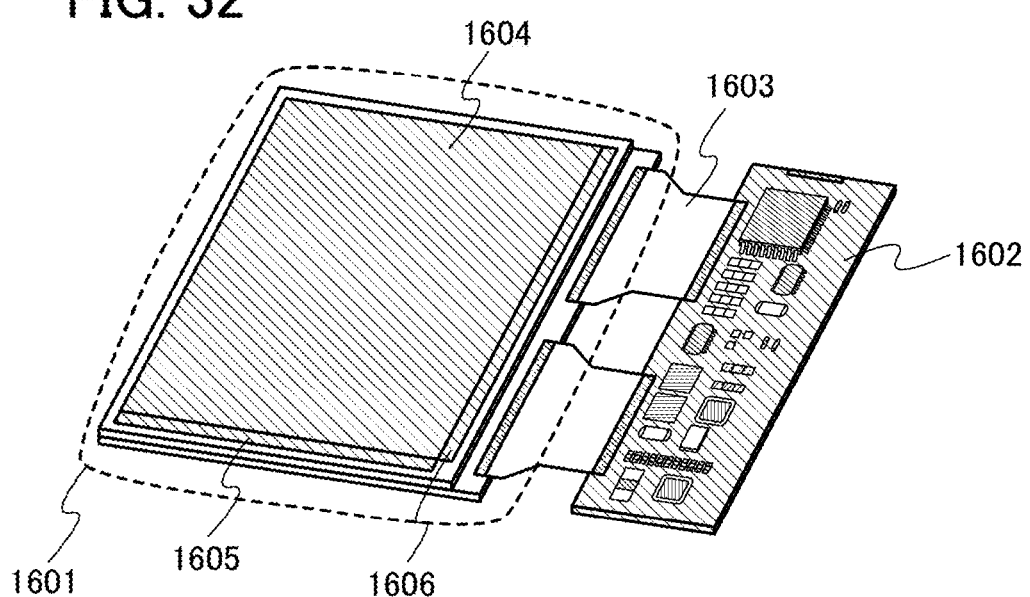
FIG. 32 is a perspective view of a light-emitting device.

FIG. 32 is a perspective view illustrating an example of an external view of the light-emitting device of one embodiment of the present invention. The light-emitting device illustrated in FIG. 32 includes a panel 1601; a circuit board 1602 including a controller, a power supply circuit, an image processing circuit, an image memory, a CPU, and the like; and a connection portion 1603. The panel 1601 includes a pixel portion 1604 including a plurality of pixels, a driver circuit 1605 that selects pixels row by row, and a driver circuit 1606 that controls input of an image signal Sig to the pixels in a selected row.

A variety of signals and power supply potentials are input from the circuit board 1602 to the panel 1601 through the connection portion 1603. As the connection portion 1603, a flexible printed circuit (FPC) or the like can be used. In the case where a COF tape is used as the connection portion 1603, part of circuits in the circuit board 1602 or part of the driver circuit 1605 or the driver circuit 1606 included in the panel 1601 may be formed on a chip separately prepared, and the chip may be electrically connected to the COF tape by a chip-on-film (COF) method.

Structure Example of Electronic Device

The light-emitting device of one embodiment of the present invention can be used for display devices, notebook personal computers, or image reproducing devices provided with recording media (typically, devices which reproduce the content of recording media such as digital versatile discs (DVDs) and have displays for displaying the reproduced images). Other than the above, as an electronic device which can use the light-emitting device of one embodiment of the present invention, cellular phones, portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 33A to 33F illustrate specific examples of these electronic devices.

Figure 33A:
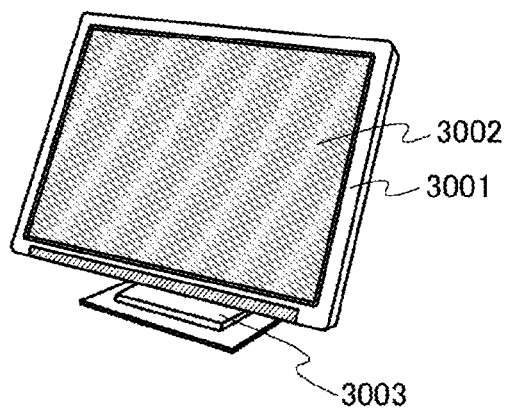
FIGS. 33A to 33F illustrate electronic devices.

FIG. 33A illustrates a display device, which includes a housing 3001, a display portion 3002, a supporting base 3003, and the like. The light-emitting device of one embodiment of the present invention can be used for the display portion 3002. Note that the display device includes all devices for displaying information such as for a personal computer, for receiving TV broadcasting, and for displaying an advertisement.

Figure 33B:
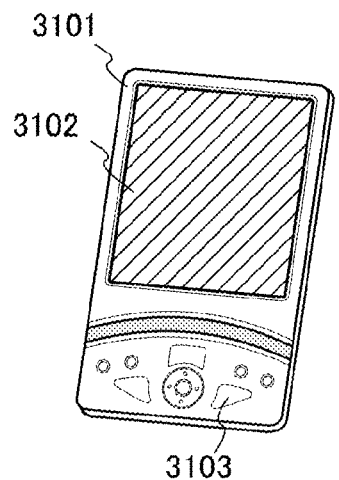

FIG. 33B illustrates a portable information terminal, which includes a housing 3101, a display portion 3102, operation keys 3103, and the like. The light-emitting device of one embodiment of the present invention can be used for the display portion 3102.

Figure 33C:
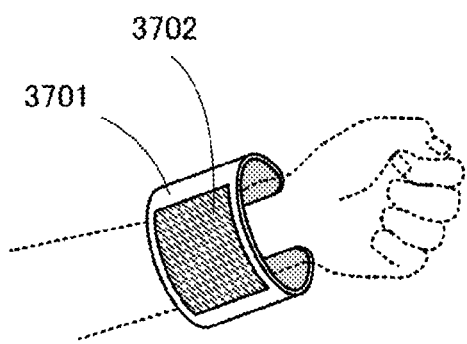

FIG. 33C illustrates a display device, which includes a housing 3701, a display portion 3702, and the like having a curved surface. When a flexible substrate is used for the light-emitting device of one embodiment of the present invention, the light-emitting device can be used for the display portion 3702 supported by the housing 3701 having a curved surface. It is thus possible to provide a user-friendly display device that is flexible and lightweight.

Figure 33D:
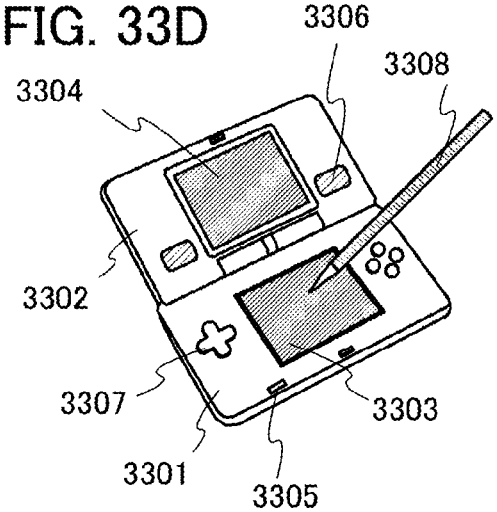

FIG. 33D illustrates a portable game machine, which includes a housing 3301, a housing 3302, a display portion 3303, a display portion 3304, a microphone 3305, a speaker 3306, an operation key 3307, a stylus 3308, and the like. The light-emitting device of one embodiment of the present invention can be used for the display portion 3303 or the display portion 3304. When the light-emitting device of one embodiment of the present invention is used as the display portion 3303 or 3304, it is possible to provide a user-friendly portable game machine with quality that hardly deteriorates. Although the portable game machine in FIG. 33D has the two display portions 3303 and 3304, the number of display portions included in the portable game machine is not limited to two.

Figure 33E:
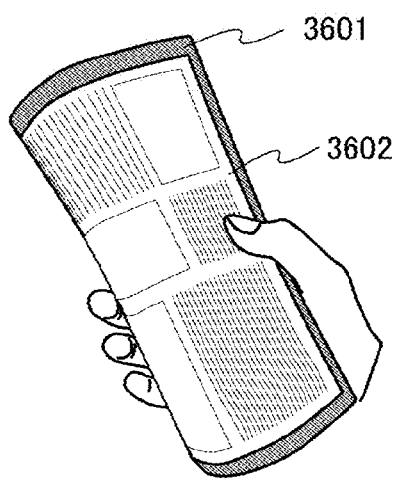

FIG. 33E illustrates an e-book reader, which includes a housing 3601, a display portion 3602, and the like. The light-emitting device of one embodiment of the present invention can be used for the display portion 3602. When a flexible substrate is used, the light-emitting device can have flexibility, so that it is possible to provide a flexible and lightweight e-book reader.

Figure 33F:
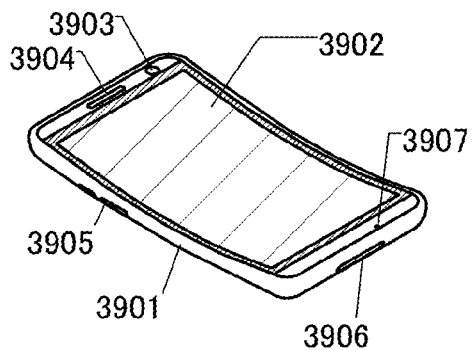

FIG. 33F illustrates a cellular phone, which includes a display portion 3902, a microphone 3907, a speaker 3904, a camera 3903, an external connection portion 3906, and an operation button 3905 in a housing 3901. The light-emitting device of one embodiment of the present invention can be used for the display portion 3902. When the light-emitting device of one embodiment of the present invention is provided over a flexible substrate, the light-emitting device can be used for the display portion 3902 having a curved surface, as illustrated in FIG. 33F.

The structure described above in this embodiment can be combined as appropriate with any of the structures described in the other embodiments.

Embodiment 6

In this embodiment, the structure of an oxide semiconductor which can be used in one embodiment of the present invention and a deposition model thereof will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

<<Structure of Oxide Semiconductor>>

A structure of an oxide semiconductor film is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. In addition, examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 35A:
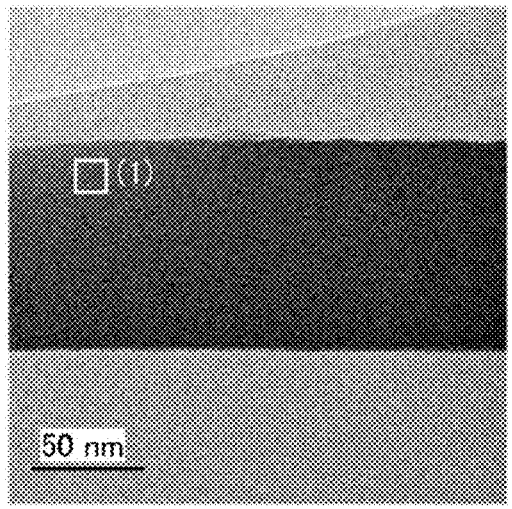
FIGS. 35A to 35D are Cs-corrected high-resolution TEM images of a cross section of a CAAC-OS and a cross-sectional schematic view of a CAAC-OS.

The CAAC-OS observed with a TEM is described below. FIG. 35A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. Note that the Cs-corrected high-resolution TEM image can be obtained with, for example, an atomic resolution analytical electron microscope JEM-ARM200F manufactured by JEOL Ltd.

Figure 35B:
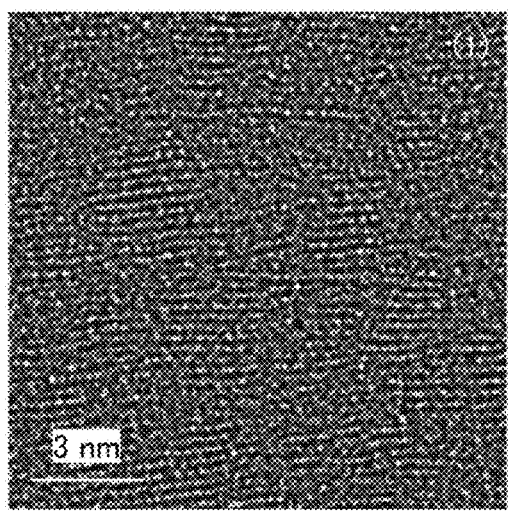

FIG. 35B is an enlarged Cs-corrected high-resolution TEM image of a region (1) in FIG. 35A. FIG. 35B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 35C:
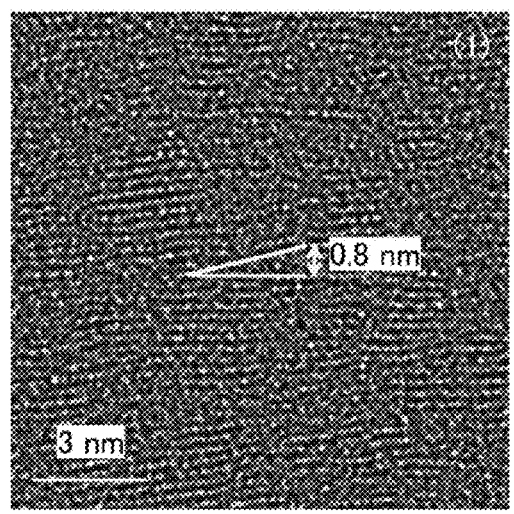

As shown in FIG. 35B, the CAAC-OS has a characteristic atomic arrangement. The characteristic atomic arrangement is denoted by an auxiliary line in FIG. 35C. FIGS. 35B and 35C prove that the size of a pellet is approximately 1 nm to 3 nm, and the size of a space caused by tilt of the pellets is approximately 0.8 nm. Therefore, the pellet can also be referred to as a nanocrystal (nc).

Figure 35D:
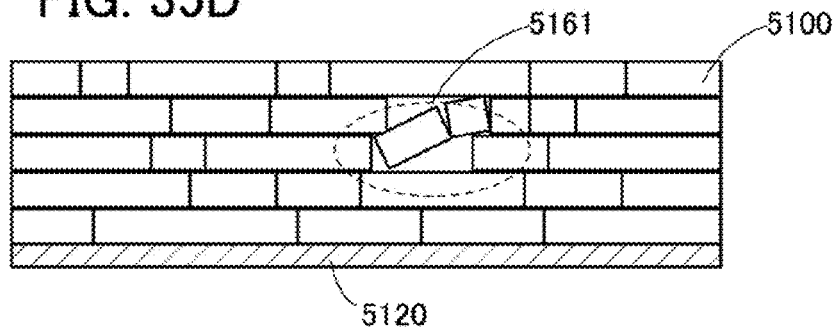

Here, according to the Cs-corrected high-resolution TEM images, the schematic arrangement of pellets 5100 of a CAAC-OS over a substrate 5120 is illustrated by such a structure in which bricks or blocks are stacked (see FIG. 35D). The part in which the pellets are tilted as observed in FIG. 35C corresponds to a region 5161 shown in FIG. 35D.

FIG. 36A shows a Cs-corrected high-resolution TEM image of a plane of the CAAC-OS observed from a direction substantially perpendicular to the sample surface. FIGS. 36B, 36C, and 36D are enlarged Cs-corrected high-resolution TEM images of regions (1), (2), and (3) in FIG. 36A, respectively. FIGS. 36B, 36C, and 36D indicate that metal atoms are arranged in a triangular, quadrangular, or hexagonal configuration in a pellet. However, there is no regularity of arrangement of metal atoms between different pellets.

Figure 37A:
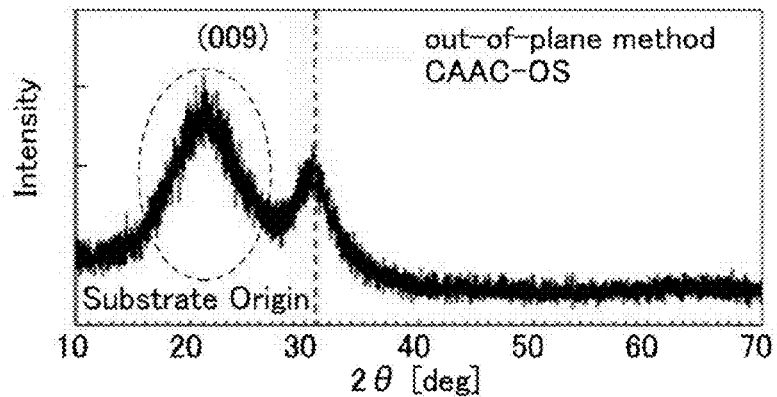
FIGS. 37A to 37C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 37A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 37B:
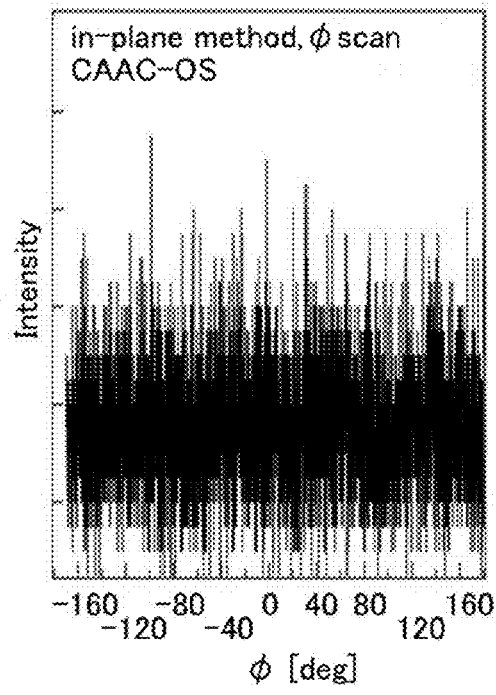
Figure 37C:
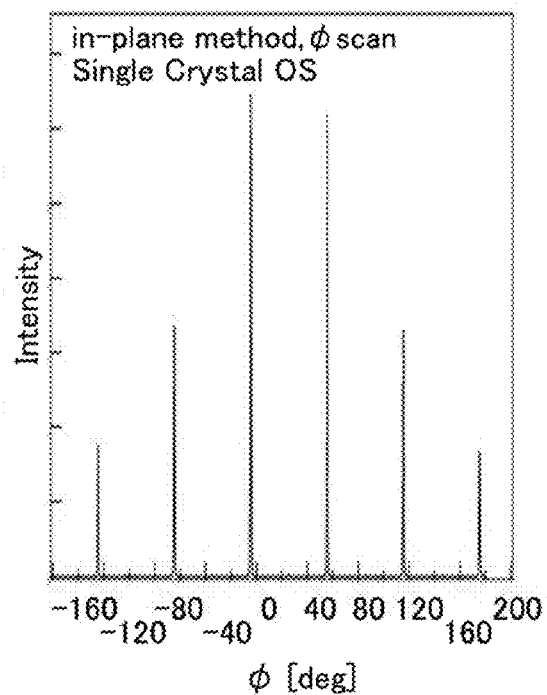

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 37B, a peak is not clearly observed. In contrast, in the case of a single crystal oxide semiconductor of $InGaZnO_4$, when φ scan is performed with 2θ fixed at around 56°, as shown in FIG. 37C, six peaks which are derived from crystal planes equivalent to the (110) plane are observed. Accordingly, the structural analysis using XRD shows that the directions of a-axes and b-axes are different in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 38A might be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 38B shows a diffraction pattern obtained in such a manner that an electron beam with a probe diameter of 300 nm is incident on the same sample in a direction perpendicular to the sample surface. As shown in FIG. 38B, a ring-like diffraction pattern is observed. Thus, the electron diffraction also indicates that the a-axes and b-axes of the pellets included in the CAAC-OS do not have regular alignment. The first ring in FIG. 38B is considered to be derived from the (010) plane, the (100) plane, and the like of the $InGaZnO_4$ crystal. The second ring in FIG. 38B is considered to be derived from the (110) plane and the like.

Moreover, the CAAC-OS is an oxide semiconductor having a low density of defect states. Defects in the oxide semiconductor are, for example, a defect due to impurity and oxygen vacancy. Therefore, the CAAC-OS can be regarded as an oxide semiconductor with a low impurity concentration, or an oxide semiconductor having a small amount of oxygen vacancies.

The impurity contained in the oxide semiconductor might serve as a carrier trap or serve as a carrier generation source. For example, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be highly purified intrinsic or substantially highly purified intrinsic oxide semiconductors. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. The spacing between these adjacent layers is equivalent to the lattice spacing on the (009) plane (also referred to as d value). The value is calculated to 0.29 nm from crystal structure analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 39:
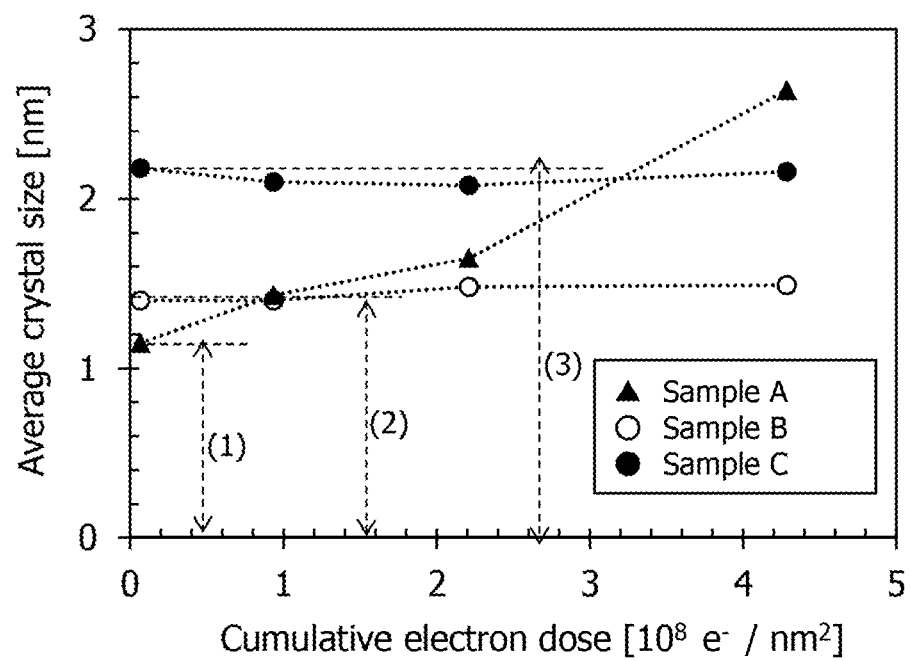
FIG. 39 shows a change in crystal part of an In—Ga—Zn oxide induced by electron irradiation.

FIG. 39 shows change in the average size of crystal parts (at 22 points to 45 points) in each sample. Note that the crystal part size corresponds to the length of a lattice fringe. FIG. 39 indicates that the crystal part size in the a-like OS increases with an increase in the cumulative electron dose. Specifically, a crystal part of approximately 1.2 nm at the start of TEM observation (the crystal part is also referred to as an initial nucleus) as shown by (1) in FIG. 39 grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 39, the average crystal sizes in an nc-OS layer and a CAAC-OS layer are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor layer having a density of lower than 78% of the density of the single crystal oxide semiconductor layer.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more films of an amorphous oxide semiconductor, an a-like OS, a microcrystalline oxide semiconductor, and a CAAC-OS, for example.

<<Deposition Model>>

Examples of deposition models of a CAAC-OS and an nc-OS are described below.

Figure 40A:
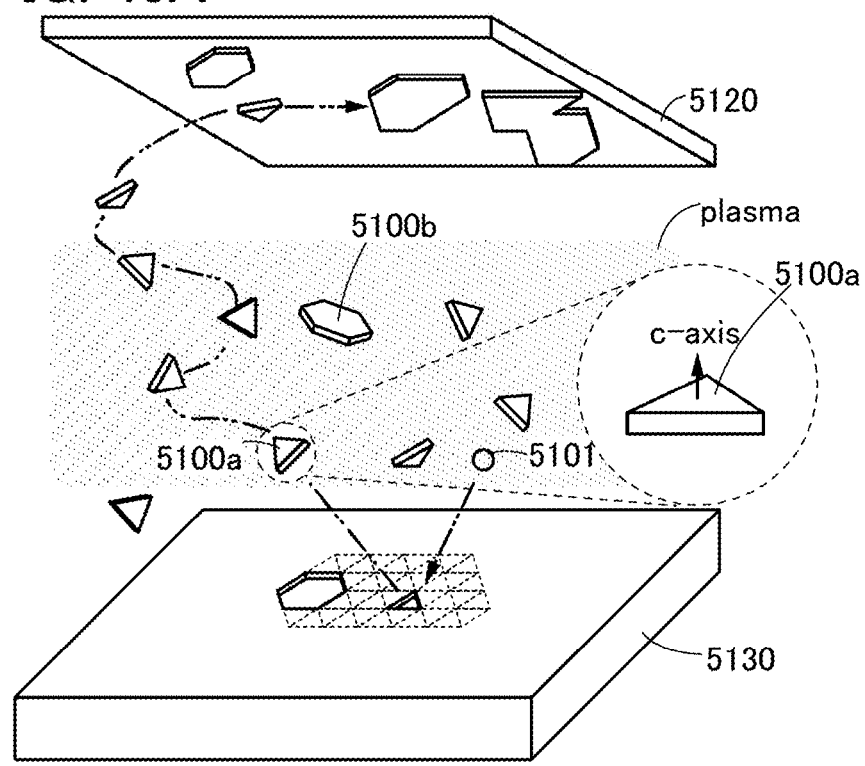
FIGS. 40A and 40B are schematic views showing deposition models of a CAAC-OS and an nc-OS.

FIG. 40A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generate a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, or preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, or preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O') and an argon cation (Ar$^+$).

Figure 41A:
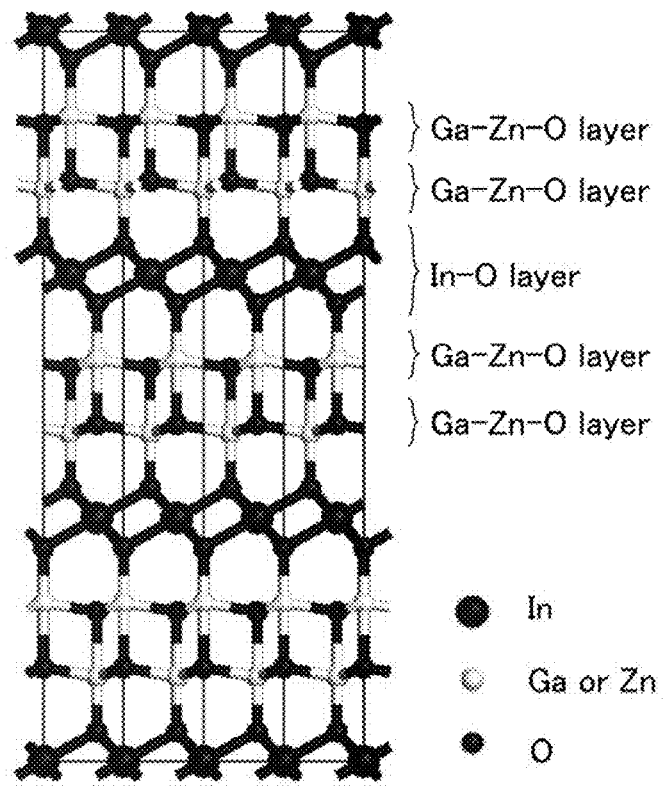
FIGS. 41A to 41C show an InGaZnO$_4$ crystal and a pellet.

Here, the target 5130 has a polycrystalline structure which includes a plurality of crystal grains and in which a cleavage plane exists in at least one crystal grain. FIG. 41A shows a structure of an InGaZnO$_4$ crystal included in the target 5130 as an example. Note that FIG. 41A shows a structure of the case where the InGaZnO$_4$ crystal is observed from a direction parallel to the b-axis when the c-axis is in an upward direction. FIG. 41A indicates that oxygen atoms in a Ga—Zn—O layer are positioned close to those in an adjacent Ga—Zn—O layer. The oxygen atoms have negative charge, whereby repulsive force is generated between the two Ga—Zn—O layers. As a result, the InGaZnO$_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 41B:
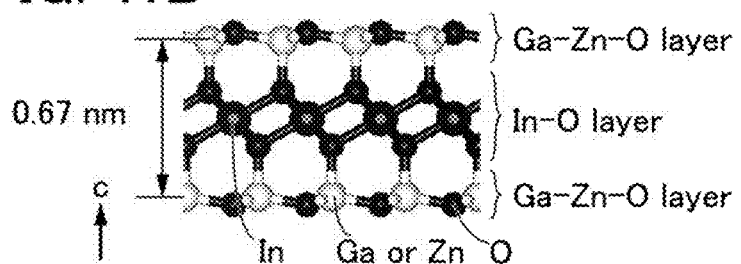
Figure 41C:
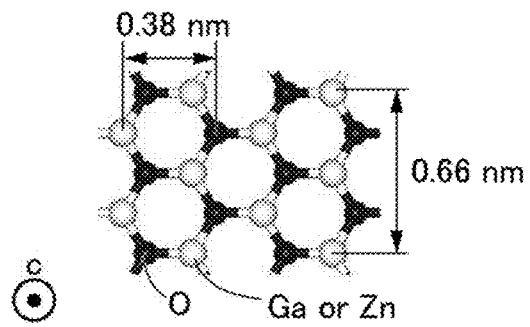

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, or preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 39. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 41B is separated. Note that FIG. 41C shows the structure of the separated pellet 5100 which is observed from a direction parallel to the c-axis. Therefore, the pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, an oxygen atom positioned on its side surface may be negatively charged. In this manner, when the side surfaces are charged with the same polarity, charges repel each other, and accordingly, the pellet 5100 can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 39 corresponds to the amount of growth in plasma. Here, in the case where the temperature of the substrate 5120 is at around room temperature, the pellet 5100 on the substrate 5120 hardly grows; thus, an nc-OS is formed (see FIG. 40B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 40B:
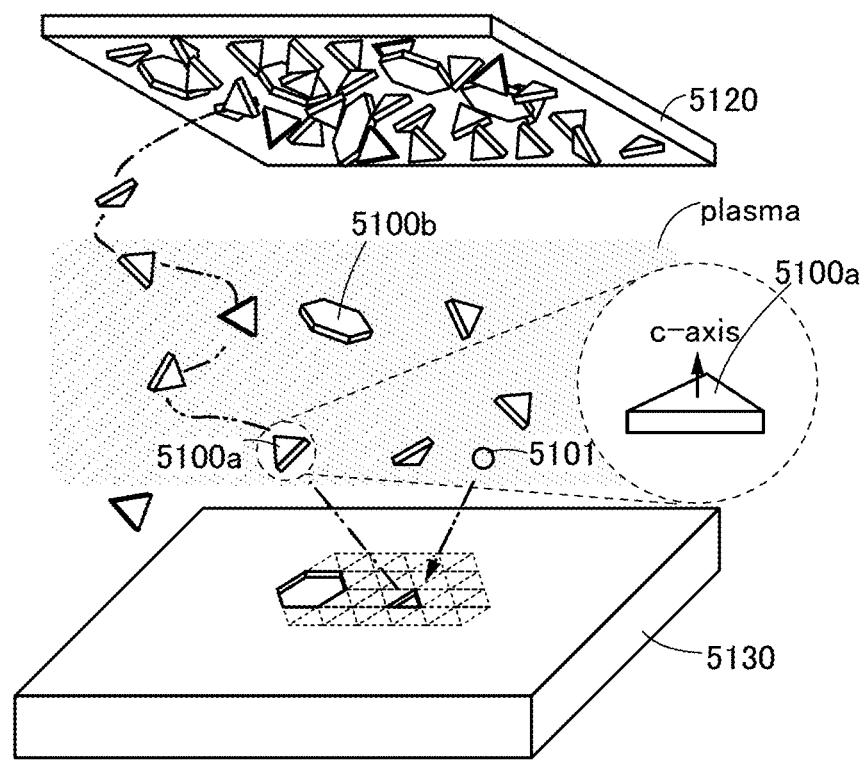

As shown in FIGS. 40A and 40B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, or still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, or still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 40A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 42A to 42D are cross-sectional schematic views.

Figure 42A:
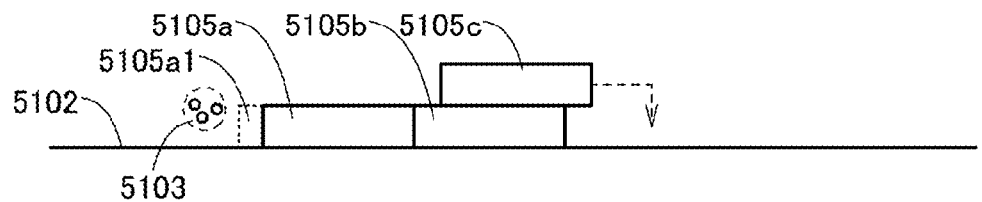
FIGS. 42A to 42D are schematic views illustrating deposition models of a CAAC-OS and an nc-OS.

As illustrated in FIG. 42A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide is crystallized by heating of the substrate 5120 to form a region 5105a1 on another side surface of the pellet 5105a. Note that the plurality of particles 5103 may contain oxygen, zinc, indium, gallium, or the like.

Figure 42B:
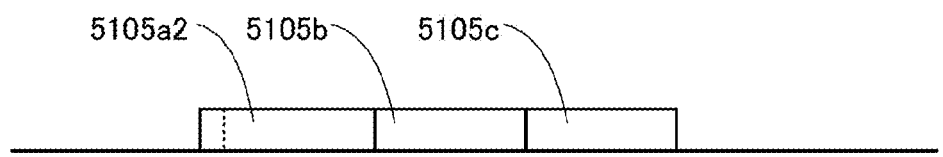

Then, as illustrated in FIG. 42B, the region 5105a1 grows to part of the pellet 5105a to form a pellet 5105a2. In addition, a side surface of the pellet 5105c is in contact with another side surface of the pellet 5105b.

Figure 42C:
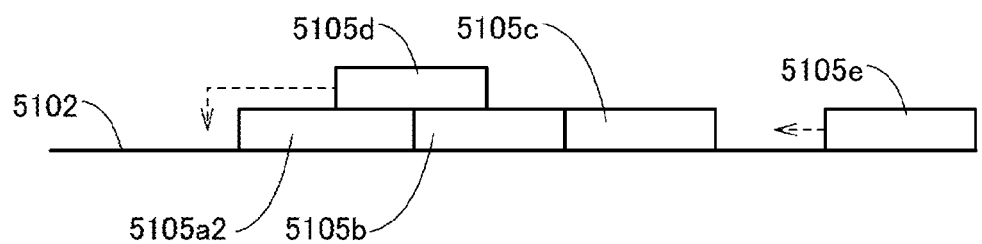

Next, as illustrated in FIG. 42C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 42D:
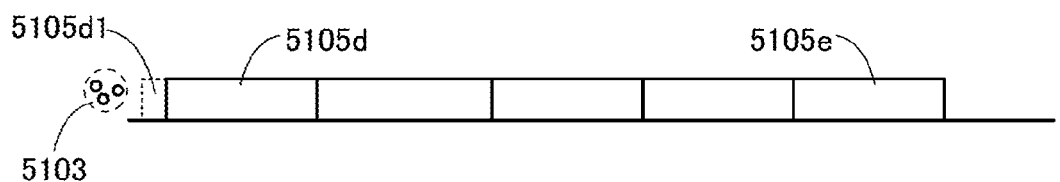

Then, as illustrated in FIG. 42D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target together with the zinc oxide is crystallized by heating of the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 39 corresponds to the amount of growth after deposition.

When spaces between pellets 5100 are extremely small, the pellets may form a large pellet. The large pellet has a single crystal structure. For example, the size of the large pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. Therefore, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure, which is different from film deposition by epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that owing to intermolecular force, the pellets 5100 are arranged so that a gap between the pellets is as small as possible even on the unevenness surface. Therefore, even when the formation surface has unevenness, a CAAC-OS with high crystallinity can be obtained.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

REFERENCE NUMERALS

10: light-emitting device, 11: pixel, 12: monitor circuit, 13: image processing circuit, 21: circuit, 22: transistor, 24: pixel portion, 25: panel, 26: controller, 27: CPU, 28: image memory, 29: memory, 30: driver circuit, 31: driver circuit, 32: image data, 33: wiring, 34: transistor, 40: transistor, 41: transistor, 42: transistor, 43: transistor, 44: transistor, 45: transistor, 46: light-emitting element, 47: capacitor, 48: capacitor, 49: wiring, 54: light-emitting element, 55: transistor, 56: transistor, 57: transistor, 58: capacitor, 60: operation amplifier, 61: capacitor, 62: switch, 68: wiring, 70: transistor, 71: transistor, 72: transistor, 73: transistor, 74: transistor, 75: transistor, 76: capacitor, 77: capacitor, 78: light-emitting element, 80: transistor, 81: transistor, 82: transistor, 83: transistor, 84: transistor, 85: transistor, 86: light-emitting element, 87: capacitor, 88: wiring, 90: transistor, 91: transistor, 92: transistor, 93: transistor. 94: transistor, 95: capacitor, 96: light-emitting element, 102: substrate, 104: insulating film, 106: oxide semiconductor film, 106*a*: region, 106*b*: region, 106*c*: region, 106*d*: region, 108: insulating film, 110: conductive film, 112: conductive film, 114: conductive film, 116: insulating film, 118: insulating film, 140*a*: opening, 140*b*: opening, 150: transistor, 261: conductive film, 266: oxide semiconductor film, 268: conductive film, 270: conductive film, 272: insulating film, 274: conductive film, 362: substrate, 364: insulating film, 364*a*: nitride insulating film, 364*b*: oxide insulating film, 366: oxide semiconductor film, 366*a*: region, 366*b*: region, 366*c*: region, 366*d*: region, 366*e*: offset region, 367*a*: oxide semiconductor film, 367*b*: oxide semiconductor film, 367*c*: oxide semiconductor film, 368: conductive film, 368*a*: conductive film, 368*b*: conductive film, 368*c*: conductive film, 370: conductive film, 370*a*: conductive film, 370*b*: conductive film, 370*c*: conductive film, 372: insulating film, 372*a*: insulating film, 374: conductive film, 374*a*: conductive film, 374*b*: conductive film, 376: insulating film, 390: transistor, 391: transistor, 392: transistor, 393: transistor, 394: transistor, 402: substrate, 404: insulating film, 406: oxide semiconductor film, 406*b*: region, 406*c*: region, 406*d*: region, 406*e*: offset region, 408: insulating film, 408*a*: insulating film, 410: conductive film, 412: conductive film, 414: conductive film, 414*a*: conductive film, 416: insulating film, 418: insulating film, 440*a*: opening, 450: transistor, 821: substrate, 824: insulating film, 828: oxide semiconductor film, 828*a*: region, 828*b*: region, 828*c*: region, 828*d*: region, 828*e*: region, 828*f*: region, 828*g*: region, 837: insulating film, 840: conductive film, 840*a*: conductive film, 840*b*: conductive film, 846: insulating film, 847: insulating film, 856: conductive film, 857: conductive film, 862: insulating film, 1000: substrate, 1001: conductive film, 1002: conductive film, 1003: conductive film, 1004: semiconductor film, 1005: conductive film, 1006: conductive film, 1007: semiconductor film, 1008: conductive film, 1009: conductive film, 1010: conductive film, 1011: conductive film, 1012: conductive film, 1013: conductive film, 1015: insulating film, 1016: insulating film, 1017: insulating film, 1018: insulating film, 1019: insulating film, 1020: insulating film, 1025: insulating film, 1026: insulating film, 1027: EL layer, 1028: conductive film, 1030: substrate, 1031: blocking film, 1032: coloring layer, 1601: panel, 1602: circuit board, 1603: connection portion, 1604: pixel portion, 1605: driver circuit, 1606: driver circuit, 3001: housing, 3002: display portion, 3003: supporting base, 3101: housing, 3102: display portion, 3103: operation key, 3301: housing, 3302: housing, 3303: display portion, 3304: display portion, 3305: microphone, 3306: speaker, 3307: operation key, 3308: stylus, 3601: housing, 3602: display portion, 3701: housing, 3702: display portion, 3766: insulating film, 3901: housing, 3902: display portion, 3903: camera, 3904: speaker, 3905: button, 3906: external connection portion, 3907: microphone, 5100: pellet, 5100*a*: pellet, 5100*b*: pellet, 5101: ion, 5102: zinc oxide layer, 5103: particle, 5105*a*: pellet, 5105*a*1: region, 5105*a*2: pellet, 5105*b*: pellet, 5105*c*: pellet, 5105*d*: pellet, 5105*d*1: region, 5105*e*: pellet, 5120: substrate, 5130: target, and 5161: region.

This application is based on Japanese Patent Application serial no. 2013-272539 filed with Japan Patent Office on Dec. 27, 2013, Japanese Patent Application serial no. 2013-272532 filed with Japan Patent Office on Dec. 27, 2013, Japanese Patent Application serial no. 2014-047197 filed with Japan Patent Office on Mar. 11, 2014, and Japanese Patent Application serial no. 2014-047200 filed with Japan Patent Office on Mar. 11, 2014, the entire contents of which are hereby incorporated by reference.

The invention claimed is:

1. A light-emitting device comprising:
a pixel comprising a light-emitting element, a first transistor and a second transistor;
a first circuit configured to generate a signal including a value of current extracted from the pixel; and
a second circuit configured to correct an image signal by the signal,
wherein the first transistor is configured to control supply of current to the light-emitting element by the image signal,
wherein the second transistor is configured to control extraction of current from the pixel, and
wherein a semiconductor film of each of the first transistor and the second transistor comprises:
a first semiconductor region overlapping with a gate electrode;
a second semiconductor region in contact with a source electrode or a drain electrode; and
a third semiconductor region containing higher concentration of hydrogen than the first semiconductor region and the second semiconductor region between the first semiconductor region and the second semiconductor region.

2. The light-emitting device according to claim 1, wherein the semiconductor film is an oxide semiconductor film.

3. The light-emitting device according to claim 2,
wherein the oxide semiconductor film contains indium, zinc, and M, and
wherein M is Mg, Al, Ti, Ga, Y, Zr, La, Ce, Nd, or Hf.

4. An electronic device comprising the light-emitting device according to claim 1, a microphone, and an operation key.

5. A light-emitting device comprising:
a wiring;
a first transistor comprising a first semiconductor film, and a first gate electrode and a second gate electrode overlapping with each other with the first semiconductor film therebetween;
a second transistor comprising a second semiconductor film;
a first capacitor configured to hold a potential difference between one of a first source electrode and a first drain electrode of the first transistor and the first gate electrode;
a second capacitor configured to hold a potential difference between the one of the first source electrode and the first drain electrode of the first transistor and the second gate electrode; and
a light-emitting element supplied with drain current of the first transistor;
wherein the second transistor is configured to control conduction between the second gate electrode and the wiring,
wherein the first semiconductor film comprises:
a first semiconductor region overlapping with the first gate electrode;
a second semiconductor region in contact with the first source electrode or the first drain electrode of the first transistor; and
a third semiconductor region containing higher concentration of hydrogen than the first semiconductor region and the second semiconductor region between the first semiconductor region and the second semiconductor region, and
wherein the second semiconductor film comprises:
a fourth semiconductor region overlapping with a third gate electrode of the second transistor;
a fifth semiconductor region in contact with a second source electrode or a second drain electrode of the second transistor; and
a sixth semiconductor region containing higher concentration of hydrogen than the fourth semiconductor region and the fifth semiconductor region between the fourth semiconductor region and the fifth semiconductor region.

6. The light-emitting device according to claim 5, wherein the first semiconductor film and the second semiconductor film are each an oxide semiconductor film.

7. The light-emitting device according to claim 6,
wherein the oxide semiconductor film contains indium, zinc, and M, and
wherein M is Mg, Al, Ti, Ga, Y, Zr, La, Ce, Nd, or Hf.

8. An electronic device comprising the light-emitting device according to claim 5, a microphone, and an operation key.

9. A light-emitting device comprising:
a first wiring and a second wiring;
a capacitor;
a light-emitting element;
a first transistor configured to control conduction between the first wiring and a first electrode of the capacitor;
a second transistor configured to control conduction between the second wiring and a gate electrode of a fifth transistor;
a third transistor configured to control conduction between the first electrode of the capacitor and the gate electrode of the fifth transistor;
a fourth transistor configured to control conduction between one of a source electrode and a drain electrode of the fifth transistor and an anode of the light-emitting element; and
the fifth transistor,
wherein a second electrode of the capacitor is electrically connected to the one of the source electrode and the drain electrode of the fifth transistor, and
wherein a semiconductor film of each of the first transistor, the second transistor, the third transistor, the fourth transistor, and the fifth transistor comprises:
a first semiconductor region overlapping with a gate electrode;
a second semiconductor region in contact with a source electrode or a drain electrode; and
a third semiconductor region containing higher concentration of hydrogen than the first semiconductor region and the second semiconductor region between the first semiconductor region and the second semiconductor region.

10. The light-emitting device according to claim 9, wherein the semiconductor film is an oxide semiconductor film.

11. The light-emitting device according to claim 10,
wherein the oxide semiconductor film contains indium, zinc, and M, and
wherein M is Mg, Al, Ti, Ga, Y, Zr, La, Ce, Nd, or Hf.

12. An electronic device comprising the light-emitting device according to claim 9, a microphone, and an operation key.

13. A light-emitting device comprising:
a first wiring, a second wiring, and a third wiring;
a capacitor;
a light-emitting element;
a first transistor configured to control conduction between the first wiring and a first electrode of the capacitor;
a second transistor configured to control conduction between the second wiring and a gate electrode of a fifth transistor;
a third transistor configured to control conduction between the first electrode of the capacitor and the gate electrode of the fifth transistor;
a fourth transistor configured to control conduction between one of a source electrode and a drain electrode of the fifth transistor and the third wiring; and
the fifth transistor,
wherein a second electrode of the capacitor is electrically connected to the one of the source electrode and the drain electrode of the fifth transistor and an anode of the light-emitting element, and
wherein a semiconductor film of each of the first transistor, the second transistor, the third transistor, the fourth transistor, and the fifth transistor comprises:
a first semiconductor region overlapping with a gate electrode;
a second semiconductor region in contact with a source electrode or a drain electrode; and
a third semiconductor region containing higher concentration of hydrogen than the first semiconductor region and the second semiconductor region between the first semiconductor region and the second semiconductor region.

14. The light-emitting device according to claim 13, wherein the semiconductor film is an oxide semiconductor film.

15. The light-emitting device according to claim 14,
wherein the oxide semiconductor film contains indium, zinc, and M, and
wherein M is Mg, Al, Ti, Ga, Y, Zr, La, Ce, Nd, or Hf.

16. An electronic device comprising the light-emitting device according to claim 13, a microphone, and an operation key.

* * * * *